(12) United States Patent
Mi et al.

(10) Patent No.: US 10,576,447 B2
(45) Date of Patent: Mar. 3, 2020

(54) METHODS AND SYSTEMS RELATING TO PHOTOCHEMICAL WATER SPLITTING

(71) Applicant: THE ROYAL INSTITUTION FOR THE ADVANCEMENT OF LEARNING/MCGILL UNIVERSITY, Montreal (CA)

(72) Inventors: Zetian Mi, Verdun (CA); Md Golam Kibria, Montreal (CA); Mohammad Faqrul Alam Chowdhury, Montreal (CA)

(73) Assignee: THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 252 days.

(21) Appl. No.: 15/329,619

(22) PCT Filed: Jul. 31, 2015

(86) PCT No.: PCT/CA2015/000449
§ 371 (c)(1),
(2) Date: Jan. 27, 2017

(87) PCT Pub. No.: WO2016/015134
PCT Pub. Date: Feb. 4, 2016

(65) Prior Publication Data
US 2017/0216810 A1    Aug. 3, 2017

Related U.S. Application Data

(60) Provisional application No. 62/031,235, filed on Jul. 31, 2014.

(51) Int. Cl.
*H01J 19/12* (2006.01)
*H01L 29/20* (2006.01)
(Continued)

(52) U.S. Cl.
CPC ........... *B01J 19/127* (2013.01); *B01J 19/123* (2013.01); *B01J 19/128* (2013.01); *C01B 3/042* (2013.01);
(Continued)

(58) Field of Classification Search
None
See application file for complete search history.

(56) References Cited

U.S. PATENT DOCUMENTS

2012/0267234 A1    10/2012   Reece et al.
2013/0240348 A1    9/2013    Mi et al.

OTHER PUBLICATIONS

Wang et al., "Wafer-Level Photocatalytic Water Splitting on GaN Nanowire Arrays Grown by Molecular Beam Epitaxy", Nano Lett. 2011, 11, 2353-2357.*

(Continued)

*Primary Examiner* — Kishor Mayekar
(74) *Attorney, Agent, or Firm* — Norton Rose Fulbright Canada LLP; Reno Lessard

(57) ABSTRACT

InGaN offers a route to high efficiency overall water splitting under one-step photo-excitation. Further, the chemical stability of metal-nitrides supports their use as an alternative photocatalyst. However, the efficiency of overall water splitting using InGaN and other visible light responsive photocatalysts has remained extremely low despite prior art work addressing optical absorption through band gap engineering. Within this prior art the detrimental effects of unbalanced charge carrier extraction/collection on the efficiency of the four electron-hole water splitting reaction have remained largely unaddressed. To address this growth processes are presented that allow for controlled adjustment and establishment of the appropriate Fermi level and/or band bending in order to allow the photochemical water splitting to proceed at high rate and high efficiency. Beneficially, estab- (Continued)

lishing such material surface charge properties also reduces photo-corrosion and instability under harsh photocatalysis conditions.

6 Claims, 24 Drawing Sheets

(51) Int. Cl.

| | | |
|---|---|---|
| C01B 13/02 | (2006.01) | |
| H01L 21/02 | (2006.01) | |
| C01B 3/04 | (2006.01) | |
| H01L 29/06 | (2006.01) | |
| H01L 29/207 | (2006.01) | |
| B01J 19/12 | (2006.01) | |
| C25B 1/00 | (2006.01) | |
| B82Y 30/00 | (2011.01) | |
| B82Y 40/00 | (2011.01) | |

(52) U.S. Cl.
CPC .......... *C01B 13/0207* (2013.01); *C25B 1/003* (2013.01); *H01L 21/0254* (2013.01); *H01L 21/02381* (2013.01); *H01L 21/02433* (2013.01); *H01L 21/02499* (2013.01); *H01L 21/02579* (2013.01); *H01L 21/02603* (2013.01); *H01L 21/02631* (2013.01); *H01L 21/02639* (2013.01); *H01L 29/0669* (2013.01); *H01L 29/0676* (2013.01); *H01L 29/2003* (2013.01); *H01L 29/207* (2013.01); *B01J 2219/0877* (2013.01); *B01J 2219/0892* (2013.01); *B01J 2219/1203* (2013.01); *B82Y 30/00* (2013.01); *B82Y 40/00* (2013.01); *Y02E 60/364* (2013.01); *Y02E 60/366* (2013.01); *Y02P 20/134* (2015.11)

(56) References Cited

OTHER PUBLICATIONS

Kamimura et al., "Photoelectrochemical Properties of (In,Ga)N Nanowires for Water Splitting Investigated by in Situ Electrochemical Mass Spectroscopy", J. Am. Chem. Soc. 2013, 135, 10242-10245.*

Faqrul et al., "Group III-nitride nanowire structures for photocatalytic hydrogen evolution under visible light irradiation", APL Materials, Jul. 1, 2015, pp. 1-7, vol. 3 104408, Canada.

Kibria et al., "One-Step Overall Water Splitting under Visible Light Using Multiband InGaN/GaN Nanowire Heterostructures", American Chemical Society, Aug. 12, 2013, pp. 7886-7893, vol. 7 No. 9, Canada.

Kibria et al., "Tuning the surface Fermi level on p-type gallium nitride nanowires for efficient overall water splitting", Nature Communications, Apr. 30, 2014, pp. 1-6, vol. 5:3825, Canada.

Kibria et al., "Visible light-driven efficient overall water splitting using p-type metal-nitride nanowire arrays", Nature Communications, Apr. 9, 2015, pp. 1-8, vol. 6:6797, Canada.

Wang et al., "p-Type dopant incorporation and surface charge properties of catalyst-free GaN nanowires revealed by micro-Raman scattering and X-ray photoelectron spectroscopy", Royal Society of Chemistry, Jul. 7, 2014, pp. 9970-9976, vol. 6, Canada.

Kibria et al., "Defect-engineered GaN:Mg nanowire arrays for overall water splitting under violet light", Applied Physics Letters, Mar. 18, 2015, pp. 1-5, vol. 106 113105, Canada.

Tong et al., "Nano-photocatalytic Materials: Possibilities and Challenges", Advanced Materials, Oct. 4, 2011, pp. 229-251, vol. 24, Germany.

Kubacka et al., "Advanced Nanoarchitectures for Solar Photocatalytic Applications", American Chemical Society, Nov. 22, 2011, pp. 1555-1614, vol. 112, United States.

* cited by examiner

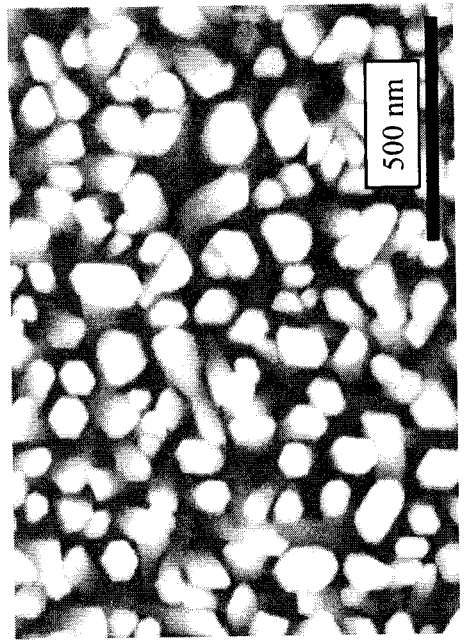# 
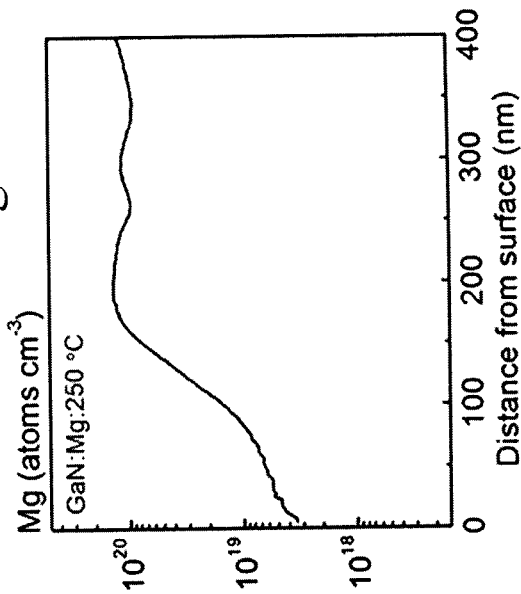
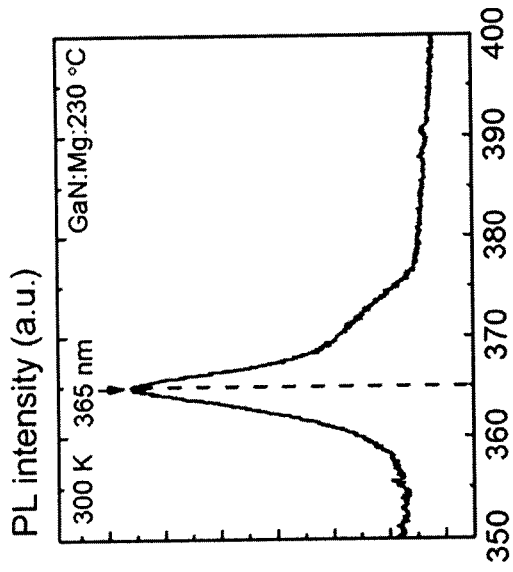
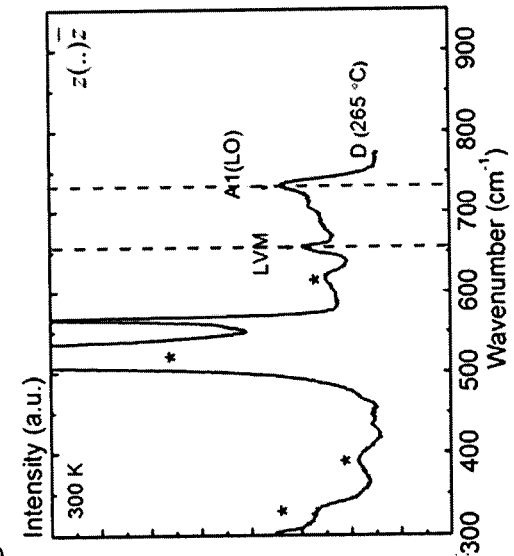
Figure 12
Figure 13
Figure 14
Figure 15

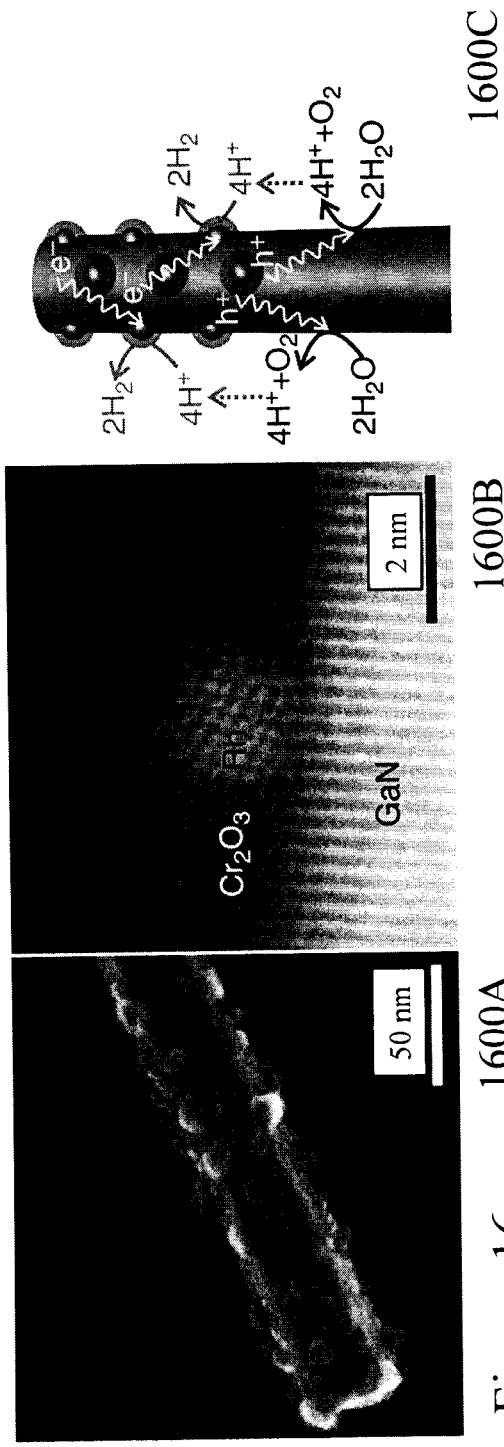
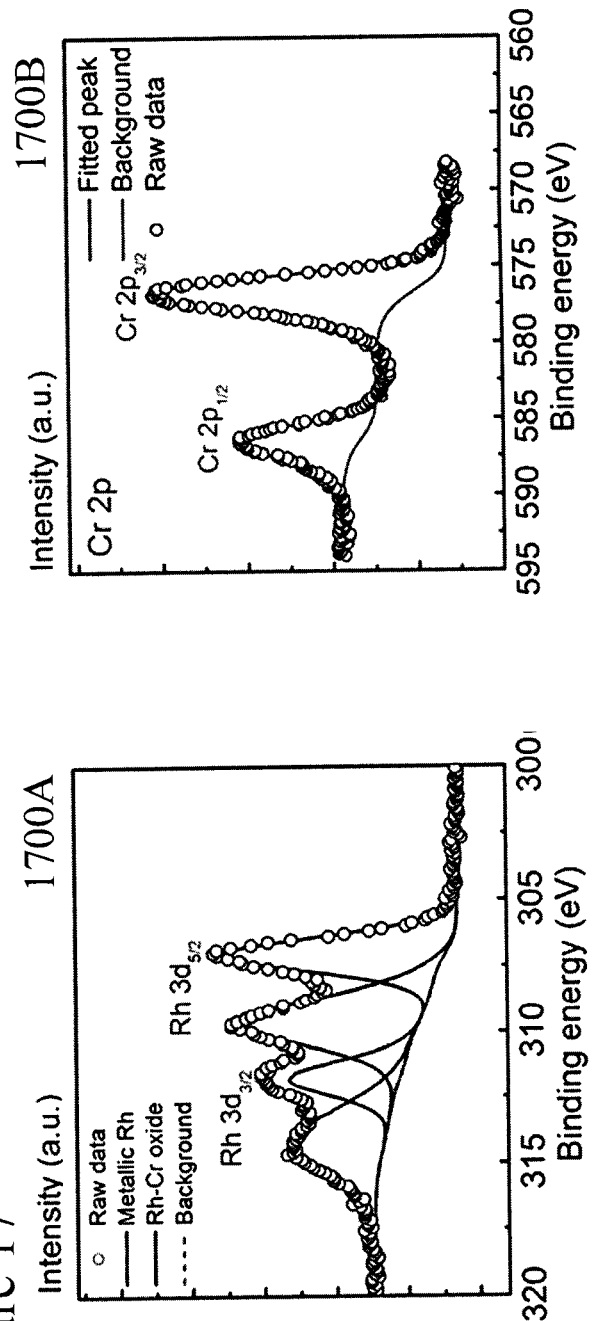
Figure 16
Figure 17

2300A

2300C

2300B

METHODS AND SYSTEMS RELATING TO PHOTOCHEMICAL WATER SPLITTING

FIELD OF THE INVENTION

This invention relates to photochemical water splitting and more particularly to photochemical water splitting using compound semiconductors with engineered Fermi levels and/or band bending.

BACKGROUND OF THE INVENTION

Solar water splitting and hydrogen generation is an essential step of artificial photosynthesis for the direct conversion of solar energy into chemical fuels. Among the various approaches, one-step photochemical water splitting is of particular interest because of its simplicity, low-cost operation, and its ability to use nearly neutral pH water, such as sea water, for large scale solar-fuel production. It is a "wireless" version of photoelectrochemical water splitting in which the counter electrode is mounted on the photocatalyst surface in the form of micro/nano-electrode i.e. co-catalyst. Accordingly, there is no requirement for an external bias, and hence no circuitry is required for its operation, and its efficiency is not limited by the low current conduction issue in the conventional Z-scheme process. Within the currently known photocatalysts the group III-nitride semiconductors, e.g. InGaN, represent the only material whose band gap energy can be tuned across nearly the entire solar spectrum as well as straddle the water redox potentials under ultraviolet (UV), visible, and near-infrared light irradiation.

Accordingly, InGaN promises high efficiency overall water splitting under one-step photo-excitation. The extreme chemical stability of metal-nitride further supports their use as an alternative photocatalyst. To date, however, the efficiency of overall water splitting using InGaN and other visible light responsive photocatalysts has remained extremely low, see for example Kibria et al in "One-Step Overall Water Splitting under Visible Light using Multiband InGaN/GaN Nanowire Heterostructures" (ACS Nano, Vol. 7, pp. 7886-7893) and Kubacka et al in "Advanced Nanoarchitectures for Solar Photocatalytic Applications" (Chem. Rev., Vol. 112, pp. 1555-1614). While much of the prior art research has focused on enhancing the optical absorption through band gap engineering, see for example Kubacka, the detrimental effects of unbalanced charge carrier extraction/collection on the efficiency of the four electron-hole water splitting reaction has remained largely unaddressed. Accordingly, it would be essential to address the reduced efficiency arising from unbalanced charge carrier extraction/collection, allowing increased efficiency of standalone photocatalytic hydrogen generation through solar powered water splitting.

Recently, nanoscale photocatalysts have been intensively studied which can increase light absorption and charge carrier separation, and therefore enhance the quantum efficiency, see for example Tong et al. in "Nano-Photocatalytic Materials: Possibilities and Challenges" (Adv. Mater., Vol. 24, pp. 229-251). Fermi-level pinning, however, has been commonly measured on nanowire surfaces such that the resulting surface band bending creates an additional energy barrier for charge carrier transport to the photocatalyst-water interface leading to significantly reduced reaction rate and extremely low efficiency. To date, the rational synthesis of nanostructured photocatalysts with controlled surface charge properties, i.e. tunable surface Fermi level and band bending, has remained a near-universal challenge, see for example Tong. Such uncontrolled surface charge properties can further contribute to the photo-corrosion and instability of various nanostructures under harsh photocatalysis conditions, severely limiting their practical applications.

Accordingly, it would be beneficial to address these limitations by providing controllable dopants during the growth process to adjust the properties of nanoscale photochemical water splitting devices in order to provide the appropriate Fermi level and/or band bending in order to allow the photochemical water splitting to proceed at high rate and high efficiency.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to photochemical water splitting and more particularly to photochemical water splitting using compound semiconductors with engineered Fermi levels and/or band bending.

In accordance with an embodiment of the invention there is provided a method of photochemical water splitting comprising providing a plurality of nanowires formed from a doped compound semiconductor that generate electron-hole pairs under illumination with optical energy within a predetermined wavelength range, wherein the Fermi level of non-polar surfaces of the nanowires has been set to a predetermined value though doping with a predetermined dopant to yield a predetermined surface band bending.

In accordance with an embodiment of the invention there is provided a device for photochemical water splitting comprising a plurality of nanowires formed from a doped compound semiconductor that generate electron-hole pairs under illumination with optical energy within a predetermined wavelength range, wherein the Fermi level of non-polar surfaces of the nanowires has been set to a predetermined value though doping with a predetermined dopant to yield a predetermined surface band bending.

In accordance with an embodiment of the invention there is provided a method of engineering a Fermi level of non-polar surfaces of a nanowire to a predetermined value though doping with a predetermined dopant to yield a predetermined surface band bending, wherein the predetermined band bending reduces at least one of a hole depletion and an electron accumulation at a near-surface region of the nanowire.

In accordance with an embodiment of the invention there is provided a device comprising a nanowire having a Fermi level of a non-polar surface of the nanowire engineered to a predetermined value though doping with a predetermined dopant to yield a predetermined surface band bending, wherein the predetermined band bending reduces at least one of a hole depletion and an electron accumulation at a near-surface region of the nanowire.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 12 depicts room-temperature micro-Raman spectrum for GaN:Mg ($T_{Mg}$=230° C.) according to an embodiment of the invention;

FIG. 13 depicts top view SEM image of GaN:Mg ($T_{Mg}$=265° C.) nanowire sample according to an embodiment of the invention;

FIG. 14 depicts room-temperature micro-Raman spectrum for GaN:Mg ($T_{Mg}$=265° C.) according to an embodiment of the invention;

FIG. 15 depicts Mg concentration for GaN:Mg epilayer ($T_{Mg}$=250° C.) according to an embodiment of the invention;

FIG. 16 depicts TEM characterization of core-shell $Rh/C_2O_3$ nanoparticles on GaN nanowires according to an embodiment of the invention;

FIG. 17 depicts high resolution XPS spectra of Rh(3d) core level electrons and Cr(2p) core level electrons for $Rh/C_2O_3$ catalytic nanoparticles according to embodiments of the invention;

DETAILED DESCRIPTION

The present invention is directed to photochemical water splitting and more particularly to photochemical water splitting using compound semiconductors with engineered Fermi levels and/or band bending.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

1. Visible and Ultraviolet Water Splitting

1A. Band Bending

Figure 1A:
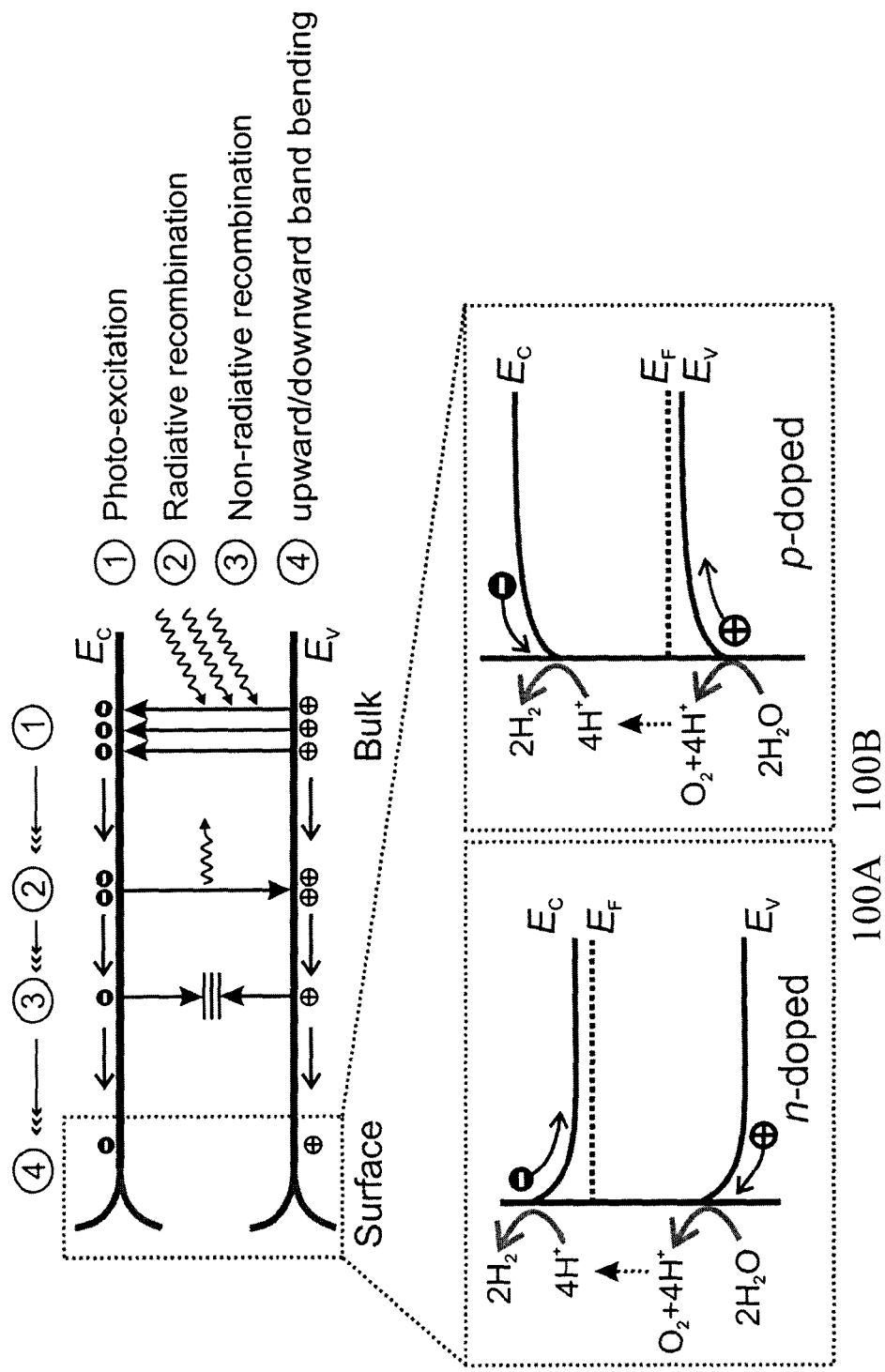
FIG. 1A depicts the impact of surface bending on the overall splitting reaction of water.

As schematically illustrated in FIG. 1A, after rapid non-adiabatic relaxation, photo-excited carriers may recombine radiatively or non-radiatively before diffusing to the near-surface region to drive redox reactions. Within crystalline nanowire photocatalysts, however, the carrier extraction efficiency is no longer diffusion-limited and accordingly the transport of spatially separated electron-hole pairs to the photocatalyst surface(s) is often determined by the surface band structure. As depicted by the first and second insets 100A and 100B of FIG. 1, the presence of upward-(downward-) surface band bending has been commonly measured for n- (p-) type semiconductor photocatalysts within the prior art.

However, referring to first inset 100A then the energy barrier caused by the upward band bending repels the photo-excited electrons toward the bulk region, creating an electron depletion (hole accumulation) layer at the surface. For example, the presence of ~0.37 eV upward band bending can cause an electron concentration that is ~20 times lower than the hole concentration on the nanowire surfaces, as demonstrated in Section A.1 below. Accordingly, this upward band bending was one of the major obstacles causing the very low, approximately ~1.86% at 400 nm, apparent quantum efficiency (AQE) of overall water splitting for the recently reported InGaN/GaN multiband nanowire heterostructures by the inventors. In contrast, as depicted in second inset 100B, the downward surface band bending of p-doped metal-nitrides creates an energy barrier for the photogenerated holes, resulting in a hole depletion (electron accumulation) at the near-surface region. This hole depletion suppresses the first-half (water oxidation) of the redox reaction which governs the rate of overall water splitting.

Although the presence of surface band bending is considered advantageous for photoelectrochemical water splitting wherein oxidation and reduction reaction take place at different electrodes, it should be minimized for photochemical water splitting in order to achieve balanced, efficient, and stable redox reactions. In this context, the inventors have postulated and demonstrated that InGaN, a widely used semiconductor for solid-state lighting and power electronics, can be transformed to be a highly active photocatalyst under visible light irradiation by precisely engineering the surface band bending through controlled dopant incorporation according to embodiments of the invention presented below.

Figure 1B:
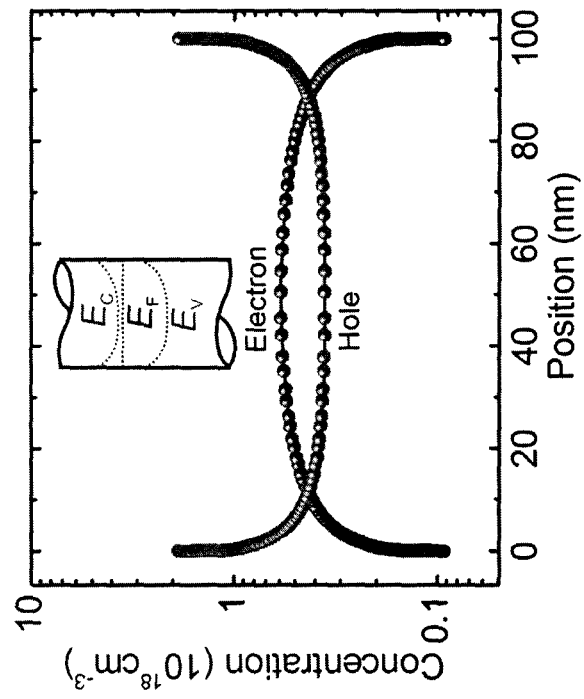
FIG. 1B depicts the electron and hole distributions for a 100 nm diameter undoped $In_{0.25}Ga_{0.75}N$ nanowire in the presence of ~0.37 eV upward surface band bending (inset)

1A1. Impact of Surface Band Bending on the Surface Electron and Hole Distribution The estimation of electron and hole concentration in a $In_{0.25}Ga_{0.75}N$ nanowire was performed using 2D/3D finite element analysis through the simulation program APSYS (Advanced Physical Models of Semiconductor Devices). Specific carrier generation is introduced uniformly into the nanowire by defining a λ=405 nm optical input to the structure, with a constant carrier generation rate of $2.5 \times 10^{27}$ $cm^{-3} \cdot s^{-1}$, Shockley-Read-Hall (SRH) lifetime of 100 ns and Auger recombination coefficient of $1 \times 10^{-33}$ $cm^6 \cdot s^{-1}$ are assumed in the calculation. The nanowire diameter and surface recombination velocity were considered to be 100 nm and $5 \times 10^4$ $cm \cdot s^{-1}$ respectively whilst the surface trap density was ~$1 \times 10^{14}$ $cm^{-2}$. A nominally undoped nanowire structure, with acceptor-like surface traps, was first simulated. The presence of ~0.37 eV upward band bending in the near surface region is assumed, which reduced to ~0.07 eV under photo-excitation, owing to the screening effect by photogenerated carriers. The resulting calculated electron and hole distributions across the nanowire lateral dimension are shown in FIG. 1B. It is evident that hole concentration is ~20 times higher than that of electron in the near-surface region. The carrier distribution in p-type $In_{0.25}Ga_{0.75}N$ with the presence of a downward surface band bending was also calculated by the inventors. Electron accumulation and hole depletion in the near-surface region were clearly observed.

1B. Nano Wire Fabrication

Catalyst-free, vertically aligned InGaN nanowire arrays were grown on Si(111) substrates using radio frequency plasma-assisted molecular beam epitaxy (MBE) under nitrogen rich conditions without using any foreign catalyst. Prior to loading into the MBE chamber, the Si(111) substrate was rinsed with acetone and methanol to remove organic contaminants and subsequently with 10% hydrofluoric acid (HF) to remove native oxide. In situ oxide desorption was performed at ~770° C. before the growth initiation until the formation of a clean Si(111) 7×7 reconstructed surface was confirmed by reflection high-energy electron diffraction (RHEED). A thin, approximately one monolayer, Ga seeding layer was in situ deposited, which promotes the nucleation of nanowires. Thermal effusion cells were used for the gallium (Ga), indium (In), and magnesium (Mg) sources. Nitrogen radicals were supplied from a radio frequency plasma source.

The growth parameters include nitrogen flow rate of 1.0 standard cubic centimeters per minute (sccm), a forward plasma power of ~350 W, and a Ga beam equivalent pressure (BEP) of ~$6 \times 10^{-8}$ Torr. The In BEP was ~$8 \times 10^{-8}$ Torr. The Mg effusion cell temperature was varied from 190° C. to 300° C., which corresponds to Mg BEP's of ~$1 \times 10^{-11}$ to ~$1.5 \times 10^{-9}$ Torr. The growth temperature for GaN was ~750° C. and the growth temperature for InGaN was in the range of 640° C. to 680° C.

Instead of direct formation of InGaN nanowires on Si substrate, a GaN nanowire template was used, which led to controlled formation of InGaN nanowires with superior structural and optical properties. In order to minimize non-radiative recombination resulting from misfit dislocations three segments of InGaN ternary wires were incorporated along the growth direction of GaN nanowire, shown schematically in image 200A in FIG. 2. The InGaN/GaN nanowire segments were doped with divalent ($Mg^{2+}$) ions as p-type dopant by controlling the effusion cell temperature of Mg ($T_{Mg}$) from 190° C. to 240° C. The GaN nanowire template was left undoped. A 45° tilted scanning electron microscopy (SEM) image of as-grown InGaN nanowire arrays grown at ($T_{Mg}$=200° C.), depicted in second image 200B in FIG. 2, revealed vertically aligned nanowires, with the growth direction along the c-axis. The average height is ~400-600 nm, lateral sizes are ~40-100 nm, and the areal density is in the range of ~$1-1.5 \times 10^{10}$ $cm^{-2}$.

Figure 2:
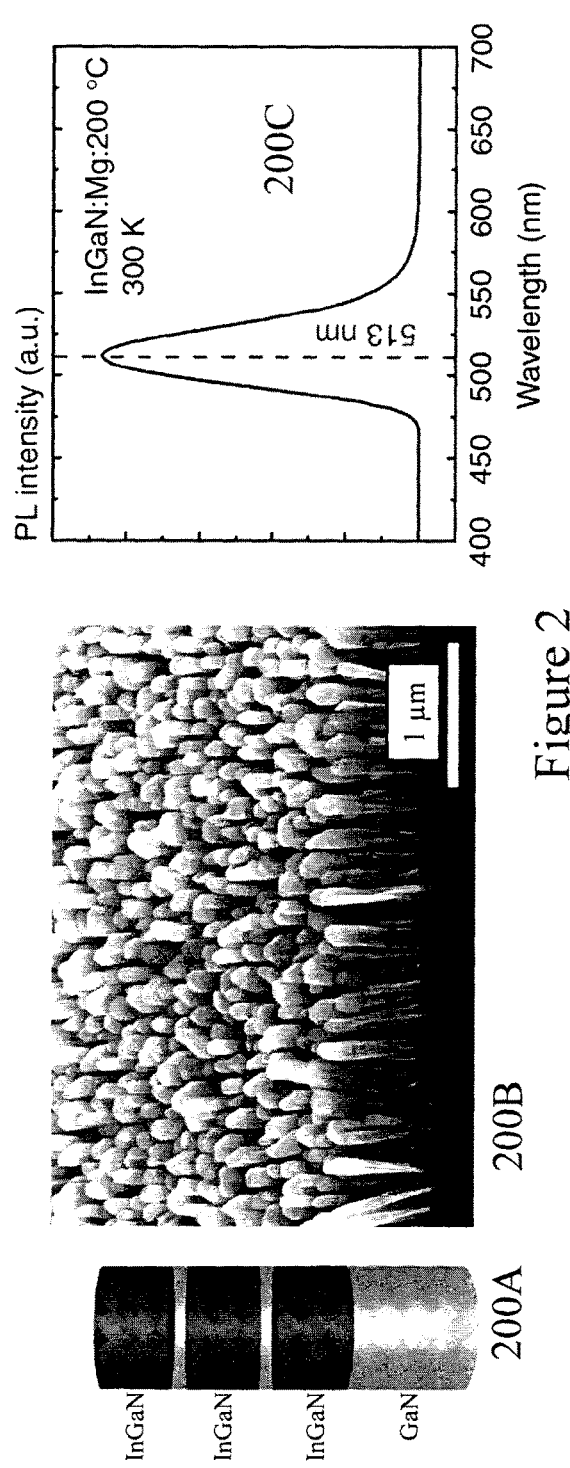
FIG. 2 depicts the structure and optical properties of an $In_{0.26}Ga_{0.74}N$ as employed within embodiments of the invention.
Figure 2:
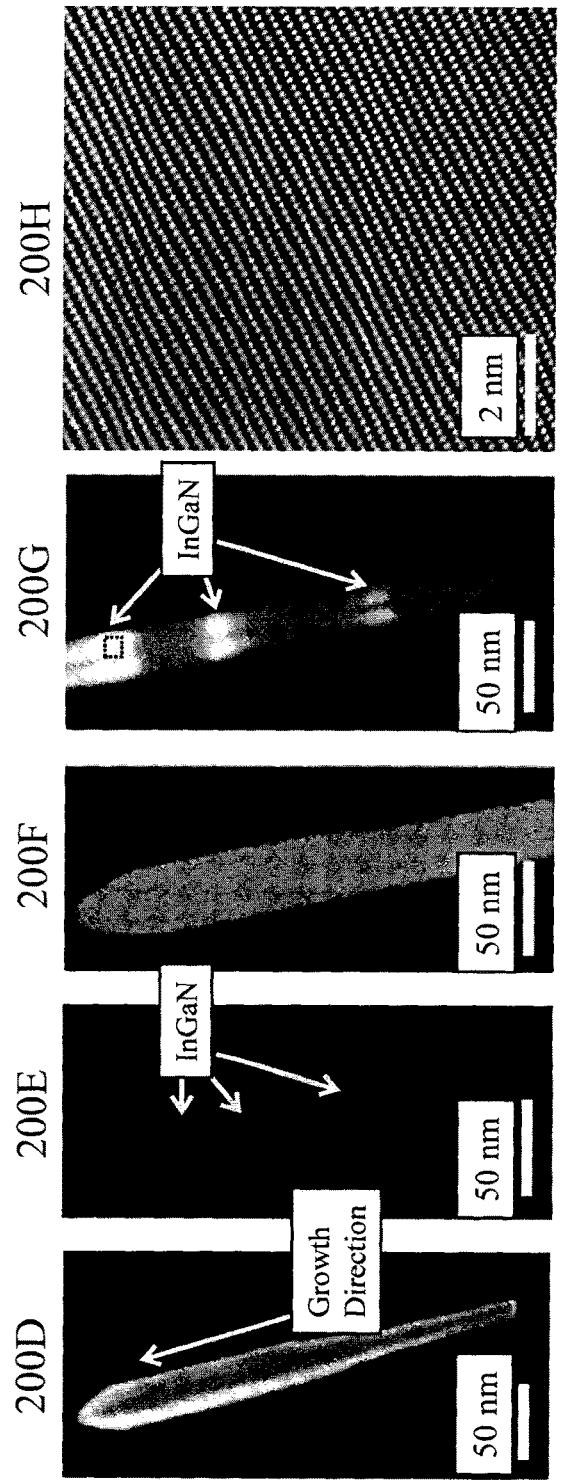

The room temperature micro-photoluminescence (μ-PL) spectrum of the fabricated InGaN nanowires, third image 200C in FIG. 2, clearly shows a single band-to-band optical emission peak at ~513 nm, which corresponds to a band gap energy of 2.42 eV and average In composition of ~26%. The broad emission peak reveals intra- and inter-nanowire In fluctuations, consistent with previous studies. The μ-PL measurements were performed with either a λ=405 nm or a λ=325 nm He—Cd laser as the excitation source. The laser beam was focused onto the sample through an 60× objective, with a circular beam size of ~5 µm. The emitted light was collected by the same objective, and spectrally resolved by a high-resolution spectrometer and detected by a photon counting mode photomultiplier tube.

Detailed structural and elemental characterization were performed using scanning transmission electron microscopy (STEM) and energy dispersive X-ray scanning (EDXS) analysis. For STEM imaging, e.g. STEM-SE, STEM-BF and STEM-HAADF imaging, a Cs corrected dedicated STEM was used with a cold field emission emitter operated at 200 kV and with an electron beam diameter of ~0.1 nm. STEM EDS analysis was performed using a 60 min$^2$ silicon drift detector (SDD).

Referring to fourth image 200D in FIG. 2 a STEM secondary electron (SE) image of a single $In_{0.26}Ga_{0.74}N$ nanowire on a carbon film is depicted. EDXS elemental mapping, fifth and sixth images 200E and 200F respectively reveal the existence of three segments of $In_{0.26}Ga_{0.74}N$ with total thickness of ~80 nm within the GaN nanowire. A STEM-high angle annular dark field (HAADF) image, seventh image 200G in FIG. 2, further shows the atomic number contrast between $In_{0.26}Ga_{0.74}N$ (brighter) and GaN (darker). No phase segregation or dislocations are observed in the $In_{0.26}Ga_{0.74}N$ or GaN layers, demonstrating excellent crystalline quality of the nanowires. Referring to eighth image 200H in FIG. 2, the high crystalline quality of the $In_{0.26}Ga_{0.74}N$ nanowires is further confirmed by clear lattice fringes in the high-resolution TEM image (of the selected region in seventh image 200G). A radial difference filter was used to process eighth image 200H.

The near surface band-structure of the $In_{0.26}Ga_{0.74}N$ nanowires was revealed by recording angle resolved X-ray photoelectron spectroscopy (ARXPS) valence spectrum from the lateral nonpolar (m-plane) surfaces of the nanowires. ARXPS measurements were performed using a K-Alpha XPS system equipped with a monochromatic Al-Kα X-ray source (hv=1486.6 eV) and 180° double focusing hemispherical analyzer for the analysis. The analysis chamber pressure was $10^{-8}$ Torr. The X-ray source is located at 60° with the surface normal to excite the nonpolar surfaces of nanowire arrays. The binding energies were calibrated with both Au 4f (84.0 eV) and C 1s (285.0 eV) peaks. The $E_{FS}-E_{VS}$ was estimated for each sample from ARXPS valence band spectra where the intersection between the linear extrapolation of the valence band leading edge and the baseline, see inset in first image 300A of FIG. 3, indicates the position of surface valence band ($E_{VS}$) with respect to the surface Fermi level ($E_{FS}$, binding energy=0 eV).

For $T_{Mg}$=190° C., the estimated $E_{FS}-E_{VS}$ is ~2.1 eV, which is nearly close to the $E_{FS}-E_{VS}$(~2.2 eV) of intrinsic $In_{0.26}Ga_{0.74}N$ indicating that the surface of $In_{0.26}Ga_{0.74}N$ is barely doped at $T_{Mg}$=190° C. Consequently, a large downward band bending is present in the near-surface region, resulting in a hole depletion region on the near surface region of the nanowire. The significant reduction in $E_{FS}-E_{VS}$ with further increase in $T_{Mg}$ is attributed to the enhanced Mg dopant incorporation in the near-surface region of $In_{0.26}Ga_{0.74}N$. Note that, the photoelectrons generated in the GaN region of the nanowires has negligible contribution to the drastic reduction in $E_{FS}-E_{VS}$, first image 300A in FIG. 3, as the near surface Fermi level of GaN:Mg barely changes in this doping regime ($T_{Mg}$=190 230° C.). The significant reduction in $E_{FS}-E_{VS}$ is further attributed to the reduction in downward band bending at the nanowire surface. Although the downward band bending caused by p-type doping accelerates proton reduction at the nanowire surface, it hinders the hole transport toward the nanowire-liquid interface. Therefore, by reducing the downward band bending with optimized dopant incorporation, the photocatalytic activity of the $In_{0.26}Ga_{0.74}N$:Mg nanowire can be significantly improved.

Figure 3:
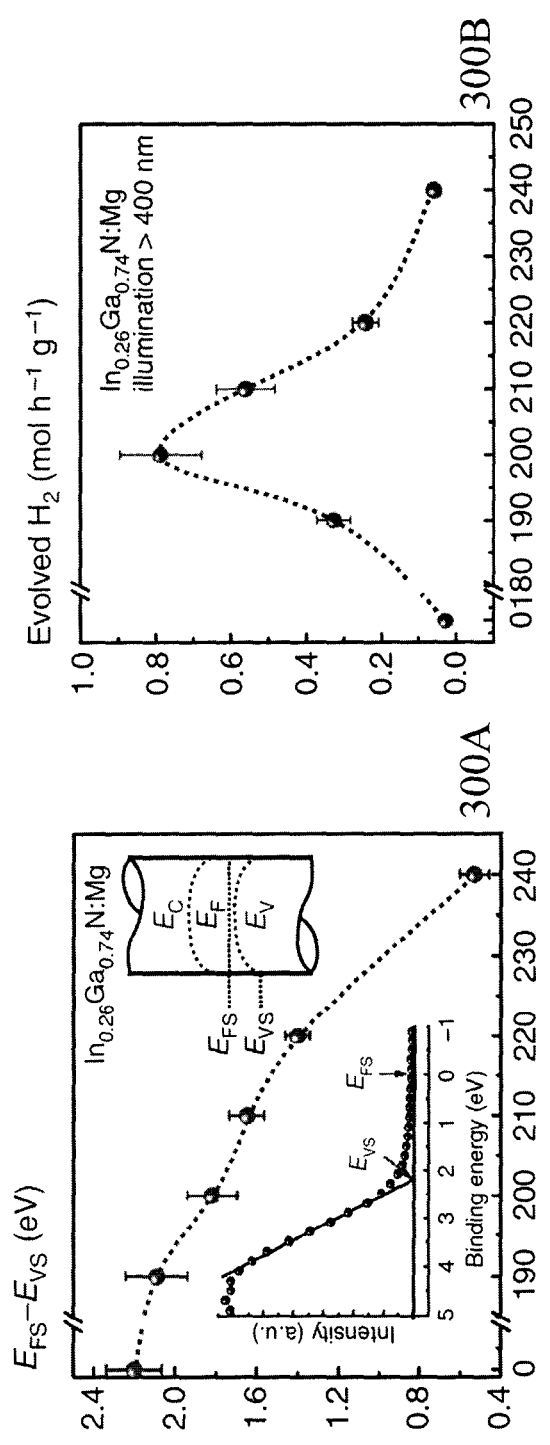
FIG. 3 depicts the surface charge properties and photocatalytic activity for $In_{0.26}Ga_{0.74}N$:Mg nanowires according to an embodiment of the invention.
Figure 3:
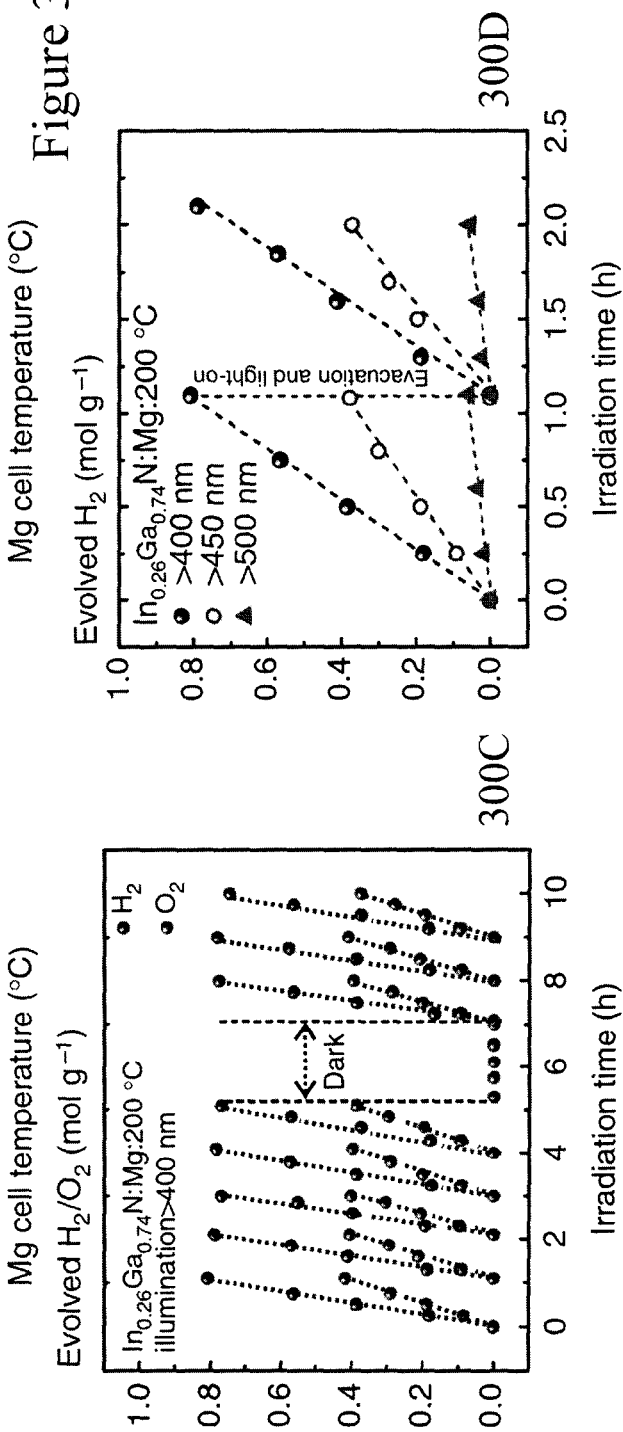

Referring to first image 300A in FIG. 3 shows the estimated $E_{FS}-E_{VS}$ for different Mg doped $In_{0.26}Ga_{0.74}N$ samples. It can be seen that $E_{FS}-E_{VS}$ varies from 2.2 eV to 0.5 eV with increasing Mg dopant incorporation. Under relatively low Mg effusion cell temperature (low Mg flux), the dopant incorporation in the near-surface region is limited by Mg desorption. The surface of such InGaN:Mg nanowires remains n-type, which explains the commonly measured large downward band bending on p-type InGaN surfaces. The dopant incorporation can be significantly enhanced in the near-surface region with an increase in $T_{Mg}$. Consequently, the lateral surfaces of InGaN nanowires can be transformed from n-type to weakly p-type. The extremely large tuning range (~1.7 eV) of the surface Fermi-level provides for achieving nearly flat band conditions for InGaN nanowire photocatalyst in equilibrium with water according to embodiments of the invention. This therefore leads to very rapid diffusion of both photo-generated electrons and holes to the surfaces for ultrahigh efficiency and balanced redox reactions that was not previously possible within the prior art.

Figure 1C:
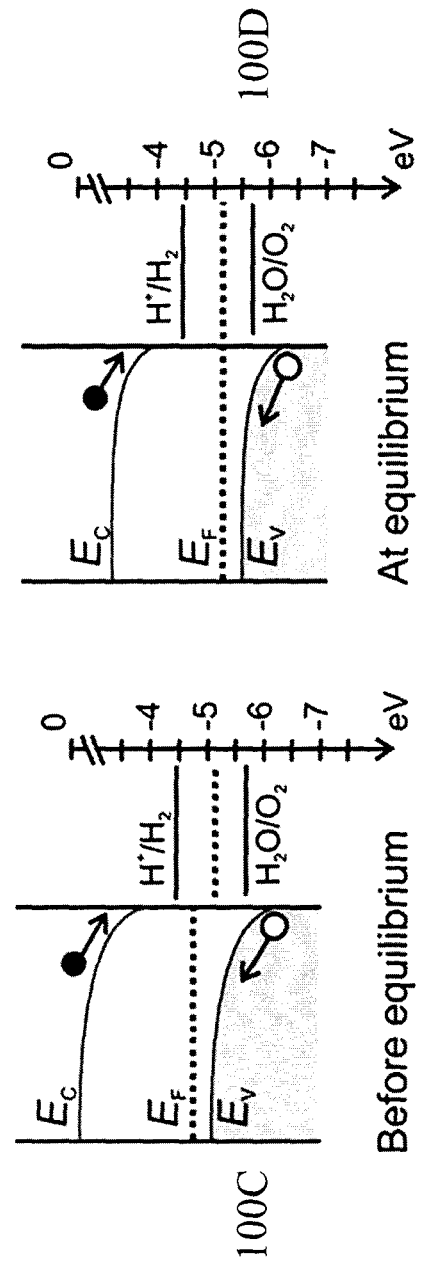
FIG. 1C depicts the downward band bending at the surface of p-type (bulk) $In_{0.26}Ga_{0.74}N$:Mg before equilibrium with water, where downward band bending repels the photogenerated holes toward the bulk and the electrons toward the surface and at equilibrium with water where the downward band bending reduces.

Referring to FIG. 1C in first image 100C the downward band bending at the surface of p-type (bulk) $In_{0.26}Ga_{0.74}N$:Mg ($T_{Mg}$=200° C.) before equilibrium with water. The downward band bending repels the photogenerated holes toward the bulk and the electrons toward the surface. Subsequently, at equilibrium with water the downward band bending gets reduced as depicted in second image 100D in FIG. 1C due to the interfacial charge transfer. Upon photoexcitation, the remaining band bending flattens out owing to the screening effect by the photogenerated carriers, which lead to enhanced carrier extraction.

1C. Co-Catalyst Nanoparticles

Recent studies have shown that water molecules are completely dissociatively absorbed on non-polar III-nitride surfaces, leading to the formation of hydroxyl species for the subsequent oxygen evolution reaction. To further promote $H_2$ evolution, a $Rh/Cr_2O_3$ core-shell co-catalyst was photodeposited on $In_{0.26}Ga_{0.74}N$:Mg nanowire surfaces. The nanowires were decorated with $Rh/Cr_2O_3$ core-shell nanoparticles using a two-step photodeposition process from liquid precursors. In the first step, Rh particles were photodeposited from sodium hexachlororhodate (III) ($Na_3RhCl_6$) precursor in the presence of 20% methanol in water. In the second step, the $Cr_2O_3$ was photodeposited from potassium chromate ($K_2CrO_4$) precursor in the presence of 20% methanol in water. The inventor's previous X-ray photoelectron spectroscopy analysis suggests that the co-catalysts form a Rh metallic core, mixed Rh—Cr oxide interfacial layer, and a $Cr_2O_3$ shell on the nanowire surface.

Figure 4:
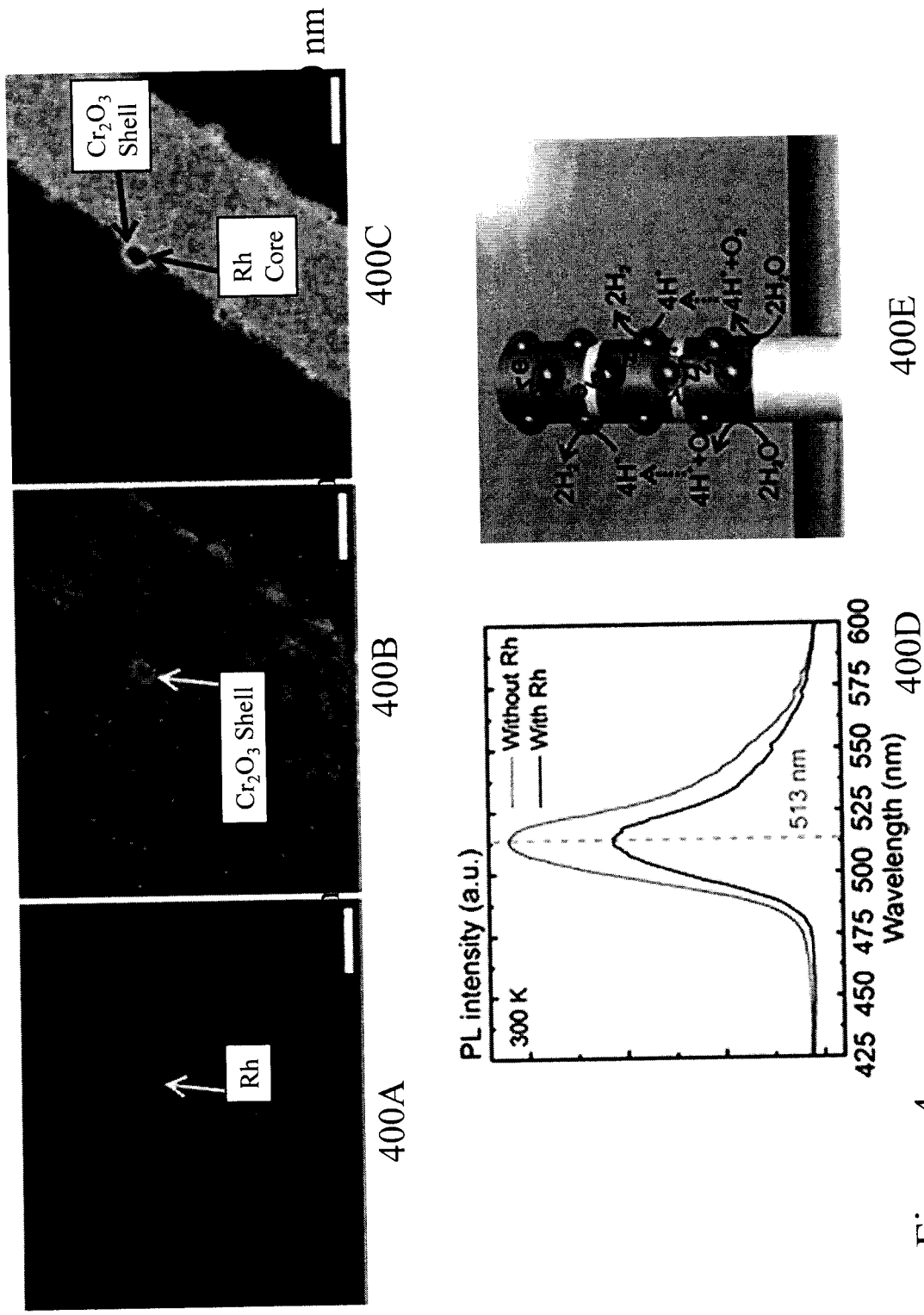
FIG. 4 depicts EDX elemental mapping images, μPL spectra and water splitting reaction mechanism for $In_{0.26}Ga_{0.74}N$ nanowires with $Rh/Cr_2O_3$ core-shell catalytic nanoparticles according to an embodiment of the invention.

Accordingly, the Rh nanoparticles can provide more active sites for $H_2O$ reduction while the $Cr_2O_3$ shell layer effectively prevents any backward reaction to form water. Apart from the near surface band bending, the photocatalytic activity can also be limited by the radiative and/or non-radiative recombination inside the photocatalyst. The $Rh/Cr_2O_3$ core-shell co-catalyst acts to suppress carrier recombination and therefore enhance charge carrier extraction. Referring to FIG. 4 the EDX elemental (Rh, Cr) mapping depicted in first to third images 400A to 400C demonstrates the successful deposition of the Rh/$Cr_2O_3$ core-shell co-catalyst on $In_{0.26}Ga_{0.74}N$:Mg nanowire surfaces. Since the Fermi level of Rh (−4.9 eV) is more negative than the electron affinity of $In_{0.26}Ga_{0.74}N$:Mg (−3.95 eV), the photogenerated electrons in the conduction band can easily migrate from nanowire to the Rh nanoparticles.

Under the same excitation condition, the measured μ-PL emission intensity of Rh:$In_{0.26}Ga_{0.74}N$:Mg composite is lower than $In_{0.26}Ga_{0.74}N$:Mg, confirming the fact that the photoexcited electrons are scavenged by the Rh particles, and therefore the carrier recombination is significantly suppressed. This being depicted in fourth image 400D in FIG. 4. Since Rh nanoparticles can be active sites for backward reaction to form water, the $Cr_2O_3$ shell layer forms a diffusion barrier which is permeable to $H^+$ and $H_2$ but not to $O_2$ s. Control experiments by the inventors suggest that the activity of the nanowire photocatalyst without co-catalyst is approximately 4-5 times lower than that of the catalyst with co-catalyst. Referring to fifth image 300E the overall water splitting reaction mechanism on the nanowire photocatalyst is depicted. The oxidation of water takes place on the nanowire nonpolar surfaces, as these surfaces are highly reactive for spontaneous dissociation of water. Since the nonpolar surfaces possess low energy barrier for proton diffusion, the protons produced from water oxidation process diffuses toward the active sites (Rh/$Cr_2O_3$ co-catalyst deposited sites) to take part in water reduction reaction to produce $H_2$.

The presence of a thin (~2-5 nm) GaN layer at the nanowire surface, caused by In evaporation during nanowire growth, creates an additional potential barrier which prevents the electrons and holes from reaching the nanowire-water interface, resulting in low activity. However, owing to the high excitation condition (2.6 W·$cm^{-2}$) in our experiments, most of the photogenerated carriers can readily overcome this barrier and reach the semiconductor-liquid interface.

1D. Experimental Results

The co-catalyst decorated $In_{0.26}Ga_{0.74}N$:Mg nanowire photocatalyst (~3 $cm^2$ wafer sample) was subsequently used for overall neutral water (pH-7.0) splitting under visible light (λ>400 nm) without the presence of any sacrificial reagents. The overall water splitting reaction was performed by adopting a 300 W Xenon lamp as an outer irradiation source. The sample was placed within a PTFE holder in a Pyrex chamber with quartz lid and the distilled water was purged with argon (Ar) for 20-30 minutes before each experiment. The chamber was then evacuated and a vacuum tight syringe employed for sampling the reaction evolved gases, $H_2$ and $O_2$, which were analyzed by a gas chromatograph equipped with a thermal conductivity detector (TCD) and high purity Ar carrier gas. The experimental error in evolution of $H_2$ and $O_2$ is estimated to be ~10% due to manual sampling of the evolved gases and leakage through the septum.

The $H_2$ evolution rates in overall water splitting for different Mg doped $In_{0.26}Ga_{0.74}N$ nanowire arrays are shown in second image 300B in FIG. 3. The evolution rates were derived from ~6 hours of water splitting for each sample. It is seen that the $H_2$ evolution rate first increases rapidly with $T_{Mg}$. The rate of $H_2$ evolution can reach ~300 μmol~$h^{-1}$ for the optimum Mg doped ($T_{Mg}$=200° C.) $In_{0.26}Ga_{0.74}N$ nanowire arrays, which is more than ~30 times higher than that of the nominally undoped sample. The significantly enhanced activity can be well explained by the tuning of the surface Fermi-level and reduction in the downward surface band bending, shown in first image 300A in FIG. 3 which can lead to more balanced oxidation and reduction reactions in solution, referring back to FIG. 1C.

With further reduction in the surface band bending, however, the surface charge properties may become non-optimal for the efficient transfer of electrons and holes to the nanowire surfaces in solution, evidenced by the decrease of the overall water splitting efficiency with further increase in $T_{Mg}$. Additionally, the reduction in photocatalytic activity at relatively high $T_{Mg}$ may be related to the deterioration of the crystal quality of the nanowires. At high Mg concentration, Mg acts as donor like self-compensation centers. With increases in Mg concentration, nitrogen vacancy ($V_N$) related defects increase due to reduced growth temperature ~600° C., leading to degradation of the structural quality. These defects work as self-compensation centers in $In_{0.26}Ga_{0.74}N$ at higher-doping levels. The deterioration of the crystal quality is further attributed to the appearance of mis-orientation caused by the formation of N-polar inclusions, similar to GaN:Mg. This explains the reduction in photocatalytic activity for $T_{Mg}$>200° C., as shown in second image 300B in FIG. 3.

Third image 300C in FIG. 3 depicts the evolution of $H_2$ and $O_2$ with irradiation time from neutral water from the optimum ($T_{Mg}$=200° C.) Mg doped $In_{0.26}Ga_{0.74}N$ nanowire arrays under visible light (λ>400 nm) irradiation. The evolved $H_2$/$O_2$ ratio was nearly 2:1, indicating a balanced oxidation and reduction reaction of water. The pH of water before and after reaction remained nearly the same, further confirming stoichiometric evolution of $H_2$ and $O_2$. Repeated cycles of water splitting demonstrate the stability of $In_{0.26}Ga_{0.74}N$:Mg nanowires.

The control experiments of the inventors also confirm that photo-excited electrons in Si substrate do not take part in the photochemical reaction, which can be directly correlated to the presence of large band-offset at the Si/GaN interface. The wavelength dependent activity of $In_{0.26}Ga_{0.74}N$:Mg nanowires is revealed by performing overall water splitting with different long-pass filters, depicted in fourth image 300D in FIG. 3. Significant activity was observed for excitation up to 520 nm, which is consistent with the band edge of $In_{0.26}Ga_{0.74}N$:Mg nanowires (PL peak λ~513 nm, third image 200C in FIG. 2).

Figure 5:
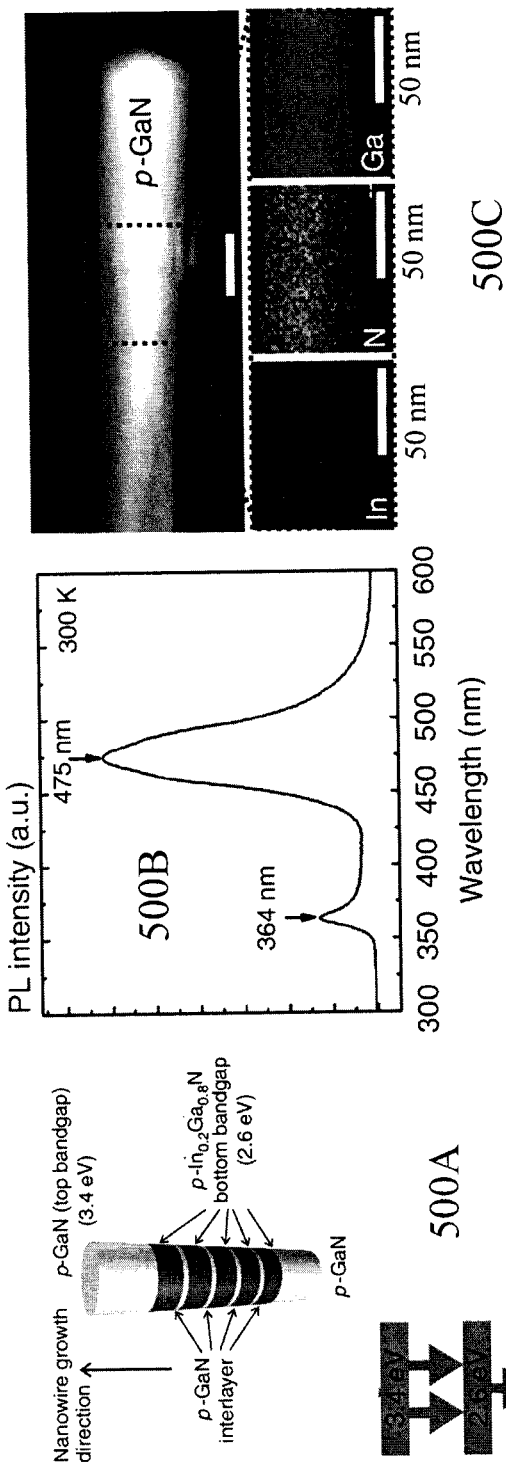
FIG. 5 depicts the structural, optical properties, and photochemical activity for p-GaN/p-$In_{0.20}Ga_{0.80}N$ double-band nanowires according to an embodiment of the invention.
Figure 5:
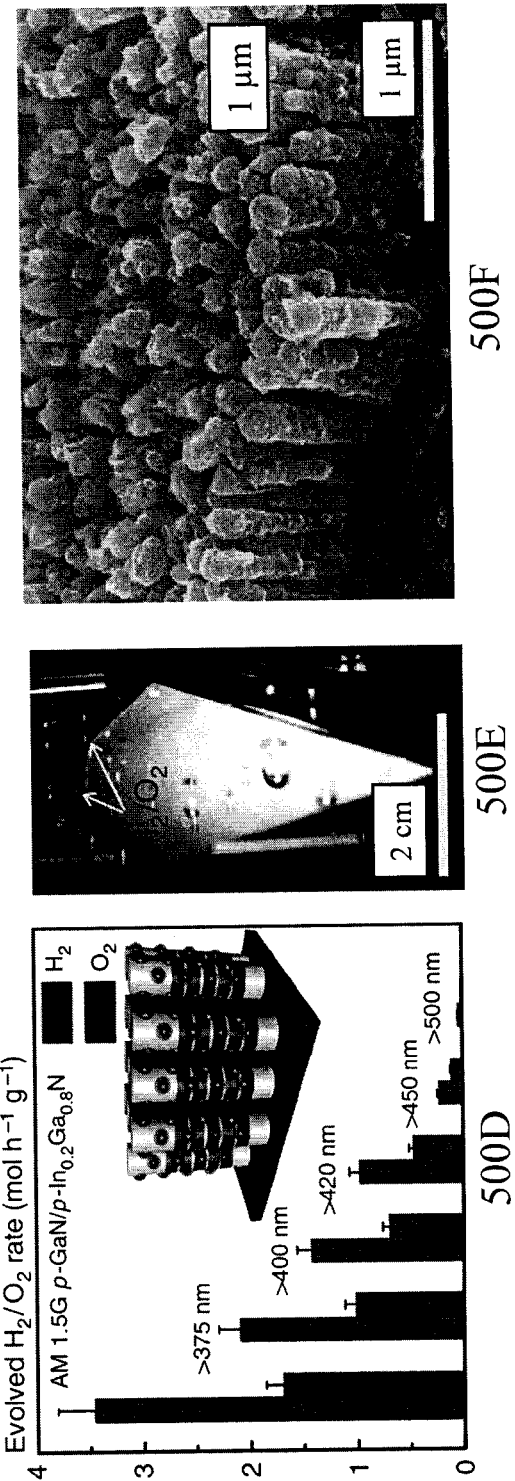

The inventors have also established multi-stacked broadband GaN:Mg/InGaN:Mg nanowire photocatalyst as depicted schematically in first image 500A in FIG. 5, wherein the surface charge properties and thicknesses of the GaN and InGaN segments are separately optimized to achieve maximum efficiency in the UV and visible wavelength ranges, respectively. The room temperature μ-PL measurements depicted in second image 500B in FIG. 5 reveals two band-to-band emission peaks at ~364 nm and ~475 nm respectively, corresponding to band gaps of GaN (3.4 eV) and InGaN (2.61 eV), respectively. For the growth of these multi-stacked broadband GaN:Mg/InGaN:Mg nanowire photocatalysts, the five InGaN segments were doped at $T_{Mg}$=200° C. and the top GaN segment was doped at $T_{Mg}$=270° C., see also Section D1 Estimation of Efficiencies.

Referring to the inset in first image 500A in FIG. 5 the multi-stacked GaN:Mg/InGaN:Mg nanowire photocatalyst can effectively function as a double-band heterostructure to efficiently harness UV and visible solar photons. The average In composition in InGaN segments is ~20%. The STEM-HAADF image, depicted in third image 500C in FIG. 5 clearly shows the atomic number contrast between $In_{0.26}Ga_{0.74}N$ segments (brighter contrast) and GaN nanowire. The $In_{0.26}Ga_{0.74}N$ total thickness is ~185 nm. The EDX elemental (In, Ga, N) mapping image of the nanowire heterostructure is illustrated in the inset of third image 500C in FIG. 5. The p-type behavior of the GaN:Mg and $In_{0.26}Ga_{0.74}N$:Mg are confirmed by open-circuit potential (OCP) measurements.

Figure 6:
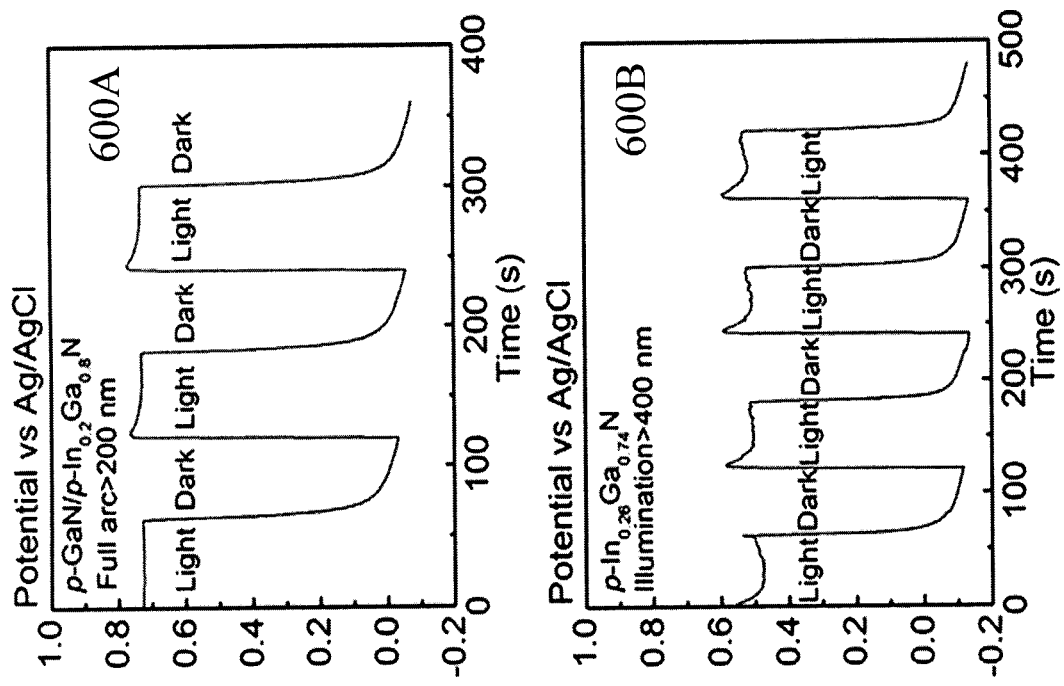
FIG. 6 depicts open circuit potential (OCP) measurements under dark and illumination at λ>200 nm and λ>400 nm on nanowires according to an embodiment of the invention.

The p-GaN/p-$In_{0.20}Ga_{0.80}N$ nanowires were characterized by OCP measurement. Using a three-electrode electrochemical cell configuration, the open circuit potential was performed in 1 mol/L hydrogen bromide (HBr). The p-GaN/p-$In_{0.20}Ga_{0.80}N$ nanowire arrays (on Si substrate), a Pt wire, and a double-junction silver/silver chloride (Ag/AgCl) were used as the photoactive working electrode, counter electrode, and reference electrode, respectively. In—Ga eutectic alloy metal was deposited on the backside of the Si substrate to serve as an Ohmic contact. OCP measurements were performed by using a 300 W Xenon lamp as an irradiation source. The reactor chamber was made of quartz for ample transmittance to both UV and visible light. The direction of the OCP shift, upon illumination, can determine the conductivity type of the material. For $p$-type material, the shift of the OCP upon illumination will be toward more positive potential with respect to Ag/AgCl. As depicted in first image 600A in FIG. 6, under full arc illumination the potential difference (with respect to Ag/AgCl) between light and dark is positive, indicating p-type behavior of GaN/p-$In_{0.20}Ga_{0.80}N$:Mg nanowires. In order to explore the conductivity type of $In_{0.20}Ga_{0.80}N$ material, an optical long-pass filter ($\lambda$>400 nm) was used to excite only the $In_{0.20}Ga_{0.80}N$ segments. As shown in second image 600B in FIG. 6, the open circuit potential upon illumination shifts to more positive potential, indicating p-type conductivity of the $In_{0.20}Ga_{0.80}N$:Mg material. The OCP for p-GaN/p-$In_{0.20}Ga_{0.80}N$ were approximately 0.77V and approximately 0.62V versus Ag/AgCl under full arc ($\lambda$>200 nm) and visible light (>400 nm), respectively. A control experiment further suggests n-type behavior (negative potential difference between light and dark) of the conductivity in the absence of Mg doping in GaN and $In_{0.20}Ga_{0.80}N$ segments.

With the incorporation of $Rh/C_2O_3$ core-shell nanoparticles on the p-GaN/p-$In_{0.20}Ga_{0.80}N$ nanowires, overall water splitting was performed with different long-pass filters in the absence of any sacrificial reagents under 300 W Xenon lamp irradiation. The rates of $H_2$ and $O_2$ evolution are shown in fourth image 500D in FIG. 5, which are determined from ~6 hours of water splitting. The $H_2$ and $O_2$ evolution rates were ~3.46 $mol \cdot h^{-1} \cdot ^{-1}$ and ~1.69 $mol \cdot h^{-1} \cdot g^{-1}$ with the use of an AM1.5G filter. Visible bubbles of $H_2$ and $O_2$ were clearly observed as depicted in fifth image 500E in FIG. 5 upon irradiation. The pH of water remained the same over the course of reaction, showing unambiguous evidence of balanced reaction. The photocatalytic activity decreased with increase in wavelength, limited by the optical absorption of the nanowire catalyst.

1D1: Estimation of Efficiencies

In this section the apparent quantum efficiency (AQE), absorbed photon conversion efficiency (APCE) and energy conversion efficiency (ECE) of the double-band GaN/InGaN nanowire photocatalyst are presented.

1D1.1 Simplified Nanowire Model for the Efficiency Calculation

Light propagation and absorption inside a layered structure, such as depicted in first image 500A in FIG. 5, can generally be calculated by using a multi-layer reflectivity model. However, because of the negligible mismatch in refractive index between GaN and InGaN for the indium compositions within the range approximately 20-30% used within embodiments of the invention, the reflection from GaN/InGaN interfaces can essentially be ignored for both UV, $\bar{R}$~0.05%, and visible light, $\bar{R}$~0.005%, where $\bar{R}$ is average reflectivity. Moreover, GaN absorption spectrum excludes visible light whereas InGaN can absorb in both the UV and visible spectrum regions. Furthermore, a stepwise calculation for the five-layered GaN/InGaN heterostructures, see first image 500A in FIG. 5, shows that the GaN cap-layers (~6 nm) in between the InGaN layers absorb very small fraction of UV light transmitted through the nanowires, <1%. Accordingly, considering all these factors, the five-layered GaN/InGaN heterostructures can essentially be simplified to a two-layered structure, having approximately 130 nm thick p-GaN layer (doped at $T_{Mg}$=270° C.), on the upper side with a lumped approximately 185 nm thick InGaN layer (doped at $T_{Mg}$=200° C.).

Figure 7:
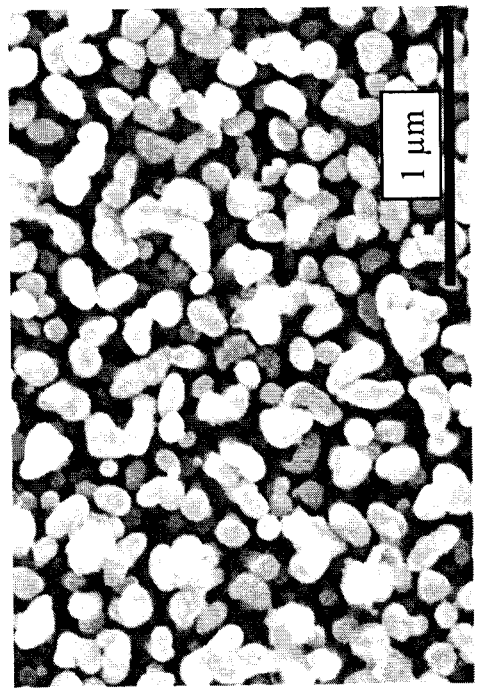
FIG. 7 depicts a top view SEM image of p-GaN/p-$In_{0.20}Ga_{0.80}N$ nanowire arrays according to an embodiment of the invention with a scale bar of 1 μm.

In order to derive the apparent quantum efficiency (AQE) for the photocatalytic overall water splitting, the number of incident photons in the wavelength range of 200 nm$\leq\lambda$<475 nm (photoluminescence peak at $\lambda$≈475 nm as shown in second image 500B in FIG. 5) was estimated from the lamp spectrum and corresponding filter transmission spectrum), which represents the overlapped wavelength between the absorption spectrum of GaN/InGaN nanowires and the power spectrum of the lamp. The AQE and absorbed photon conversion efficiency (APCE) were derived using the following process. The incident power on the sample can be expressed as Equation (1) where $A_{sample}$ is the sample area ($A_{sample}$~3 $cm^2$) and $\beta_{ff}$ is the nanowire fill factor. The $\beta_{ff}$ is assumed to be unity, assuming all the incident photons are absorbed, for the calculation of AQE, and 42.3%, based upon the top view SEM image of the nanowire arrays depicted in FIG. 7, for the estimation of APCE. $\rho_{incident}(\lambda)$ is the incident power intensity on the sample, which was derived by measurements using a broadband detector and taking into account the power spectrum of the lamp and optical filter, while mimicking the experimental configuration.

$$P_{incident}(\lambda) = \rho_{incident}(\lambda) \times A_{sample} \times \beta_{ff} \quad (1)$$

1D1.2 Calculation of the AQE and APCE Using AM1.5G Optical Filter in the UV and Visible Wavelength Range (200 nm$\leq\lambda$<475 nm)

In this section, the inventors describe the calculation of the AQE and APCE with the use of an AM1.5G optical filter. The total incident power on the sample is estimated to be 1464 mW in the wavelength range of 200 nm$\leq\lambda$<475 nm with the AM1.5G filter. The number of incident photons per second, as a function of wavelength is calculated from Equation (2) wherein $E_{ph}(\lambda)$=hc/$\lambda$ is the photon energy for the corresponding wavelength. The total number of incident photons per second within 200 nm$\leq\lambda$<475 nm can then be calculated by Equation (3).

$$N_{ph}(\lambda) = \frac{P_{incident}(\lambda)}{E_{ph}(\lambda)} \quad (2)$$

$$N_{ph,inc}(200 \text{ nm} \leq \lambda \leq 475 \text{ nm}) = \int_{\lambda=200 \text{ nm}}^{\lambda=475 \text{ nm}} \frac{P_{incident}(\lambda) \times \lambda}{hc} d\lambda \quad (3)$$

$$AQE = 2 \times \frac{\text{Number of Evolved } H_2 (\text{molecules} \cdot hr^{-1})}{\text{Number of Incident Photons } (hr^{-1})} \times 100\% \quad (4)$$

Accordingly, the AQE can then be derived from Equation (4). As the amount of absorbed power depends on the optical properties of the different layers involved, namely, water, GaN and InGaN then for the simplified model of the inventor's structure, there are only three layers and hence two corresponding interfaces, which are the water/GaN and GaI/InGaN interfaces. Considering the large refractive index mismatch between GaN and water, on average approximately 10% of the incident power (both UV and visible) is reflected back from the top surfaces of the nanowires. The absorbed power can be calculated using the refractive indices and absorption coefficients of the materials for the detailed calculation, which is estimated to be approximately 230.9 mW in the wavelength range 200 nm≤λ<475 nm with the use of an AM1.5G optical filter. The APCE of the structure may then be estimated from Equation (4) by replacing the number of incident photons with that of the absorbed photons, as derived by Equation (5).

$$N_{ph,abs}(200 \text{ nm} \le \lambda \le 475 \text{ nm}) = \int_{\lambda=200 \, nm}^{\lambda=475 \, nm} \frac{P_{absored,GaN+InGaN}(\lambda) \times \lambda}{hc} d\lambda \quad (5)$$

The AQE and APCE, corresponding to the entire absorption spectrum (200 nm≤λ<475 nm) for the double-band structure, which includes both UV and visible photons, were derived to be approximately 20% and 74.5%, respectively. The light trapping and scattering effect have not been taken into account for the estimation of APCE. Clearly, this APCE of the nanowire structure is only limited by the charge transport efficiency to the solid-liquid interface ($\mu_{transport}$) and the efficiency of interfacial charge transfer ($\eta_{interface}$).

1D1.3 Calculation of the AQE and APCE in the Visible Wavelength Range (200 nm≤λ<475 nm)

From Equations (3) to (5), the total incident power, on the ~3 cm² sample, and absorbed power by the nanowires in the visible wavelength range (400 nm≤λ<475 nm) were calculated to be 843 mW and 152 mW, respectively, which corresponds to approximately 12.3% and approximately 68.5% AQE and APCE, respectively.

1D1.4 Calculation of the ECE Using AM1.5G Filter in the UV and Visible Wavelength Range (200 nm≤λ<475 nm)

Figures 8, 9:
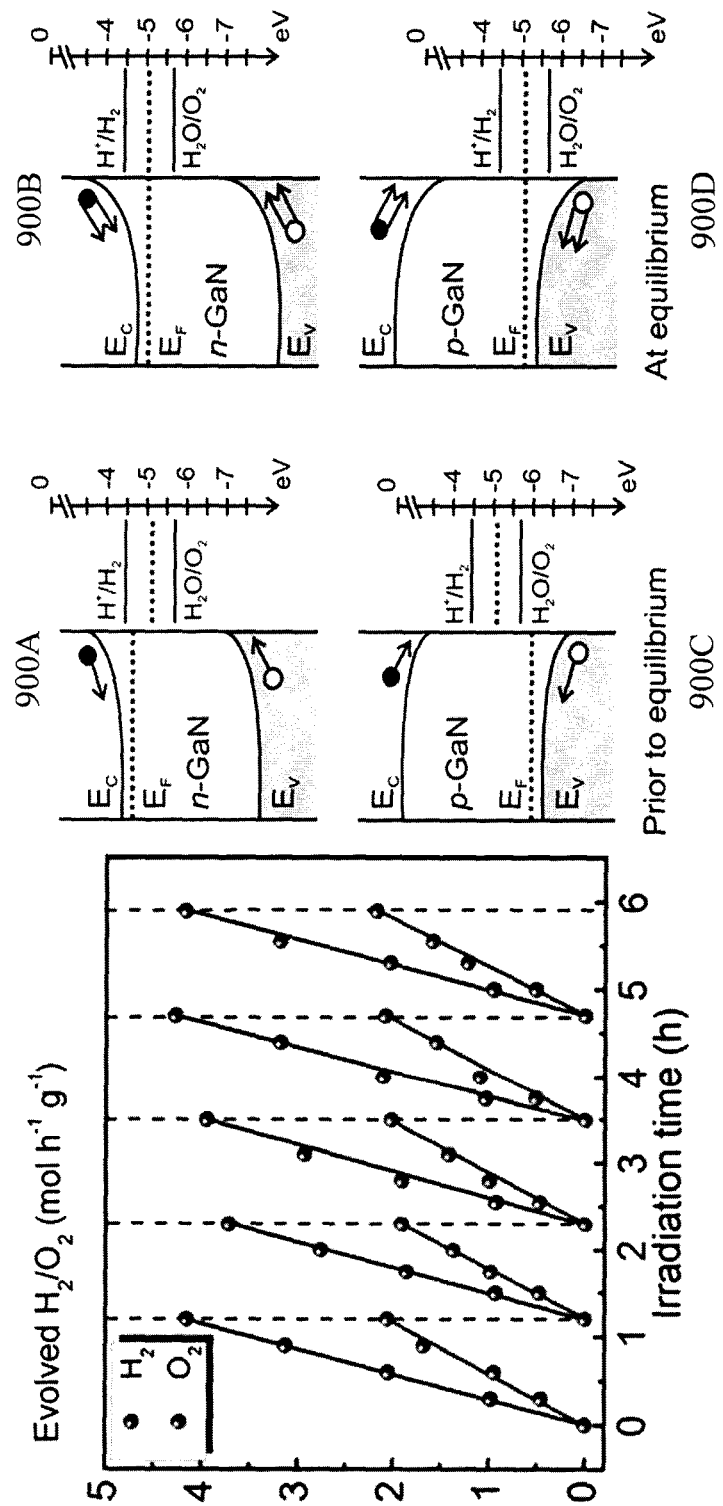
FIG. 8 depicts weight normalized evolved $H_2$ and $O_2$ from overall neutral (pH~7.0) water splitting with $Rh/Cr_2O_3$ core-shell catalytic nanoparticle decorated p-GaN/p-$In_{0.20}Ga_{0.80}N$ nanowire arrays according to an embodiment of the invention under filtered illumination.
FIG. 9 depicts the surface band bending of n- and p-type GaN nanowires prior to and at equilibrium with water.

The energy conversion efficiency (ECE) was calculated to be approximately 7.5% using Equation (6), considering the total incident power intensity in the wavelength range 200 nm≤λ<475 nm (488 mWcm$^{-2}$) and the H$_2$ evolution rate of ~1660 μmol·hr$^{-1}$ as depicted in FIG. 8 under full arc illumination with the AM1.5G filter.

$$ECE = \frac{H_2(\text{mmol} \cdot \text{s}^{-1}) \times 237 \text{ kJ} \times 1000}{\rho_{incident\_total}(\text{mW} \cdot \text{cm}^{-2}) \times A_{sample}(\text{cm}^{-2})} \times 100\% \quad (6)$$

1E. Summary

Accordingly, the APCE and AQE of the p-GaN/p-In$_{0.2}$Ga$_{0.8}$N double band nanowire photocatalyst were derived to be approximately 74.5% and approximately 20%, respectively in the wavelength range 400 nm≤λ<475 nm. In the range of 400 nm≤λ<475 nm, the APCE and AQE are estimated to be approximately 69% and approximately 12.3% respectively, which are higher than the prior art results for one-step overall water splitting under visible light irradiation. Additionally, the energy conversion efficiency is estimated to be approximately 7.5% under UV and visible light (up to λ~475 nm) which exceeds the prior art results for one-step overall water splitting and are comparable to the reported prior art results for wireless or wired water splitting cell exploiting integrated photovoltaic cells. The turnover number (TON), in terms of the ratio of the total amount of gas (H$_2$ and O$_2$) evolved per hour (~2.48 mmol) to the amount of p-GaN/p-In$_{0.2}$Ga$_{0.8}$N catalyst (~0.48 mg), exceeded ~5.15 mol·hr$^{-1}$·g$^{-1}$ under full arc illumination with AM1.5G filter. Under visible light (λ>400 nm) the TON is estimated to be ~2.0 mol·hr$^{-1}$·g$^{-1}$. The extremely high TON can essentially overcome the barrier for large scale practical applications of the III-nitride photocatalyst.

Repeated cycles of water splitting show no degradation of the photocatalytic activity, as depicted in FIG. 8. Referring to FIG. 5 and sixth image 500F there is depicted an SEM image of a p-GaN/p-In$_{0.2}$Ga$_{0.8}$N nanowire photocatalyst after approximately 6 hours of overall water splitting. The p-GaN/p-In$_{0.2}$Ga$_{0.8}$N nanowire and the Rh/C$_2$O$_3$ co-catalysts are stable over the course of this reaction. The high stability of group III-nitride, which has also been confirmed in several other studies, is ascribed to the large difference in electronegativity between group III and group V elements that can lead to the absence of surface states within the fundamental energy band gap.

2. Visible and Infra-Red Water Splitting

2A. Band Bending and Fermi Level Tuning

As noted supra amongst the various paths to solar fuel production, the photochemical dissociation of water into its constituent parts, H$_2$ and O$_2$, offers the simplest and potentially the most efficient approach; as this spontaneous, wireless approach requires virtually zero energy input except sunlight. Recently, nanoscale photocatalysts have been intensively studied which can increase light absorption and charge carrier separation, and therefore enhance the quantum efficiency, see for example Tong. Fermi-level pinning, however, has been commonly measured on nanowire surfaces wherein the resulting surface band bending creates an additional energy barrier for charge carrier transport to the photocatalyst-water interface, leading to significantly reduced reaction rate and extremely low efficiencies. To date, the rational synthesis of nanostructured photocatalysts with controlled surface charge properties, i.e. tunable surface Fermi level and band bending, has remained a near-universal challenge. Such uncontrolled surface charge properties can further contribute to the photo-corrosion and instability of various nanostructures under harsh photocatalysis conditions, severely limiting their practical applications.

Accordingly, as outlined below the inventors have addressed this issue for the water splitting reaction on the nonpolar surfaces (m-plane) of GaN nanowire photocatalyst which can form the basis of a platform for spontaneous water splitting under visible and infrared light irradiation through the incorporation of indium. Unique to the nonpolar GaN surfaces is that the occupied surface states are positioned outside of the fundamental energy band gap and therefore do not create Fermi-level pinning. The nonpolar surfaces are also highly reactive for spontaneous dissociation of water molecules and possess low energy barrier for proton diffusion. However, due to any surface contamination and/or the presence of any defects, an upward (downward) band bending has been commonly measured on n- (p-) type GaN surfaces.

Accordingly, when an n-type GaN surface comes into contact with water, the upward band bending becomes more severe, as depicted in first and second images 900A and 900B respectively in FIG. 9, which can suppress H$_2$O reduction reaction. When p-type GaN surfaces are in equilibrium with water, the downward band bending can be enhanced, third and fourth images 900C and 900D respectively in FIG. 9, which can also limit the $H_2O$ oxidation reaction. In practice, weakly n-type or nearly intrinsic surfaces are often present on p-doped GaN nanowires, with the Fermi-level positioned slightly above the electrochemical potential of water. As a consequence, the downward band bending may actually be reduced when such p-doped GaN nanowires are in equilibrium with water. The inventors have theorized and demonstrate according to embodiments of the invention described below that through tuning the Fermi-level on nanowire surfaces it is possible to realize balanced and therefore more efficient redox reactions for GaN nanowires. As noted supra in respect of Section 1A through 1D band tuning was theorized and demonstrated for InGaN nanowires.

Since water oxidation is often the rate-limiting reaction then p-doped nanowire photocatalysts may further enhance the overall water splitting efficiency by providing abundant free holes. To date, however, the achievement of p-doped GaN nanowires with tunable surface Fermi-level has remained challenging. The difficulty in achieving p-type surfaces for GaN nanowires is directly related to the presence of extensive n-type surface-states, defects, any unintentional impurity incorporation (particularly oxygen), and the relatively large activation energy (~170 meV) of Mg acceptors in GaN. Additionally, the direct incorporation of Mg dopant in the near-surface region of GaN nanowires suffers severely from the large surface desorption of Mg at high growth temperature (~750° C.). Although p-type GaN nanowires have been demonstrated a precise control of their surface charge properties has not been achieved within the prior art.

2B. Results 2B.1 Structural Characterization

Catalyst-free vertically aligned GaN nanowires were grown on n-Si (111) substrate by radio frequency plasma-assisted MBE under nitrogen rich conditions. Thermal effusion cells were used for Ga and Mg. The native oxide on Si substrate was etched with 10% HF for 30 seconds prior to loading into the MBE chamber. The growth parameters include a growth temperature of ~750° C., nitrogen flow rate of 1.0 sccm, a forward plasma power of ~350 W, and a Ga beam equivalent pressure of ~6×10$^{-8}$ Torr. The growth duration was ~4 hrs. The Mg beam equivalent pressure was varied from ~0.2×10$^{-10}$ to ~1.5×10$^{-9}$ Torr for Mg cell temperatures from 200° C. to 300° C. It would be evident that, because of the presence of conduction and valence band offsets at the GaN/Si interface, the photoexcited carriers within the Si substrate do not take part in the photochemical reaction.

The Mg-dopant concentration was varied by tuning the Mg effusion cell temperature over the range 200° C.≤$T_{Mg}$≤300° C. Samples A, B, C, D, E and F within this specification correspond to $T_{Mg}$=200° C.; 230° C.; 250° C.; 265° C.; 280° C.; 300° C. A 45°-tilted scanning electron microscopy (SEM) image of the as-grown Mg-doped GaN Sample B nanowire, denoted by GaN:Mg hereafter, is shown in first image 1000A in FIG. 10 and as second image 1100B in FIG. 11. The first, third, and fourth images 1100A, 1100C, and 1100D respectively in FIG. 11 representing similar 45° tilted SEM images of GaN:Mg nanowires, with Mg effusion cell temperatures of $T_{Mg}$=200° C.; 250° C.; 265° C. respectively. The nanowires are ~600 nm in length, ~50 nm-75 nm in diameter and vertically aligned to the substrate. Referring to second image 1000B in FIG. 10 there is depicted a scanning transmission electron microscopy-bright field (STEM-BF) image, illustrating lattice fringes from defect-free single crystalline nanowire (Methods). A Philips CM200 transmission electron microscope (TEM) with an accelerating voltage of 200 kV was used to obtain bright-field STEM images. For the STEM-SE and STEM-HAADF images presented below a Hitachi HD2700 Cs-corrected STEM with a cold field emission emitter operated at 200 kV and with an electron beam diameter of approximately 0.1 nm was used. Within the STEM-BF image the distance between the two adjacent fringes is ~0.518 nm which corresponds to the <001> direction, further confirming that the nanowires are grown along the c-axis, with their sidewalls being nonpolar m-planes.

Room-temperature photoluminescence (PL) measurements were performed using a 325 nm He—Cd laser as the excitation source wherein the photoluminescence was spectrally resolved by a high-resolution spectrometer, and detected by a photomultiplier tube. Room-temperature photoluminescence spectrum of GaN:Mg nanowires, with Mg effusion cell temperature $T_{Mg}$=230° C., is shown in FIG. 12 clearly showing a single optical emission peak at ~365 nm, corresponding to the band gap of GaN, 3.4 eV. For subsequent experiments ~2.8 cm$^2$ wafer samples were used which corresponds to ~0.387 mg (~4.62 µmol) GaN materials, considering the nanowire fill factors on the Si substrates as evident from FIG. 13.

2B.2 Near-Surface Band Structure

The near-surface band structure of as-grown nanowires can be estimated by measuring the Fermi level ($E_F$) relative to the valence band maximum (VBM, $E_V$). The $E_F$-$E_V$ in the near-surface region as depicted in third image 1000C in FIG. 10 which was measured by recording angle-resolved X-ray photoelectron spectroscopy (ARXPS) valence spectrum from the lateral nonpolar (m-plane) surfaces of the nanowire.

ARXPS was performed with a monochromatic Al-Kα X-ray source (hv=1486.6 eV) placed 60° with the surface normal to excite the nonpolar surfaces of the GaN nanowire arrays. The high resolution XPS spectra were obtained using an X-ray beam size of 400 µm, pass energy of 50 eV, and a step size of 0.1 eV. Individual peak fitting was performed using convolution of Lorentzian and Gaussian line shapes (L/G=30%). The binding energies were calibrated with the carbon is peak (285.0 eV) before each experiment. The $E_F$-$E_V$ was estimated from ARXPS valence spectrum with linear extrapolation of the valence band leading edge and the baseline as shown in the inset of third image 1000C in FIG. 10. The intersection between these two lines indicates the position of surface valence band with respect to the surface Fermi level (binding energy=0 eV).

Figure 10:
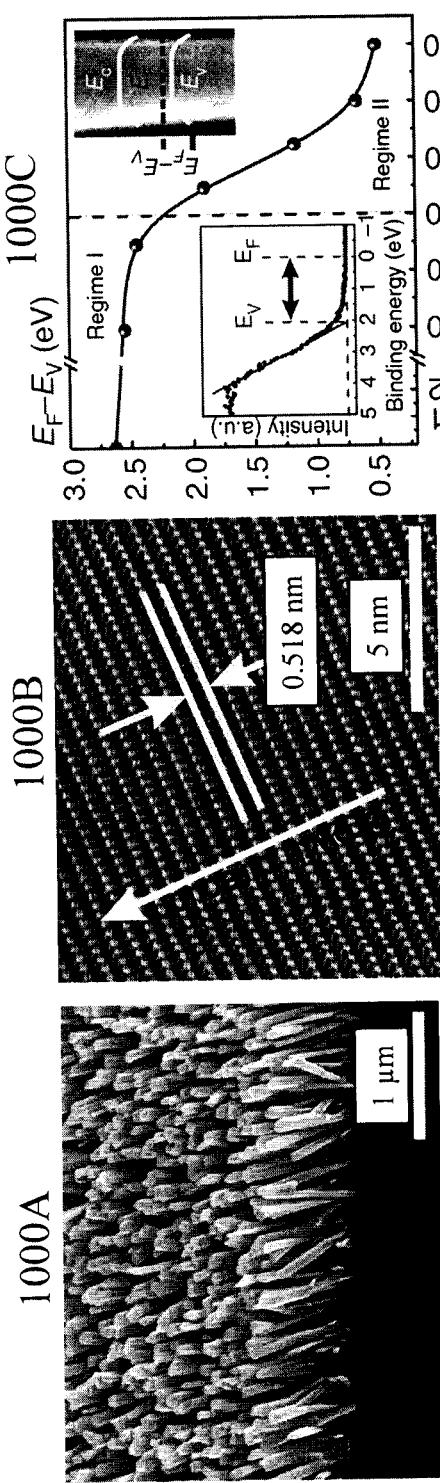
FIG. 10 depicts structural characterization and surface charge properties of GaN:Mg nanowires according to embodiments of the invention.
Figure 10:
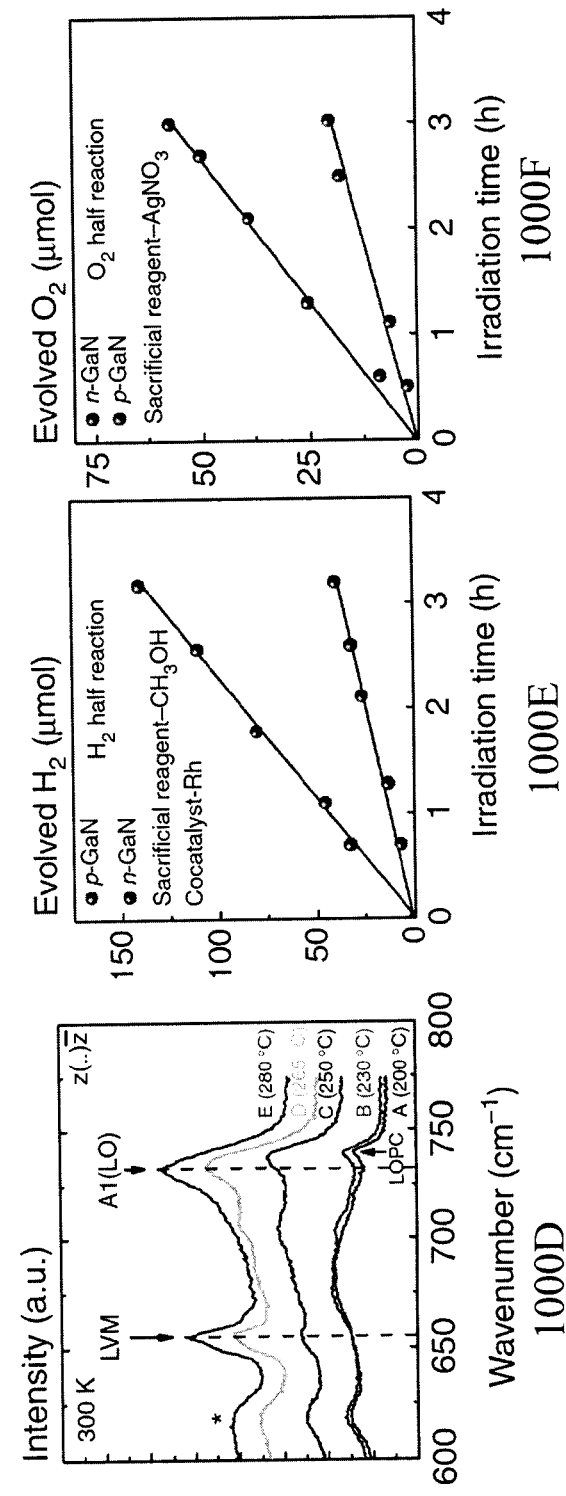
Figure 11:
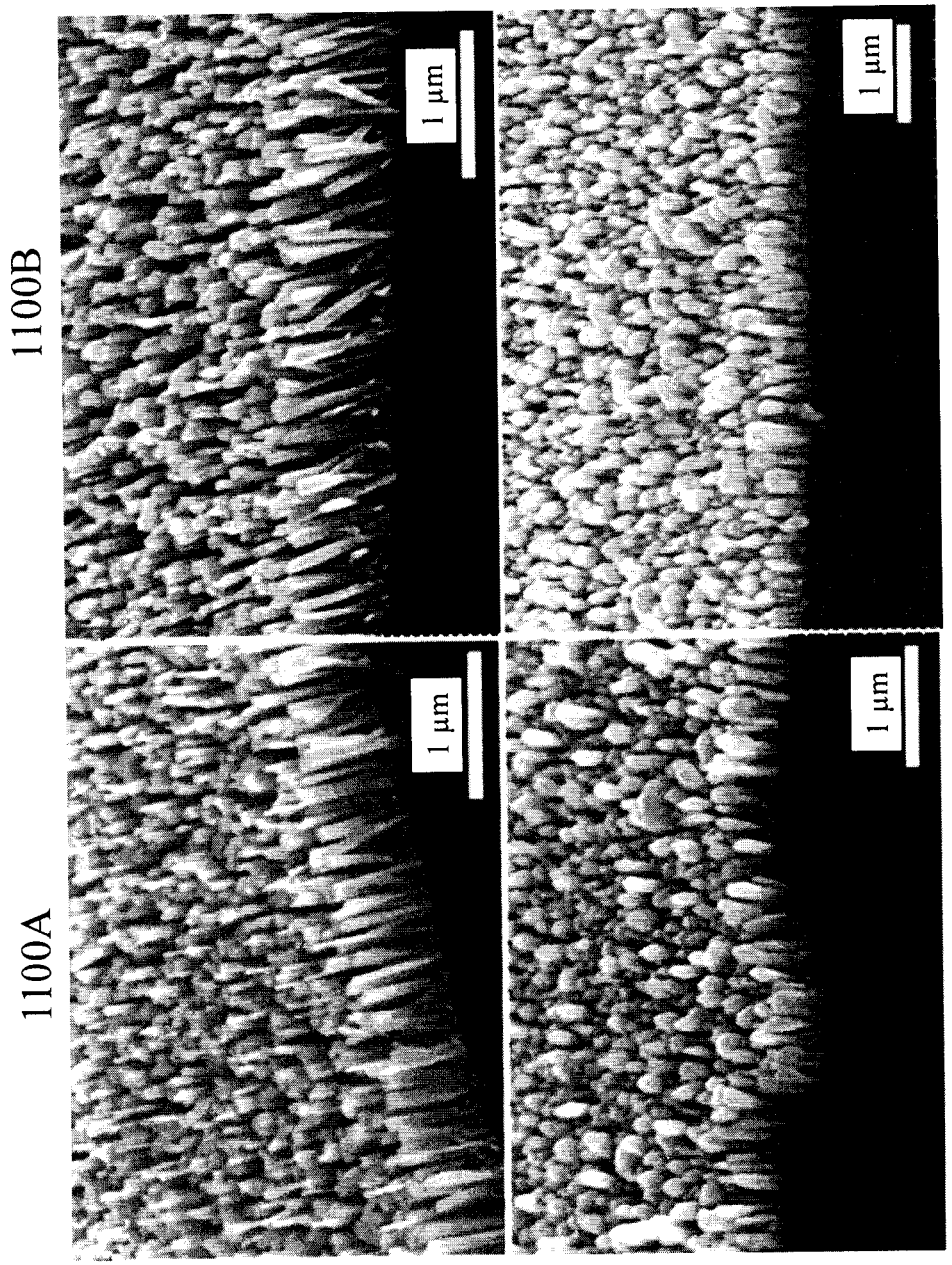
FIG. 11 depicts 45° tilted SEM images of GaN:Mg nanowires according to embodiments of the invention with different Mg effusion cell temperatures.

As evident from third image 1000C in FIG. 10, the $E_F$-$E_V$ is measured as 2.63 eV for undoped GaN ($T_{Mg}$=0° C.), which is similar to the $E_F$-$E_V$ of 2.6 eV measured on n-type GaN surfaces. Two distinct regimes are clearly separated with dotted lines. Regime I (n-type surfaces), wherein the near-surface $E_F$-$E_V$ stays nearly constant for $T_{Mg}$ up to 230° C., corresponds to the compensation of background n-type dopants by Mg acceptors. Regime II (p-type surfaces), wherein the near-surface $E_F$-$E_V$ decreases drastically with increasing $T_{Mg}$, is due to the enhancement in free hole concentration within the GaN nanowires. In the relatively high bulk doping regime (Samples C to F), variations of $E_F$-$E_V$ within the bulk region with increasing Mg cell temperature are estimated to be in the range of tens of meV, which is much smaller than the variation measured in the near-surface region (~2 eV). Consequently, the reduction of $E_F$-$E_V$ in the near-surface region as evident in third image 1000C in FIG. 10 can be directly correlated to the reduction in the downward surface band bending with increasing Mg dopant incorporation. Additionally, the inventor's detailed analysis reveals that variations in the nanowire morphology have a very small, or negligible dependence on the surface band bending of GaN nanowires.

2B.3 P-Type Doping

Variations of the surface charge properties are further probed by micro-Raman measurements at room-temperature with an external 488 nm Argon-ion laser through an 100× objective with a numerical aperture ~0.9 resulting in a focused laser spot size of ~1 μm and an estimated power on the sample was ~40 mW. The Raman signal was collected by a CCD air-cooled detector. The incident laser was parallel with the hexagonal c-axis of the nanowires, and accordingly the laser light was scattered without polarization analysis (z( . . . )z direction). The evolution of the Raman mode in the range of 600-800 $cm^{-1}$ with Mg doping is illustrated in fourth image 1000D in FIG. 10 whilst the complete Raman spectrum is shown in FIG. 14. For nanowires with the lowest Mg doping levels (sample A, $T_{Mg}$=200° C. and sample B $T_{Mg}$=230° C.), a narrow peak at ~741 $cm^{-1}$ is present, which is attributed to the coupling between the longitudinal optical phonon-plasmon coupled (LOPC) modes. The appearance of the LOPC mode is associated with the weakly n-type surfaces for GaN nanowires at relatively low Mg doping (samples A and B), marked as Regime I in third image 1000C in FIG. 10, which can be gradually compensated with further increase in Mg doping/free hole concentration within nanowires. Accordingly, with increasing the Mg doping level, for example sample C ($T_{Mg}$=250° C.), the LOPC mode gradually shifts to a lower frequency, and also its intensity becomes stronger due to the reduced coupling effect between the LO phonon and electron plasmon.

With further increment of the Mg doping level in sample D ($T_{Mg}$=265° C.), the frequency of the LOPC mode shifts to ~733 $cm^{-1}$ (the original frequency of the pure uncoupled $A_1$(LO) mode). It indicates that the coupling between the LO phonon and electron plasma is completely suppressed in more heavily doped GaN nanowires, which is consistent with the measured surface-type (weakly p-type, Regime II shown in third image 1000C in FIG. 10). The presence of p-type surfaces, evidenced by both the ARXPS and the pure uncoupled $A_1$(LO) mode, is also well correlated with the appearance of an extra mode at ~655 $cm^{-1}$ in sample C ($T_{Mg}$=250° C.). Such a foreign Raman mode is attributed to the local vibrational modes (LVM) related to Mg impurity (Mg—N bond). Its intensity is directly proportional to the free hole concentration, see FIG. 15, and becomes stronger with further increment of Mg doping level in samples D ($T_{Mg}$=265° C.) and E ($T_{Mg}$=280° C.).

2B.4 $H_2$ and $O_2$ Half Reactions

The tunable surface Fermi-level and the engineered surface charge properties are essential to achieve controlled redox reactions. To demonstrate this, $H_2$ and $O_2$ half reactions in the presence of respective sacrificial reagents were first performed using both n-(Si-doped) and p-type GaN nanowire arrays.

The photocatalytic reaction was performed in a Pyrex chamber with a quartz lid and employed a 300 W xenon lamp as an outer irradiation source. Distilled water (pH~7.0) was used for the pure water splitting reaction. The $H_2$ half reaction was performed in the presence of $CH_3OH$ (20 vol. %) as electron donor and Rh nanoparticles as co-catalyst. For $O_2$ half reaction, $AgNO_3$ (0.1 M) was used as electron acceptor. The water was purged with argon for 30 minutes before each experiment after which the chamber was evacuated. The gases produced from the reaction were sampled using a vacuum tight syringe. A gas chromatograph equipped with thermal conductivity detector (TCD) and high purity argon (Ar) carrier gas was used to analyze the reaction evolved gases. The experimental error in the evolution of $H_2$ and $O_2$ is estimated to be ~10%, which is ascribed to the manual sampling of the gases.

Referring to fifth image 1000E in FIG. 10 there is depicted graphically the evolution of $H_2$ from the n-type and p-type (sample B, $T_{Mg}$=230° C.) GaN nanowire arrays in the presence of $CH_3OH$ and Rh co-catalyst. The $H_2$ generation rate of p-type GaN nanowire is significantly higher than conventional n-type GaN nanowires, due to the downward band bending at the surface of p-type GaN, see third image 900C in FIG. 9 and third image 1000C in FIG. 10—Regime II). In contrast, as shown in sixth image 1000F in FIG. 10, the activity for $O_2$ generation is significantly enhanced on n-type GaN nanowires with an upward surface band bending, see first image 900A in FIG. 9 and third image 1000C in FIG. 10—Regime I). For overall water splitting and stoichiometric evolution of $H_2$ and $O_2$, however, both oxidation and reduction reaction need to proceed simultaneously. The presence of any upward or downward band bending will create additional uphill barriers for one of these two reactions and therefore severely limit overall water splitting efficiency. Since the downward band bending reduces with Mg concentration in the p-type surface regime, third image 1000C in FIG. 10—Regime II, efficient carrier transport and therefore high photocatalytic activity is expected for optimized p-doping levels.

2B.6 $Rh/Cr_2O_3$ Co-Catalyst.

To further enhance the charge carrier extraction and provide more active sites for gas generation, $Rh/Cr_2O_3$ co-catalyst nanoparticles were deposited on all the samples (A-F) using photodeposition process from liquid precursors, see supra for process. Referring to FIG. 16 there are depicted first to third images 1600A to 1600C respectively wherein first image 1600A depicts a low resolution STEM-secondary electron (SE) image and second image 1600B a STEM-high angle annular dark field (HAADF) image of the $Rh/Cr_2O_3$ nanoparticle decorated GaN nanowire. These images reveal that the $Rh/Cr_2O_3$ nanoparticles are successfully deposited in the form of core-shell nanostructures on GaN nanowire surfaces. Additionally, the Rh core and GaN nanowire show single crystalline structure. The presence of metallic Rh and mixed $Rh/Cr_2O_3$ nanoparticles was further confirmed by ARXPS as depicted in FIG. 17 in first and second images 1700A and 1700B representing the high resolution XPS spectrum of the Rh[3d] and Cr[2p] core level electrons after photodeposition. Two spin-doublets were clearly resolved from Rh[3d] peak after deconvolution using Lorentzian-Gaussian mixing functions (L/G=30%). The Rh[3d 5/2] peaks observed at 307.0 eV and 309.68 eV are attributed to metallic rhodium $Rh^0$ and mixed Rh—Cr oxide, respectively. The areas of the two deconvoluted XPS peaks in first image 1700A correspond to 41.23% and 58.77% of the photodeposited Rh particles are in metallic ($Rh^0$) and mixed Rh—Cr oxide form, respectively. The deconvolution of Cr[2p] peak reveals one spin-doublet as shown in second image 1700B. The Cr[2p3/2] peak appearing at 576.83 eV is ascribed to the presence of $Cr_2O_3$, indicating the fact that the valence state of Cr in the co-catalyst is trivalent after photodeposition. The surface compositions of Rh and $Cr_2O_3$ were estimated to be 2.45 At. % and 4.34 At. %, respectively, from the areas of the corresponding XPS peaks after Shirley background subtraction.

Figure 18:
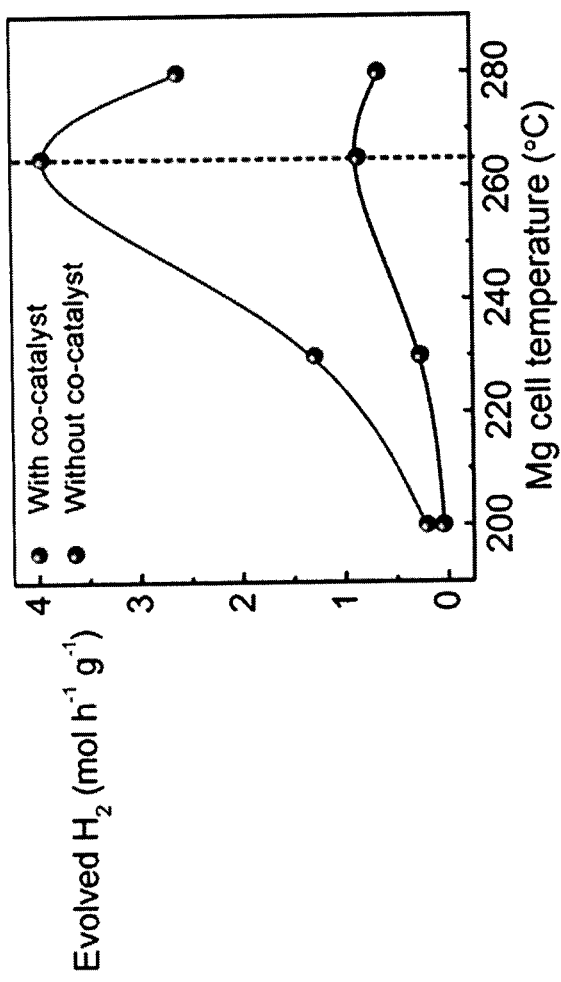
FIG. 18 depicts $H_2$ evolution rates with and without co-catalyst in overall water splitting using GaN:Mg nanowires and $Rh/C_2O_3$ catalytic nanoparticles according to embodiments of the invention.

The Rh core facilitates carrier migration to the nanowire surface and reduces the activation energy required for gas evolution. The $Cr_2O_3$ shell suppresses the back reaction to form $H_2O$ from $H_2$ and $O_2$ on the Rh core. The role of co-catalyst in enhancing the photocatalytic activity was further elucidated by control-experiments. Accordingly, overall water splitting reaction was performed with and without the use of co-catalyst. As depicted in FIG. 18, the photocatalytic activity of GaN:Mg nanowires without co-catalyst follows the same trend as that with co-catalyst. The activity of GaN:Mg nanowires without co-catalyst is ~4-5 times lower than that of the respective samples with co-catalyst at different doping levels, indicting the significant influence of $Rh/C_2O_3$ co-catalyst nanoparticles in charge carrier extraction and in enhancing the redox reactions. Note that the co-catalyst enhanced the activity at all doping levels. This reveals the fact that the change in band bending at the surfaces of GaN nanowires does not influence the catalytic activity of the supported metal particles (Rh). This is in contrast with the previously reported strong influence of support-material (oxides) on the photocatalytic activity of nanoparticles. The photocatalytic activity of sample D ($T_{Mg}$=265° C.) was further tested with and without co-catalyst using a 385 nm long pass filter. The $H_2$ evolution rate was ~102 μmol·hr$^{-1}$ and ~39 μmol·hr$^{-1}$ with and without co-catalyst, respectively using the 385 nm long pass filter. Further detailed analysis also indicates that the Mg doped sample can split water up to ~420 nm-430 nm wavelength. This small-scale activity observed below the band gap of GaN is likely to be related to light absorption associated with the acceptor to conduction band transition. This result further confirms the formation of acceptor level in GaN due to Mg doping. However, the activity is very low, compared to that (~1525 μmol·hr$^{-1}$) measured under full arc Xenon lamp for sample D and hence was not included in the efficiency calculation to derive the internal quantum efficiency (IQE) for the photocatalytic overall water splitting.

As with the preceding analysis for IQE, the number of incident photons in the wavelength range of 200 nm≤λ≤365 nm was estimated from the lamp spectrum, which represents the overlapped wavelength between the absorption spectrum of GaN nanowires and the power spectrum of the lamp. The absorbed photons were estimated based on the GaN nanowire height of 600 nm, the absorption coefficient of GaN in the wavelength of 200 nm≤λ≤365 nm, and nanowire fill factor on the silicon substrate. The fill factor was estimated from the top view SEM images of the GaN nanowire arrays for all the samples A, B, C, D, E and F as 27%, 30%, 35%, 39%, 40% and 41%, respectively. The absorbed power by the GaN nanowires in mW is expressed as Equation (7) where $A_{sample}$ is the sample area ($A_{sample}$~2.8 cm$^2$) and $β_{ff}$ is the nanowire fill factor. $ρ_{incident}$ (λ) is the incident power intensity on the sample, $T_{W/G}(λ)$ is the transmittance at the water-GaN interface, and $γ_{abs}$ (λ)=1−e$^{-α(λ)z}$ the wavelength dependent absorption (%) of the GaN nanowire.

$$P_{incident}(λ) = ρ_{incident}(λ) \times T_{W/G}(λ) \times γ_{abs}(λ) \times A_{sample} \times β_{ff} \quad (7)$$

Based upon Equation (7), an incident power density was estimated to be 677 mW·cm$^{-2}$ in the wavelength range of 200 nm≤λ≤365 nm then the total absorbed power by the GaN nanowire was estimated to be 652.7 mW. Accordingly, using Equations (2) and (3) but now for absorbed photons and with the new wavelength limits of 200 nm≤λ≤365 nm the estimated number of photons was $N_{ph}$(200 nm≤λ≤365 nm)=1×10$^{18}$ s$^{-1}$. Accordingly, the IQE is then derived from Equations (8) and (9) where $N_A$ is Avogadro's number, and $1_{H_2}$ is the evolved $H_2$ (μmol·h$^{-1}$) from overall water splitting reaction. For the estimation of apparent quantum efficiency (AQE), we considered all the incident photons in the wavelength range of 200 nm≤λ≤365 nm that can be absorbed by the GaN nanowire photocatalyst (i.e., no reflection at the water-GaN), absorption co-efficient α(λ)=1 and nanowire fill factor $β_{ff}$=100%. The estimated $N_{ph}$ (200 nm≤λ≤365 nm)=2.91×10$^{18}$ s$^{-1}$.

$$IQE = 2 \times \frac{\text{Number of Evolved } H_2 (\text{molecules} \cdot hr^{-1})}{\text{Number of Absorbed Photons } (hr^{-1})} \times 100\% \quad (8)$$

$$IQE = 2 \times \frac{I_{H_2} \times 10^{-6} \times N_A}{N_{Ph}(200-365) \times 3600} \times 100\% \quad (9)$$

Third image 1600C in FIG. 16 depicts a schematic of the core/shell $Rh/Cr_2O_3$ nanoparticle deposited GaN nanowire for overall water splitting, illustrating the reaction mechanism on the nonpolar surfaces of GaN nanowires.

2B.7 Overall Pure Water Splitting

The $Rh/Cr_2O_3$ nanoparticle decorated GaN nanowires with different Mg doping levels were subsequently used for overall pure (pH~7.0) water splitting under 300 W full arc Xenon lamp irradiation. Referring to first image 1900A in FIG. 19 there are depicted the $H_2$ evolution rates for different GaN:Mg nanowire samples, which were derived from performing overall water splitting reactions on each sample for 6 hours. It is seen that the $H_2$ evolution rate first shows a dramatic increase with Mg cell temperature. Under relatively low doping levels (samples A and B), the photocatalytic activity is low, which is directly correlated to the very large downward surface band bending, fourth image 900D in FIG. 9, due to the weakly n-type surface-nature as revealed from ARXPS and micro-Raman analysis (third image 1000C—Regime I, and fourth image 1000D). Dramatically enhanced overall water splitting performance was measured for sample D ($T_{Mg}$=265° C.), and the $H_2$ evolution rate was nearly 4 mol·hr$^{-1}$·g$^{-1}$, which is more than two orders of magnitude higher than nominally undoped GaN nanowires. This substantial improvement can be explained by the p-type surfaces with significantly reduced downward band bending (third image 1000C—Regime II, and fourth image 1000D), which may become relatively flat in aqueous solution, thereby enabling balanced and much more efficient redox reactions. For samples E ($T_{Mg}$=280° C.) and F ($T_{Mg}$=300° C.), however, the activity shows a decreasing trend with increase in Mg cell temperature, which is likely to be related to the degradation of GaN nanowire crystalline quality at very high Mg-doping level.

At very high doping level ($T_{Mg}$=280° C. and $T_{Mg}$=300° C.), the free hole concentration becomes saturated in GaN and therefore further increment in the hole concentration may not be achieved. This is evident from fourth image 1000D in FIG. 10, where no further increment of the LVM intensity is observed for sample E ($T_{Mg}$=280° C.), compared to sample D ($T_{Mg}$=265° C.), Within the prior art similar doping behavior of Mg acceptors in GaN (0001) thin films has been reported. Although the band bending reduces further for sample E ($T_{Mg}$=280° C.), the GaN material quality degrades. The degradation in the crystal quality of the nanowires is confirmed from the increment of full-width-at-half-maximum (FWHM) of the $E_2$ peak in Raman spectra, not presented within the specification. Additionally, at high Mg concentration, nitrogen vacancy ($V_N$) related defects increase and compensate Mg doping. At high Mg concentration, Mg can also act as donor-like compensation centers. These defects work as n-type dopants and hence p-type dopants get compensated. In addition, the $H_2$ evolution rate depends on the surface band structure when the nanowire surface is in equilibrium with water, which may become less optimum for sample E with further reduced band bending. These factors contribute to the reduction in photocatalytic activity for samples E and F as shown in first image 1900A in FIG. 19.

For optimum Mg-doping concentration, sample D with $T_{Mg}=265°$ C., the apparent quantum efficiency (AQE) can reach ~18%. The internal quantum efficiency (IQE), shown in first image 1900A in FIG. 19, is also derived for different Mg doped samples under 200 nm≤λ≤365 nm and can reach ~51% for GaN nanowires with optimum surface band bending, sample D with $T_{Mg}=265°$ C., which is the highest value reported for spontaneous overall water splitting under any broadband light irradiation known to the inventors.

2C. Discussion

Figure 20:
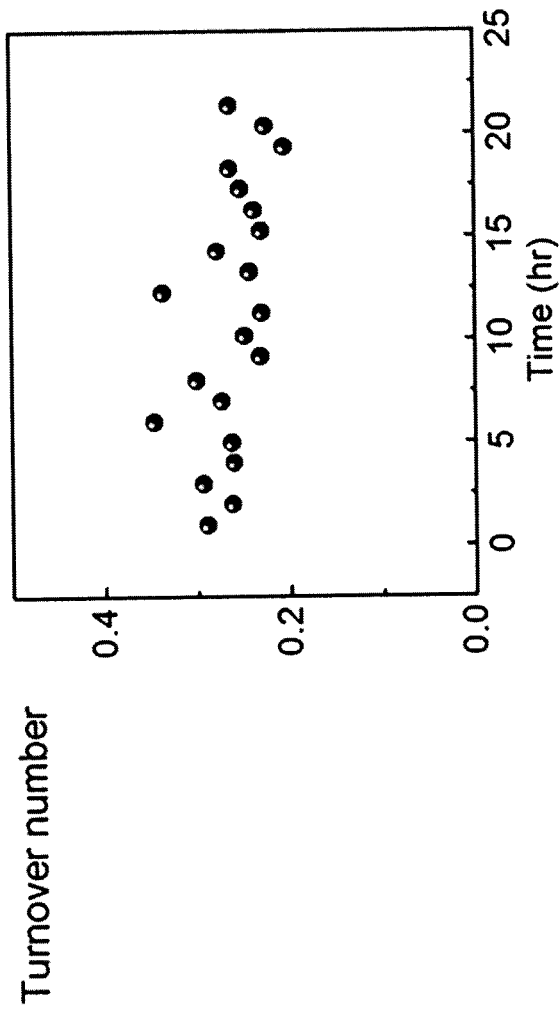
FIG. 20 depicts the turn over number in terms of the ratio of the rate of $H_2$ molecules produced to the rate of absorbed photons as a function of time for GaN:Mg nanowires according to embodiments of the invention.

To demonstrate the stability of the GaN photocatalyst, repeated experiments were performed using the same sample. Second image 1900B in FIG. 19 depicts the evolution of $H_2$ and $O_2$ as a function of irradiation time for the optimized GaN:Mg (sample D) in pure water. No sacrificial reagents were added in the reaction. The rates of $H_2$ and $O_2$ evolution were ~1525 µmol·h$^{-1}$ and ~763 µmol·h$^{-1}$, respectively. The $H_2/O_2$ ratio is essentially 2:1, indicating a balanced redox reaction of water on the nanowire photocatalyst. Visible bubbles were clearly observed from the sample surface upon irradiation. The turnover number, defined as the ratio of the total amount of gas evolved (50,428 µmol) to GaN catalyst (4.62 µmol), exceeds 10,900 during the course of approximately 22 hours of reaction. Repeated experiments on the same sample did not show any degradation of the photocatalytic activity, demonstrating excellent stability of the Mg-doped GaN nanowires. The turn over number in terms of the ratio of the rate of $H_2$ molecules formed to the rate of absorbed photons is also plotted as a function of time in FIG. 20, further confirming excellent stability of the nanowire photocatalyst. The slight variations in $H_2$ and $O_2$ evolution observed for different cycles is attributed by the inventors to the variations in alignment between the light source and the sample surface.

Figure 19:
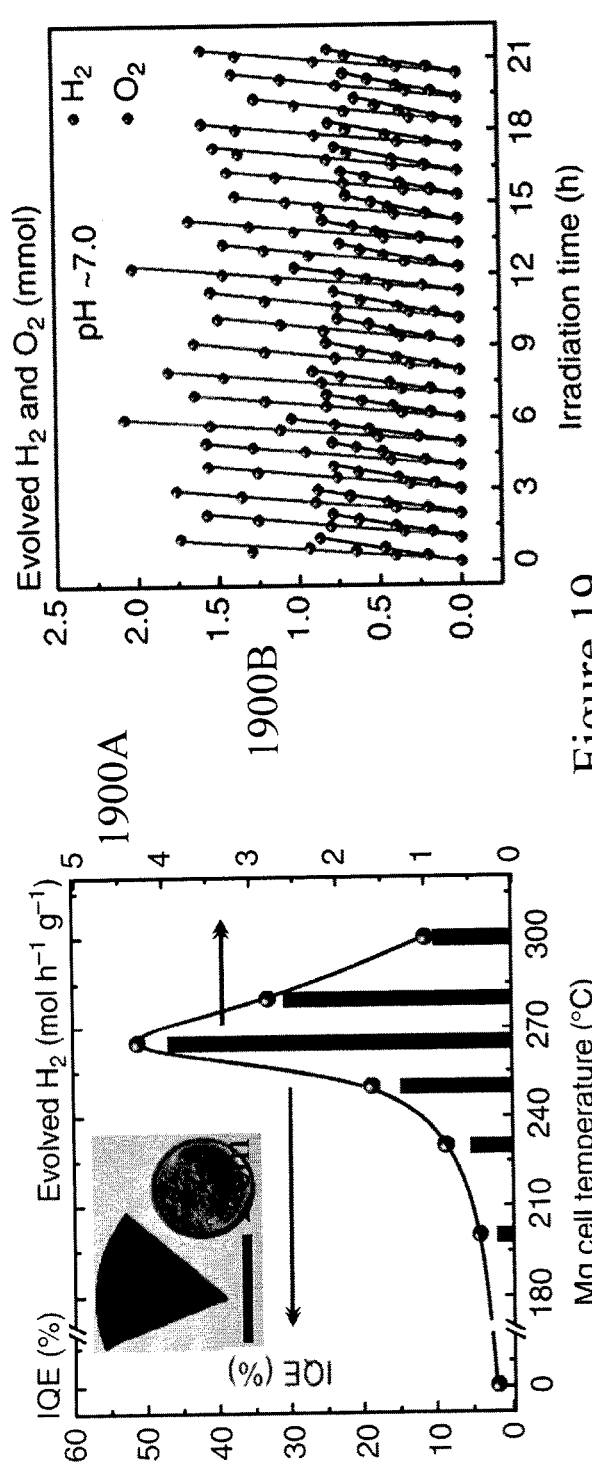
FIG. 19 depicts overall water splitting and the stability of GaN:Mg nanowires according to embodiments of the invention.
Figure 19:
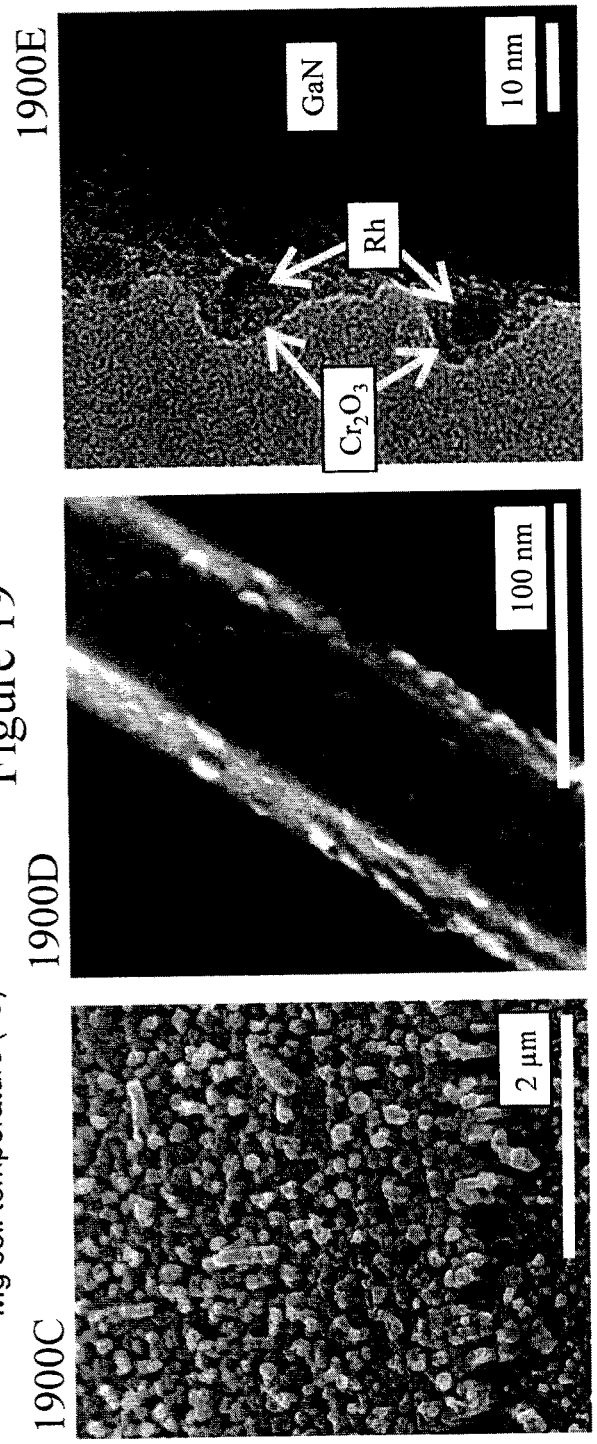

Third image 1900C in FIG. 19 depicts a SEM image of the nanowire arrays (sample D) after overall water splitting for ~22 hours. The nanowires remain stable during the course of the reaction. A higher magnification STEM-SE image of a single nanowire, shown in fourth image 1900D in FIG. 19, further confirms that the co-catalyst nanoparticle-decorated GaN nanowire were not etched during the course of reaction, which can be partially attributed to the surface free holes of Mg-doped GaN that can prevent the catalyst from photocorrosion caused by oxidation. The core-shell Rh/Cr$_2$O$_3$ nanoparticles are also stable in photocatalytic environment, shown in the bright-field TEM image in fifth image 1900E in FIG. 19.

3. Violet Light Water Splitting

3A. Fabrication and Characterisation

Figure 21:
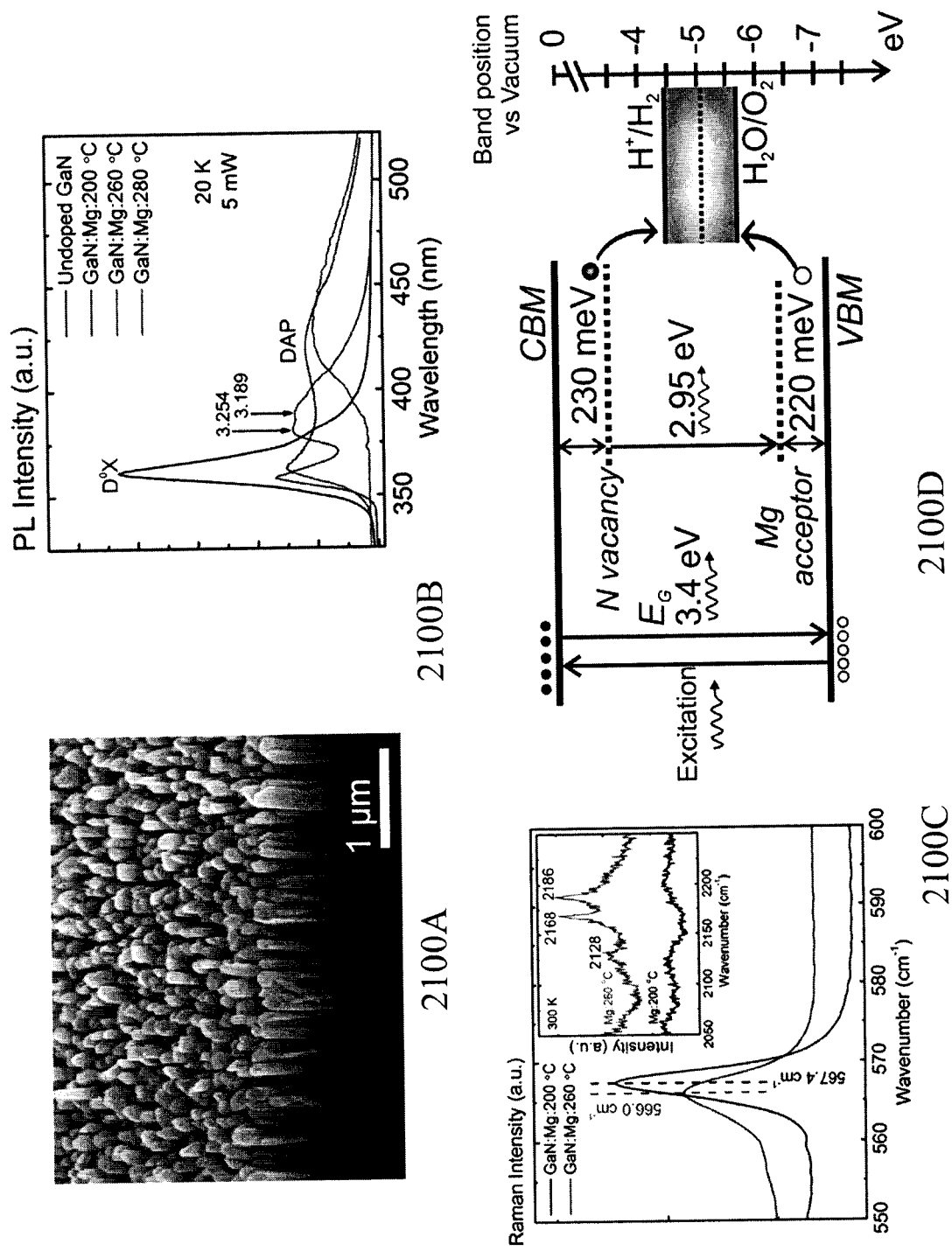
FIG. 21 depicts 45° tilted SEM images of GaN:Mg nanowires according to embodiments of the invention together with low temperature photoluminescence, Raman spectra and energy band diagram.

Catalyst-free GaN nanowires were grown on Si (111) substrates using radio frequency plasma-assisted molecular beam epitaxy (PAMBE) under nitrogen-rich conditions. First image 2100A in FIG. 21 depicts a 45° tilted scanning electron microscopy (SEM) image of as-grown Mg doped ($T_{Mg}=260°$ C.) GaN (denoted as GaN:Mg:260° C. hereafter) nanowire arrays. The nanowires are vertically aligned to the substrate, with an average height of ~600 nm and diameter of ~50-100 nm. The GaN nanowires are oriented along the c-axis with their sidewalls being nonpolar surfaces. These nonpolar surfaces are energetically stable with unreconstructed and relaxed surface geometries. The Mg dopant was introduced in situ by controlling the Mg effusion cell temperature ($T_{Mg}$) from 190° C. to 315° C., which corresponds to Mg beam-equivalent pressure (BEP) of ~1×10$^{11}$ Torr to ~1.5×10$^{-8}$ Torr. Secondary electron mass spectroscopy (SIMS) reveals Mg concentration of ~1.3×10$^{20}$ cm$^{-3}$ from Mg doped ($T_{Mg}=250°$ C.) GaN epilayer grown under similar conditions.

To reveal the optical properties of GaN:Mg nanowires, a λ=266 nm diode-pumped solid state Q-switched laser was utilized by the inventors as the excitation source. First graph 2100B in FIG. 21 depicts the low temperature (20K) PL spectra of as-grown GaN:Mg nanowires compared to an unintentional doped GaN nanowire sample. The unintentional doped GaN PL is dominated by a single peak at ~3.435 eV, corresponding to donor-bound exciton (D$^0$X). For the lightly Mg doped ($T_{Mg}=200°$ C.) sample, in addition to the D$^0$X emission, two additional peaks are clearly resolved at 3.254 eV and 3.189 eV. The 3.254 eV emission is attributed to the conduction band to Mg-related acceptor level (e-A) transition. With a bandgap of 3.478 eV for GaN at low temperature, a Mg-related acceptor level of ~220 meV is derived, which is very close to results within the prior art. The 3.189 eV line is most likely due to Mg related defects in GaN, which form complexes with Mg acceptor levels.

With further increase in Mg flux ($T_{Mg}=260°$ C.), a new broad emission peak centered at ~2.95 eV is clearly revealed. This peak is attributed to the donor-acceptor-pair (DAP) transition between the $V_N$ related deep donor states and shallow Mg acceptor states. The Mg-related acceptor level is located at ~220 meV above the valence band. On the other hand, the activation energy of $V_N$ is reported within the prior art to be within the range 160 meV-250 meV. As predicted by Van de Walle, the formation energy of 3+ charge state of $V_N$, decreases with $E_F-E_V$. This suggests that $V_N$ related donor type native defects are most likely present in GaN at high Mg doping level, and act as compensating centers in p-type GaN. Despite the nitrogen-rich growth conditions, the $V_N$ related defects can be formed along the growth direction due to higher diffusion lengths of Ga compared to N adatoms on the nonpolar surfaces which forms the nanowire sidewalls.

Additionally, the presence of Mg may limit the availability of active nitrogen on the nanowire sidewalls. The presence of $V_N$ in heavily Mg doped GaN nanowire is indeed revealed from micro-Raman analysis. As shown in the inset of second graph 2100C in FIG. 21, micro-Raman measurement clearly shows three distinct modes in the high energy region at 2128 cm$^{-1}$, 2168 cm$^{-1}$, and 2186 cm$^{-1}$ from GaN nanowire sample with $T_{Mg}=260°$ C. These spectroscopic features can be attributed to the Mg-induced local vibrational modes (LVMs) associated with $V_N$. For comparison, no Raman modes are observed from the low Mg doped ($T_{Mg}=200°$ C.) GaN nanowires. Furthermore, as shown in second graph 2100C in FIG. 21 the E$_2$ Raman line at 567.4 cm$^{-1}$ for GaN:Mg:200° C. sample is very close to that (567.1 cm$^{-1}$) of undoped GaN nanowires reported within the prior art. The decrease in E2 peak to 566 cm$^{-1}$ for GaN:Mg:260° C. reveals the increased tensile strain in GaN nanowires at higher Mg doping levels. This increased tensile strain is further identified as a fingerprint of the formation of $V_N$ in GaN:Mg nanowires. The degradation in the crystal quality of the GaN:Mg nanowires is also confirmed from the increment of full-width-at-half-maximum (FWHM) of the E2 Raman line. At very high Mg flux ($T_{Mg}=280°$ C.), the DAP emission (second image 2100B in FIG. 21) red-shifts with progressive disappearance of the band-edge emission.

This is attributed to the emergence of high densities of deep energy states and the deterioration of crystalline quality caused by the incorporation of high densities of Mg, consistent with the luminescence studies of MBE and metal organic chemical vapor deposition (MOCVD) grown GaN films. Based on the above analysis, a schematic energy level diagram is shown in fourth image 2100D in FIG. 21, along with the redox potential of water (vs. vacuum level). The Mg-related acceptor level is located at ~220 meV above the valence band, and the $V_N$ level is located at ~230 meV below the conduction band. Therefore, the intra-gap defect related energy states straddle the redox potential of water with ~0.7 eV and ~1.00 eV over potential for water oxidation and reduction, respectively. Such over potentials of the defect related energy states are expected to be sufficient for driving the redox reaction of water.

3B. Photocatalytic Activity

Figure 22:
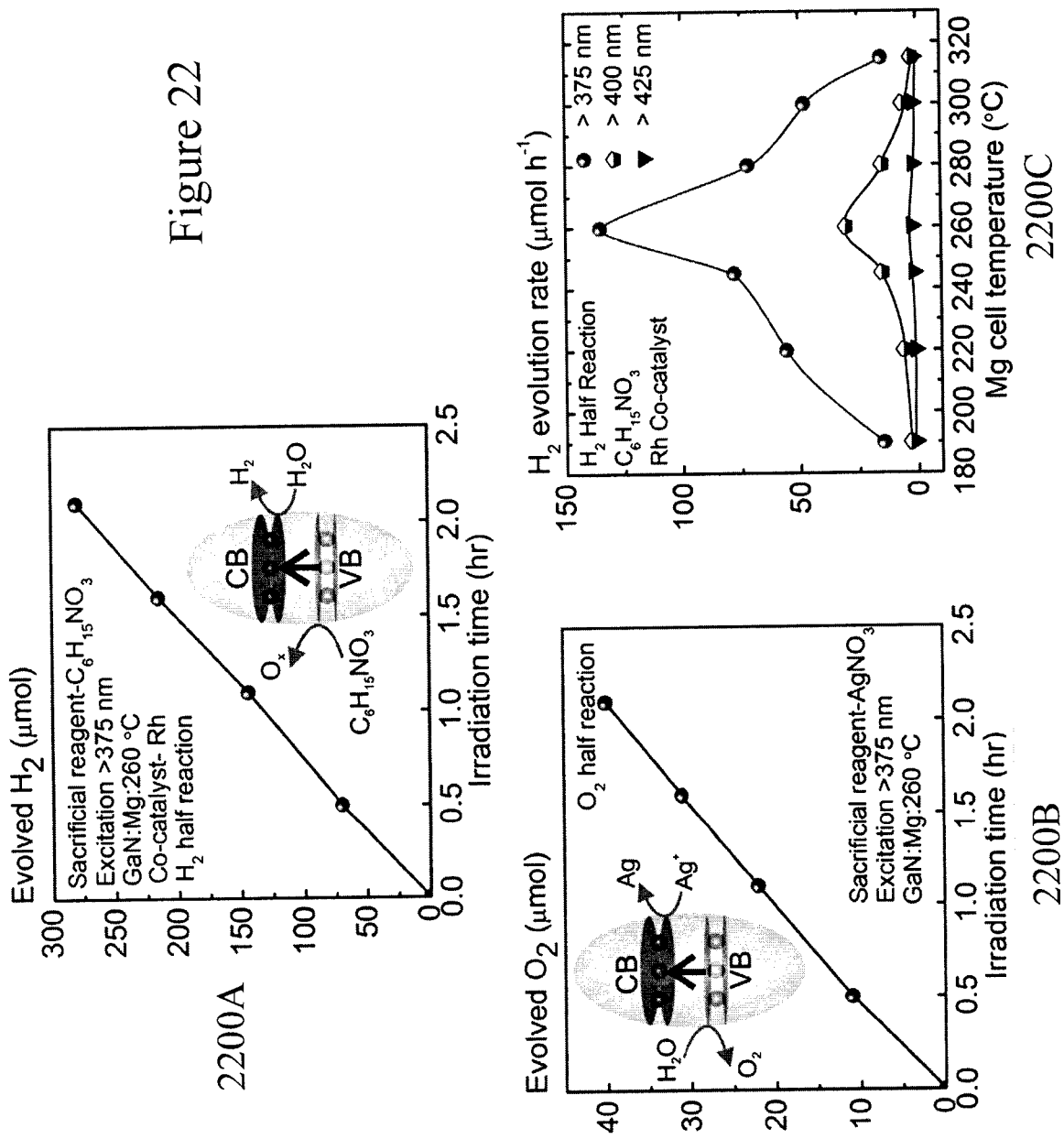
FIG. 22 depicts hydrogen and oxygen evolution of GaN:Mg nanowires according to embodiments of the invention together with hydrogen evolution as a function of intra-gap excitation.

In order to test the photocatalytic activity of the GaN:Mg nanowire photocatalyst through intra-gap photon absorption, $H_2$ and $O_2$ half-reactions were individually performed in the presence of respective sacrificial reagents using different long-pass filters under a 300 W Xenon lamp. An approximately 3 $cm^2$ wafer sample is used which corresponds to 0.42 mg GaN material considering the fill factor of the nanowires on the silicon substrate. Triethanolamine ($C_6H_{15}NO_3$) hole scavenger and Rh co-catalyst were used to conduct $H_2$ half reaction. In the case of $O_2$ half reaction, 0.1M $AgNO_3$ is used as electron acceptor. First and second graphs 2200A and 2200B in FIG. 22 depict the evolution of $H_2$ and $O_2$, from respective half reactions with intra-gap excitation λ>375 nm for the GaN:Mg ($T_{Mg}$=260° C.) sample. The evolution of $H_2$ and $O_2$ reveals that the intra-gap states satisfy the thermodynamic and kinetic potentials for water photolysis. This allows balanced carrier extraction from the nanowire photocatalyst for efficient and stable overall water splitting. The photocatalytic activity of all the GaN:Mg nanowires was further tested in the presence of $C_6H_{15}NO_3$ hole scavenger and Rh co-catalyst, as shown in third graph 2200C in FIG. 22. The photocatalytic activity increased with $T_{Mg}$ up to $T_{Mg}$=260° C., after which the activity decreased. This enhancement in activity is partly attributed to the enhanced photon absorption with increase in Mg doping concentration due to the increased incorporation of donor and acceptors energy states. Additionally, due to the reduced downward band bending with increase in Mg doping, as demonstrated by the inventors, the oxidation of $C_6H_{15}NO_3$ is enhanced, which can supply more protons for improved $H_2$ activity. The $H_2$ evolution rates are ~130, ~30, and ~2 µmol/h with excitation >375, >400, and >425 nm, respectively, for the GaN:Mg:260° C. sample. No activity is observed with excitation >450 nm for all the samples. This further confirms that the Si substrate does not take part in overall water splitting reaction.

Figure 23:
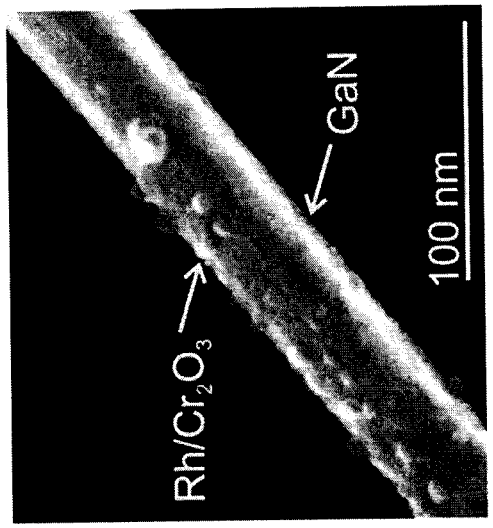
FIG. 23 depicts high resolution SE-STEM image of catalytic nanoparticles upon a GaN:Mg nanowire according to embodiments of the invention together with experimental results for hydrogen evolution and repeated cycles of overall neutral water splitting.
Figure 23:
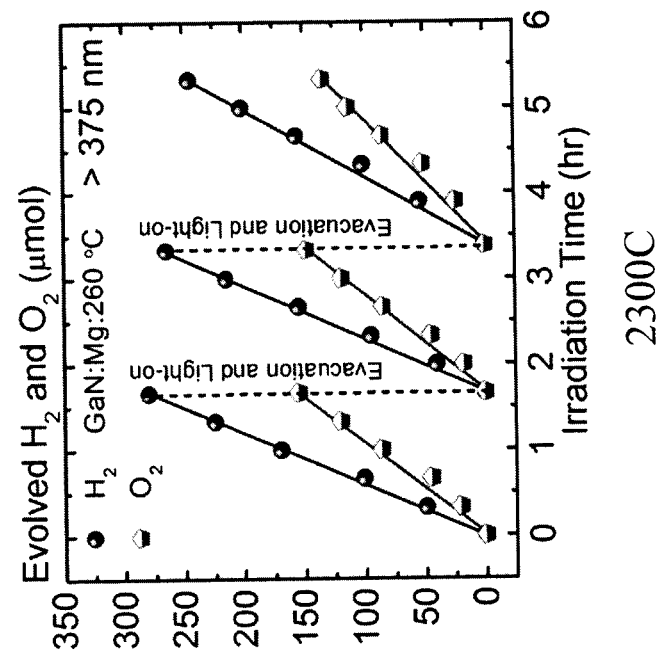
Figure 23:
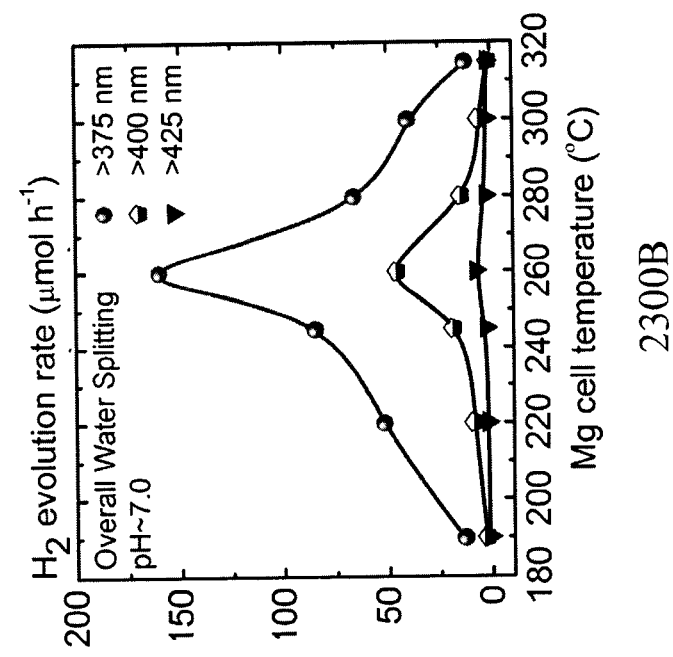

The GaN:Mg nanowire samples were subsequently tested for overall neutral water splitting. For efficient separation and extraction of the photogenerated carriers, $Rh/Cr_2O_3$ core/shell co-catalyst nanoparticles were photodeposited on the GaN:Mg nanowires from liquid precursor. Image 2300A in FIG. 23 depicts the secondary electron scanning transmission electron microscopy (SE-STEM) image of a single GaN:Mg:260° C. nanowire after co-catalyst deposition. Successful deposition of $Rh/C_2O_3$ nanoparticles is clearly observed. Second graph 2300B in FIG. 23 shows the $H_2$ evolution rate in overall neutral water splitting for GaN:Mg samples with different intra-gap excitation. The rate of $H_2$ evolution is estimated from 4 hours of overall water splitting under 300 W Xenon lamp irradiation. The undoped GaN nanowire does not show any activity with intra-gap excitation. On the other hand, the activity of GaN:Mg samples increased with $T_{Mg}$ up to 260° C., after which the activity decreased, following the same trend as the $H_2$ half reaction (see third graph 2300C in FIG. 22). The $H_2$ evolution rates are ~160, ~45, and ~5 µmol/h with excitation >375, >400, and >425 nm, respectively, for the GaN:Mg:260° C. sample. The photocatalytic activity decreased with further increase in wavelength, limited by the intra-gap optical absorption of the nanowire catalyst. Significant activity was observed for excitation up to 450 nm, which is consistent with the intra-gap broad emission spectrum of GaN:Mg nanowires, as shown in second graph 2100B in FIG. 21.

Referring to third graph 2300C in FIG. 23 there is depicted the results of repeated cycles of overall neutral water splitting for GaN:Mg:260° C. sample without the presence of any sacrificial reagents. The $H_2$ and $O_2$ evolution in nearly 2:1 ratio confirms stoichiometric evolution of $H_2$ and $O_2$ from overall water splitting. The repeated cycles further confirm the stability of the intra-gap states of GaN:Mg nanowire photocatalyst. Upon intra-gap excitation, electrons and holes are generated in the intra-gap states. In a semiconductor with high concentration of defect states, carrier hopping conduction via the defect band/states becomes an important process for electrons and holes to transport towards the semiconductor-liquid interface. This can occur either via the formation of extended states by the overlapping of defect states or by hopping between localized defect states. Such hopping conduction or impurity band conduction has been observed previously for Mg doped GaN, AlGaN, and other materials.

As the lateral dimension (50-100 nm) of the GaN:Mg nanowires is much smaller than the diffusion lengths (200-300 nm) of the photoexcited charge carriers, carrier transport through the impurity band, formed by either Mg dopants or nitrogen vacancies, can lead to efficient charge carrier transfer towards the nanowire/water reaction interface. The enhanced activity of the GaN:Mg:260° C. sample is attributed to enhanced intra-gap absorption as well as significantly reduced downward band bending at the nanowire surface. The decreasing trend of the photocatalytic activity at very high Mg-flux ($T_{Mg}$=280° C. and above) is attributed to the degradation of crystalline quality of the GaN nanowires; resulting in non-radiative recombination of the photogenerated carriers. Additionally, the reduced activity at very high Mg-flux ($T_{Mg}$=280° C. and above) may be partly related to self-compensation effect by the nitrogen vacancies, as observed in the previous studies.

The absorbed photon conversion efficiency of GaN:Mg:260° C. nanowire sample is estimated to be 43%, 44%, and 35% for excitation >375, >400, and >425 nm, respectively, considering the absorption coefficient of GaN:Mg nanowires and the nanowire fill factor on Si substrate. The respective energy conversion efficiency is estimated to be 1.34%, 0.56%, and 0.12%, considering the energy of all the incident photons with wavelengths between 375-450 nm, 400-450 nm, and 425-450 nm, respectively. The turnover number in terms of the amount of gas ($H_2$ and $O_2$) evolved per hour to the amount of photocatalyst exceeds 570 mmolh$^{-1}$ g$^{-1}$, 160 mmolh$^{-1}$ g$^{-1}$, and 17 mmolh$^{-1}$ g$^{-1}$ for excitation >375, >400, and >425 nm, respectively. The stable and overall splitting of pH neutral water may function as an ideal material platform to study the fundamentals of redox reaction kinetics.

In summary, the inventors have engineered the fundamental bandgap of GaN nanowires through controlled Mg dopant incorporation for increasing solar absorption. With very high Mg doping in GaN, intra-gap absorption proceeds through donor-acceptor-pair transition for wavelength up to 450 nm. Stable and efficient overall water splitting is demonstrated with intra-gap excitation up to 450 nm. This defect band engineering can further be used to enhance solar absorption of Mg-doped InGaN towards red or near-infrared wavelength range while maintaining the excellent stability, thermodynamic, and kinetic potentials of metal-nitride required for efficient solar water splitting.

4. Visible Water Splitting

4A. Background

Figure 24:
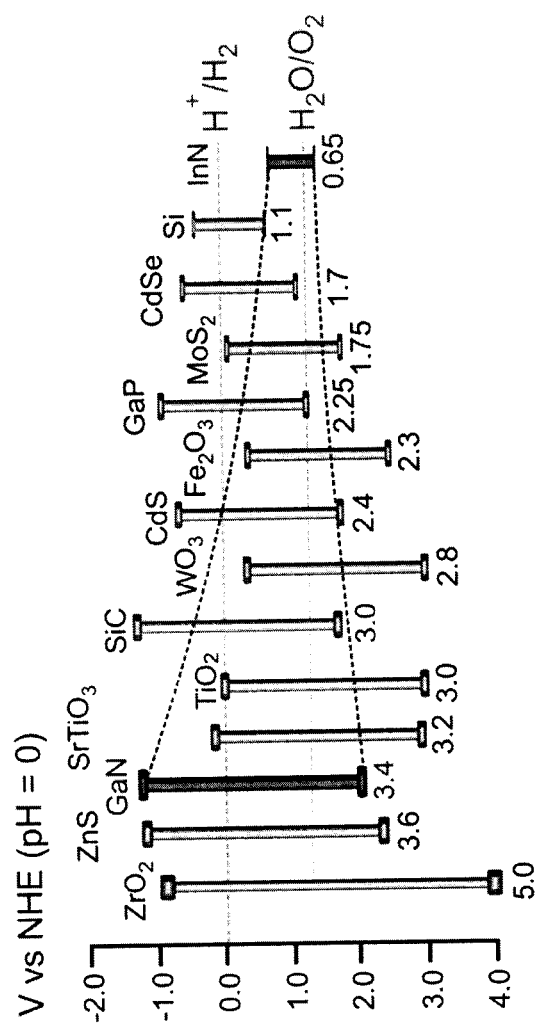
FIG. 24 depicts bandgaps and band edge positions of commonly used photocatalysts with respect to oxidation and reduction potentials of water.

The single absorber, two photon approach of photocatalytic water splitting (well known as S2), is limited by the ideal (Schottky-Queisser) solar energy conversion efficiency (~34%). In practice, it possesses the potential for a maximum feasible efficiency of ~10% considering the reasonable losses. However, the realization of such high efficiency devices has remained extremely difficult due to the lack of suitable photocatalytic materials that possess optimum band-gap, desired conduction and valence band levels, and stability in harsh photocatalytic conditions. To date, metal oxides have been widely explored as a photocatalyst for water-splitting, which, however, offer the limiting efficiency of ~2.3% due to their large band-gaps and lack of significant activity under visible light irradiation (~46% of energy in the solar spectrum). Previously reported visible light responsive photocatalysts often suffer from the propensity of oxidation and lack in stability with very limited efficiency in the visible spectrum. Moreover, the photocatalytic activity of conventionally used powder samples is low due to their inefficient light absorption and carrier separation, low crystalline quality, and small surface-to-volume ratio. Therefore, it is imperative to explore new, visible light driven, stable and efficient photocatalytic systems for practical usage and large scale hydrogen production. Group III-nitride compound semiconductors exhibit a direct energy bandgap encompassing nearly the entire solar spectrum. Apart from being stable in photocatalytic environment, InGaN possesses an additional advantage over other known photocatalysts in that its bandgap can be tuned to straddle the water redox potentials over a large portion of the solar spectrum, namely, ultraviolet, visible, and near-infrared. FIG. 24 shows the band alignments of InGaN alongside other commonly used photocatalyst materials, depicting the band edge potential for water splitting up to ~50% indium incorporation. Additionally, one dimensional nanowire structures are expected to have significantly improved photocatalytic activity due to their high surface-to-volume ratio and much more efficient charge carrier separation. These attributes, therefore, make III-nitride nanowire structures a very promising, yet less explored candidate as a photocatalyst material.

4B. Fabrication

Figure 25:
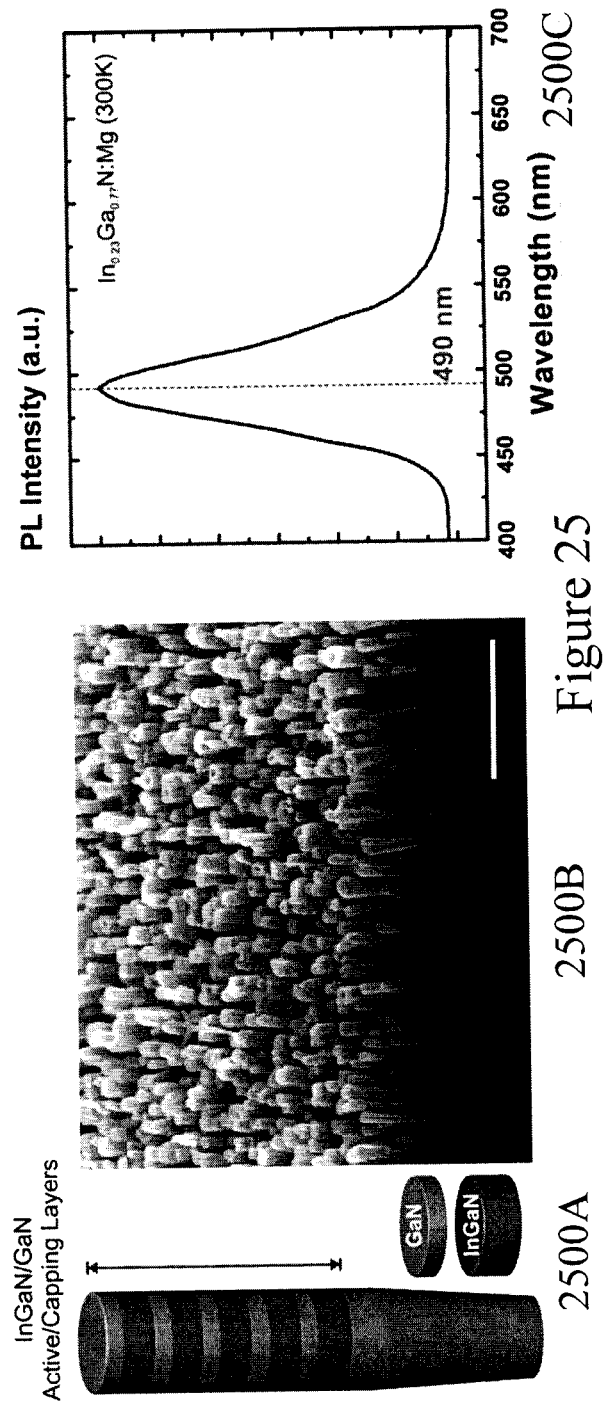
FIG. 25 depicts a schematic of Mg-doped InGaN/GaN nanowire structures according to embodiments of the invention together with SEM image of these grown on Si (111) substrate and resulting room temperature photoluminescence spectrum.

Multi-stack GaN:Mg/InGaN:Mg nanowire photocatalysts were grown on a Si substrate without any external catalyst by plasma-assisted molecular beam epitaxy (PAMBE). Results presented in this work are based on extensive studies on the growth and characterization of Mg doped InGaN nanostructures by the inventors, which include careful optimizations of the III/V flux ratio, doping concentration, growth temperature, and growth duration for achieving high photocatalytic activities. After in situ oxide desorption at 770° C., a thin (~1 ML) Ga seeding layer was deposited to promote the nucleation of nanowires. InGaN nanowire arrays were grown on top of a GaN nanowire template to achieve superior structural and optical properties. As shown in the schematic 2500A in FIG. 25, several segments of InGaN ternary nanowires capped with a thin GaN layer were incorporated in order to minimize the formation of misfit dislocations. Other growth parameters include a nitrogen flow rate of 1.0 standard cubic centimeter per minute (sccm), a forward plasma power of ~350 W, a Ga beam equivalent pressure (BEP) of ~6×10$^{-8}$ Torr, and In BEP of ~8×10$^{-8}$ Torr. The Mg effusion cell temperature ($T_{Mg}$) was varied and optimized to be ~200° C. for InGaN nanowire photocatalysts, which corresponds to a Mg BEP of ~2×10$^{-11}$ Torr. Mg concentrations were measured from secondary ion mass spectroscopy (SIMS) analysis on Mg-doped GaN epilayers. At Mg cell temperatures of 200, 230, and 250° C., the Mg concentrations were estimated to be ~2.8×10$^{18}$ cm$^{-3}$, ~4.1× 10$^{19}$ cm$^{-3}$, and ~1.3×10$^{20}$ cm$^{-3}$, respectively. Shown in image 2500B in FIG. 25, the nanowires are vertically aligned along the growth direction (c-axis) on the Si substrate, with the areal density in the range of ~1.5×10$^{10}$ cm$^{-2}$, average height ~400-600 nm, and lateral dimensions of ~40-80 nm. The photoluminescence (PL) spectrum measured at room-temperature is shown in graph 2500C in FIG. 25C, with a single band-to-band optical emission peak at ~490 nm, corresponding to a bandgap of 2.53 eV and an average of ~23% indium incorporation. The broad emission peak suggests intra- and inter-nanowire indium fluctuations.

4C. Water Splitting

It is important to realize that the conduction band edge of InGaN descends to lower energy faster compared to the valence band edge with increasing In incorporation (bandgap reduction) (FIG. 24). Therefore, the photocatalytic performance for the H$_2$ evolution reaction of In$_{0.23}$Ga$_{0.77}$N/ GaN nanowires was first studied to evaluate if they possess sufficient proton reduction over-potential. The experiments were performed using aqueous methanol (CH$_3$OH) solution. CH$_3$OH, an organic sacrificial reagent and a frequently used electron (e$^-$) donor, reacts in an irreversible manner with the photogenerated valence band holes (h$^+$), enhancing the separation efficiency of photogenerated e$^-$/h$^+$ pairs and hence reducing the surface recombination. In addition, particulate co-catalysts are often incorporated to promote H$_2$ evolution, which also function as charge carrier extraction centers to minimize bulk recombination of photogenerated e$^-$/h$^+$ pairs. In this study, rhodium (Rh), a noble metal with a relatively large work function (~4.98 eV) was loaded on In$_{0.23}$Ga$_{0.77}$N/GaN nanowires as a co-catalyst by photodeposition from the liquid precursor (Na$_3$RhCl$_6$). Subsequently, the H$_2$ evolution reaction using aqueous CH$_3$OH solution was performed under 300 W xenon lamp irradiation with different long-pass filters. The water (H$_2$O) to methanol volume ratio of 5:1 was maintained in order to ensure direct oxidation of methanol rather than the indirect oxidation of interfacially formed *OH radicals.

Figure 26:
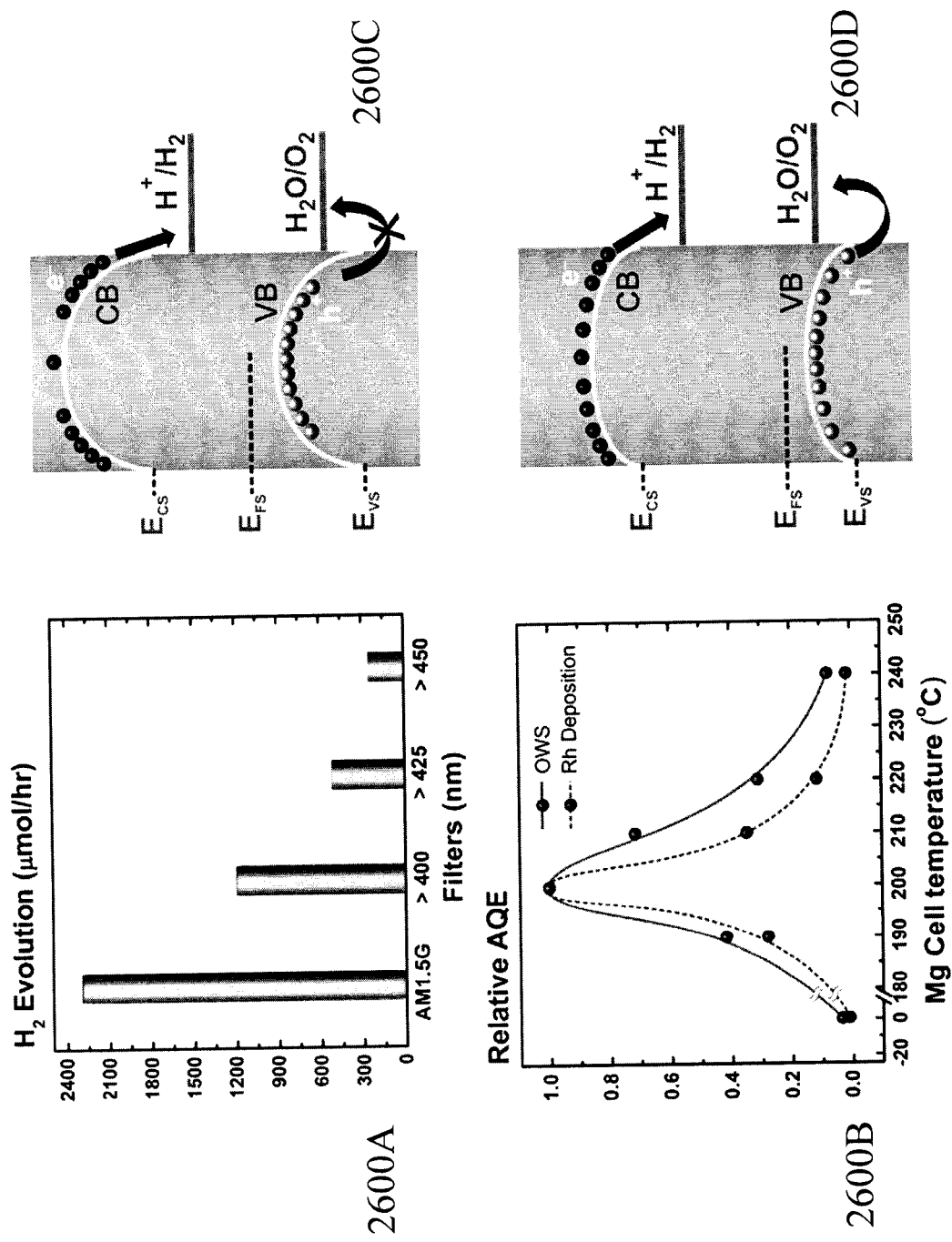
FIG. 26 depicts photocatalytic $H_2$ evolution rate and relative AQE under different filtered illuminations demonstrating operation under visible light (λ>400 nm) for Mg-doped InGaN/GaN nanowire structures according to embodiments of the invention together with schematics of downward band bending without Mg doping and reduction with Mg doping.

A simplistic representation of the reaction mechanism for the irreversible oxidation of CH$_3$OH by photogenerated holes from the valence band of InGaN is that in an oxygen (O$_2$) free environment the intermediate compound eventually injects e$^-$ into the conduction band of the semiconductor, leading to the formation of formaldehyde (HCHO) as a stable product which could further be oxidized to methanoic acid (HCOOH) and subsequently to CO$_2$ along with H$_2$ generation. Rh nanoparticles on the nanowire surfaces behave as an electron sink and reduce protons to H$_2$. First image 2600A in FIG. 26 depicts the average H$_2$ evolution rate derived from approximately 6 hours of photocatalytic reaction for In$_{0.23}$Ga$_{0.77}$N nanowires with an optimum Mg doping level ($T_{Mg}$=200° C.) under illumination by a 300 W xenon lamp with AM1.5G filter and with various long-pass filters. The measurements were performed on samples of areal sizes ~3 cm$^2$. Steady evolution of H$_2$ was clearly observed using aqueous $CH_3OH$ solution and under different illumination conditions. The decreased $H_2$ evolution rate with increasing wavelength can be correlated to the reduced incident light intensity and reduced photon absorption. The direct measurement of $H_2$ evolution under visible light illumination provides unambiguous evidence that $In_{0.23}Ga_{0.77}N$ nanowire photocatalysts, with an energy bandgap of ~2.53 eV, possess the capacity for proton reduction.

Within the work reported here by the inventors, it is also observed that the photocatalytic activity for $H_2$ generation depends critically on the Mg dopant incorporation. We performed extensive studies on the photocatalytic activities of InGaN nanowire photocatalysts with various levels of Mg dopant incorporation by changing the effusion cell temperature of Mg ($T_{Mg}$) from 190° C. to 300° C. with corresponding BEP of ~$1.0 \times 10^{-11}$ to ~$7.3 \times 10^{-9}$ Torr r. Shown in second graph 2600B in FIG. 26 are the relative apparent quantum efficiencies (AQE) measured for Rh co-catalyst depositions from its precursor ($Na_3RhCl_6 \cdot 2H_2O$ and aqueous $CH_3OH$ solution). The AQE was estimated as a ratio of the total number of reacted electrons (two electrons per molecule of $H_2$) to incident photons. The relative AQE shown in second graph 2600B in FIG. 26 is plotted by normalizing the AQE with its peak value. It is seen that the maximum photocatalytic activity occurs for a Mg effusion cell temperature of ~200° C. The significant variations in photocatalytic performances with Mg dopant incorporation (variations in Mg cell temperatures) are attributed to the tuning of the near surface band-bending by altering the surface Fermi-level ($E_{FS}$) position relative to the surface valence band edge ($E_{VS}$). At a low Mg cell temperature, the nanowire surface is barely doped (almost intrinsic) compared to the bulk (p-type), due to the surface desorption of Mg atoms, which creates a large downward band-bending towards the surface, shown in first image 2600C in FIG. 26. This band-bending is further subject to change when the nanowires are in equilibrium with solution and under photo-excitation. The downward band bending may accelerate proton reduction at the nanowire surface, but it elevates the barrier for hole-diffusion and impedes the hole transport towards the nanowire-liquid interface (schematically shown in third image 2600C in FIG. 26). With increasing Mg incorporation (larger $T_{Mg}$), the surface of GaN nanowires can be transformed to be p-type, due to the dopant segregation effect. This leads to a significant reduction of the downward band bending in the near-surface region. As a consequence, the transport of both photogenerated electrons and holes to the surfaces can be maximized by optimizing Mg doping level ($T_{Mg}$~200° C. in this experiment). Water oxidation, the limiting step for overall water splitting, is enhanced due to accelerated hole transport (as shown in fourth image 2600D in FIG. 26). This results in more balanced redox reaction for water splitting, which, in turn, enhances the photocatalytic efficiency and stability of the nanowires. It is also observed that the photocatalytic performance of the nanowires decreases at high doping level due to the degradation of nanowire crystalline quality and the resulting enhanced non-radiative recombination. Besides, at high Mg concentration, nitrogen vacancy related defects increase. These defects function as n-type dopants and compensate Mg doping (p-type). Detailed studies of the near-surface band structure properties and their correlation with p-type dopant incorporation can be found elsewhere. The relative AQE of overall water splitting (red solid line) from $Rh/C_2O_3$ co-catalyst decorated Mg-doped $In_{0.26}Ga_{0.74}N$ nanowires is also shown in second graph 2600B in FIG. 26. The $Cr_2O_3$-shell on the Rh co-catalyst was photo-deposited in order to hinder the back reaction that forms water in the presence of $O_2$. It is seen that variations of the quantum efficiency with respect to the Mg dopant incorporation are in exact agreement with those measured from the half reaction, further confirming the important role of surface band bending on the charge carrier extraction and surface redox reactions.

Figure 27:
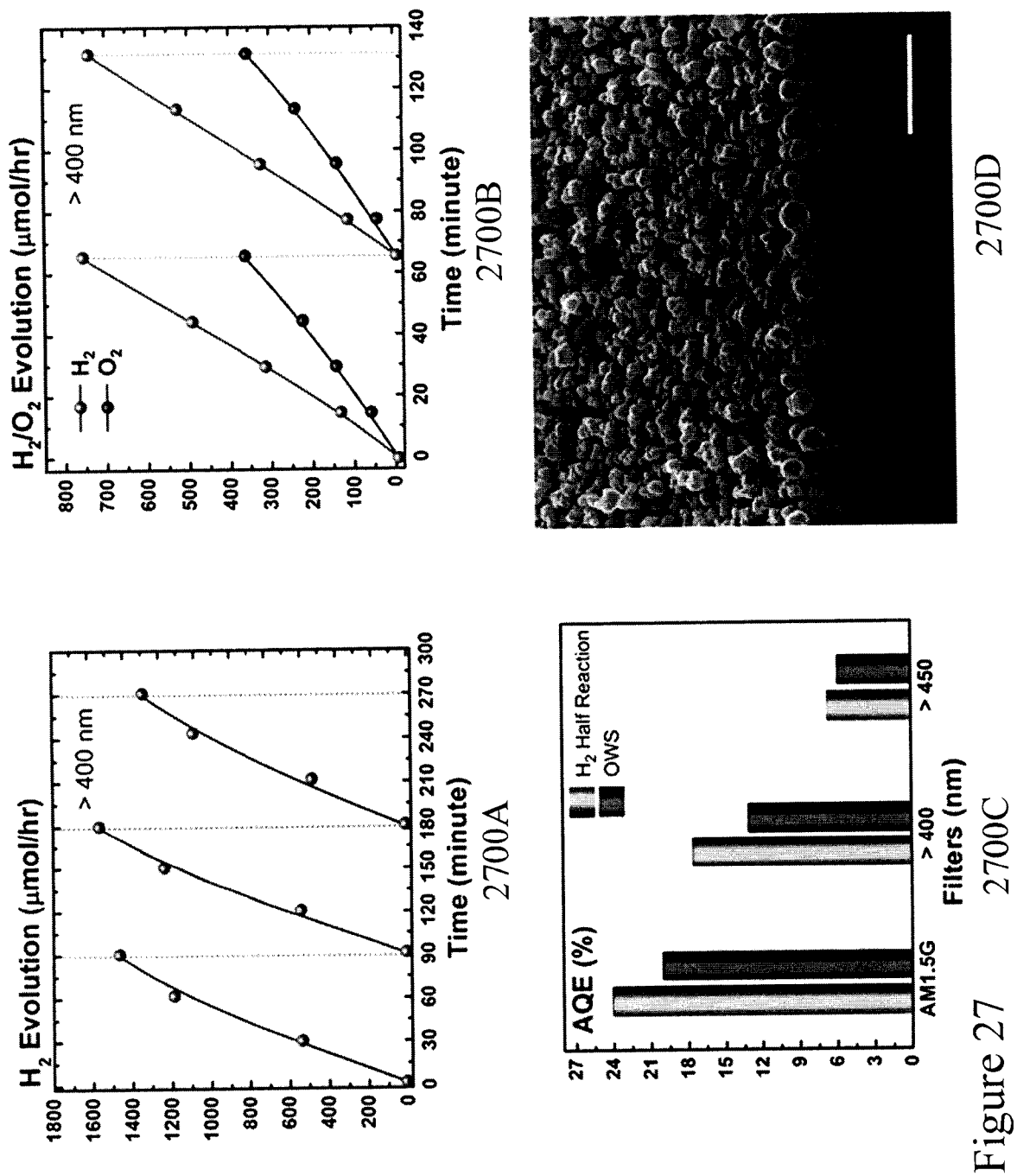
FIG. 27 depicts repeated photocatalytic cycling and overall neutral water splitting for Mg-doped InGaN/GaN nanowire structures according to embodiments of the invention under visible illumination (λ>400 nm) together with estimated AQE of overall water splitting and $H_2$ evolution together with an SEM of a fabricated array of nanowires with Rh co-catalysts after 6 hours operation.

We have further performed repeated experiments on the same sample, in both the half reaction and overall water splitting reaction to study the stability of Mg-doped InGaN/GaN nanowires in photocatalytic reactions. Shown in first graph 2700A in FIG. 27 are the repeated cycles of $H_2$ evolution measurement in the half reaction under visible excitation ($\lambda > 400$ nm). The $H_2$ evolution rate was measured ~1177 $\mu$molh$^{-1}$ with an estimated AQE of ~17.1% under visible light irradiation (400 nm$\leq \lambda \leq$490 nm) for incident intensity of ~330 mWcm$^{-2}$, shown in third graph 2700C in FIG. 27. Under full arc illumination with an AM1.5G filter, the photocatalytic activity of Mg-doped InGaN/GaN nanowire catalysts in aqueous $CH_3OH$ solution provided a $H_2$ evolution rate ~2292 $\mu$molh$^{-1}$, and the AQE was estimated to be ~24% for an incident intensity of ~544.5 mWcm$^{-2}$ in the wavelength range of 200 nm$\leq \lambda \leq$490 nm.

Subsequently, we have studied the overall water splitting reaction of Mg-doped InGaN/GaN nanowire photocatalysts. Compared to the half reaction studies, a thicker p-GaN layer was incorporated on top. Second graph 2700B in FIG. 27 depicts stoichiometric $H_2$ and $O_2$ evolution from repeated cycles of overall water splitting under visible light illumination; and the evolution rate was measured as ~684 $\mu$molh$^{-1}$ $H_2$ and ~332 $\mu$molh$^{-1}$ $O_2$, resulting in an AQE~12.3%. Variations of the AQE for different long-pass filters are also shown in third graph 2700C in FIG. 27. The decrease of efficiency with increasing wavelength is directly related to the reduced light absorption and also carrier trapping effect. The SEM image of the nanowires after ~6 hours of photocatalytic reaction is shown in fourth image 2700D in FIG. 27. No degradation or obvious etching was observed, further confirming the stability of defect-free III-nitride nanowire photocatalysts in harsh photocatalysis conditions. Compared to other III-V semiconductors, the strong ionic bonding of III-nitrides, due to the large difference in electro-negativity between group III elements and N, suppresses the formation of surface states within the fundamental energy gap. Moreover, the MBE grown III-nitride nanowires generally possess N-polarity, which are more stable that their Ga-polarity counterpart in harsh photocatalysis conditions. The balanced surface redox reactions, due to the optimized surface electronic properties with controlled Mg dopant incorporation, also contribute to the enhanced stability.

In summary, we have investigated the photocatalytic performance of InGaN nanowire structures for $H_2$ evolution from both aqueous methanol solution and overall neutral-pH water splitting under visible light excitation. It is observed that the efficiency for $H_2$ evolution, in both the half reaction and overall water splitting reaction, depends critically on Mg-dopant incorporation, which is explained by variations of the surface electronic properties and the resulting impact on the charge carrier (electron/hole) migration to the nanowire surfaces. By optimizing Mg-doping levels, we have demonstrated an apparent quantum efficiency of 17.1% and 12.3% for the half reaction and overall water splitting in the spectral range of 400 nm$\leq \lambda \leq$490 nm, respectively. Further improvement in the energy conversion efficiency can be achieved by extending the absorption spectrum of InGaN nanowire structures with enhanced In incorporation.

5. Band Engineering

Catalyst-free GaN nanowires were grown on Si (111) substrates using a Veeco Gen II radio frequency plasma-assisted MBE system under nitrogen rich conditions. Before the growth initiation, a thin Ga seeding layer was first deposited in situ, which can promote the formation of GaN nanowires vertically aligned on the Si substrate. The substrate temperature was kept 780° C., and the nanowire axial growth rate was 3 nm min$^{-1}$. The Mg doping level within the nanowires was controlled by varying the Mg cell temperature ($T_{Mg}$) from 200° C. to 280° C. Samples A, B, C, D and E correspond to $T_{Mg}$ of 200° C., 230° C., 250° C., 265° C. and 280° C. respectively. The Mg dopant concentration for samples A, B, C, and D were estimated to be ~2.8×10$^{18}$ cm$^{-3}$, ~2.4×10$^{19}$ cm$^{-3}$, ~1.0×10$^{20}$ cm$^{-3}$, and ~2.9×10$^{20}$ cm$^{-3}$ respectively, which was derived based on SIMS performed on Mg-doped GaN epilayers grown under similar conditions and variations of the Mg beam flux at different temperatures.

Figure 28:
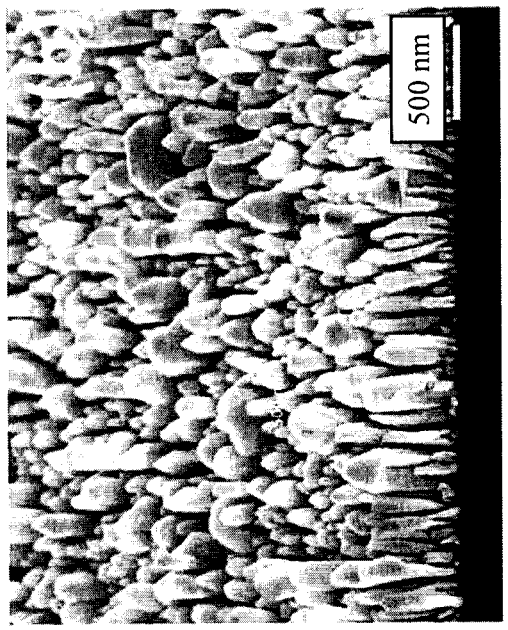
FIG. 28 depicts SEM images of GaN nanowires according to embodiments of the invention grown at $T_{Mg}$=200° C., $T_{Mg}$=265° C., and GaN epilayer with $T_{Mg}$=230° C. and high resolution TEM of a $T_{Mg}$=265° C. sample.
Figure 28:
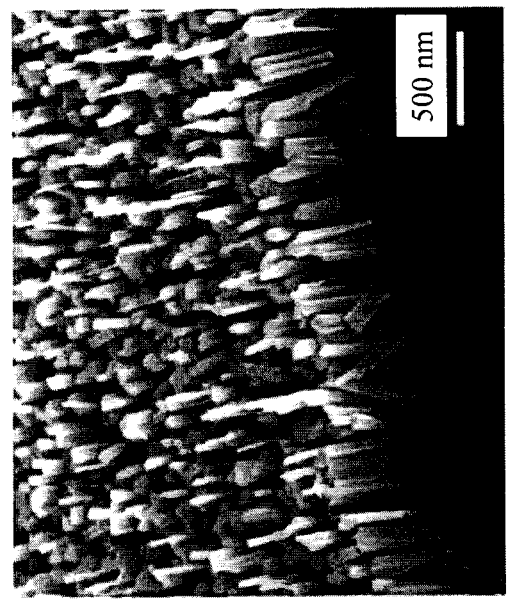
Figure 28:
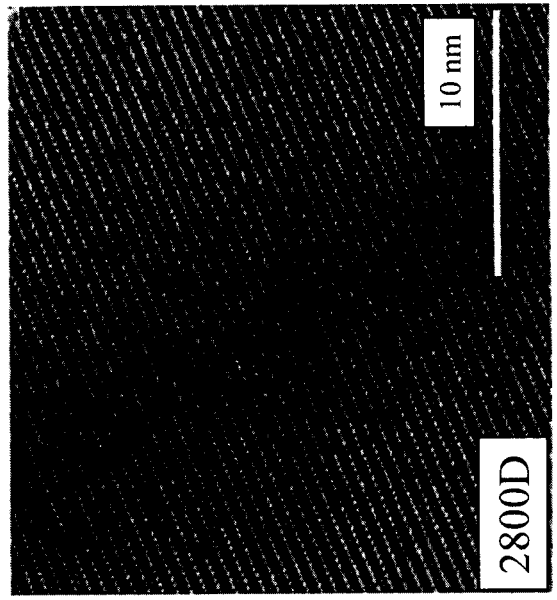
Figure 28:
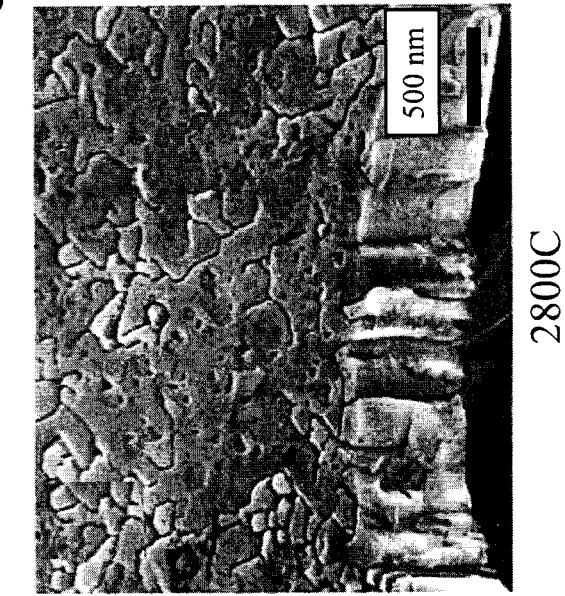

The Mg dopant concentration in nanowire structures may vary from the estimated values, due to surface segregation and/or desorption of dopant atoms. Structural properties of nanowires were examined using a high-resolution scanning electron microscope (SEM) with an acceleration voltage of 5 kV. The representative SEM images of GaN nanowires with $T_{Mg}$=200° C. (sample A) and $T_{Mg}$=265° C. (sample D) are shown in first and second images 2800A and 2800B respectively in FIG. 28. It can be seen that the GaN nanowires are vertically aligned on the substrate. With the increase of Mg doping level, diameters of nanowires become larger and some nanowires are coalesced due to enhanced radial growth with the incorporation of Mg atoms. A Mg-doped GaN epilayer structure (sample F) with the $T_{Mg}$=230° C. was also grown and studied. The SEM image of sample F is shown in third image 2800C in FIG. 28. A typical high resolution transmission electron microscopy (TEM) image of Mg-doped GaN nanowires (sample B) is presented in fourth image 2800D in FIG. 28.

Figure 29:
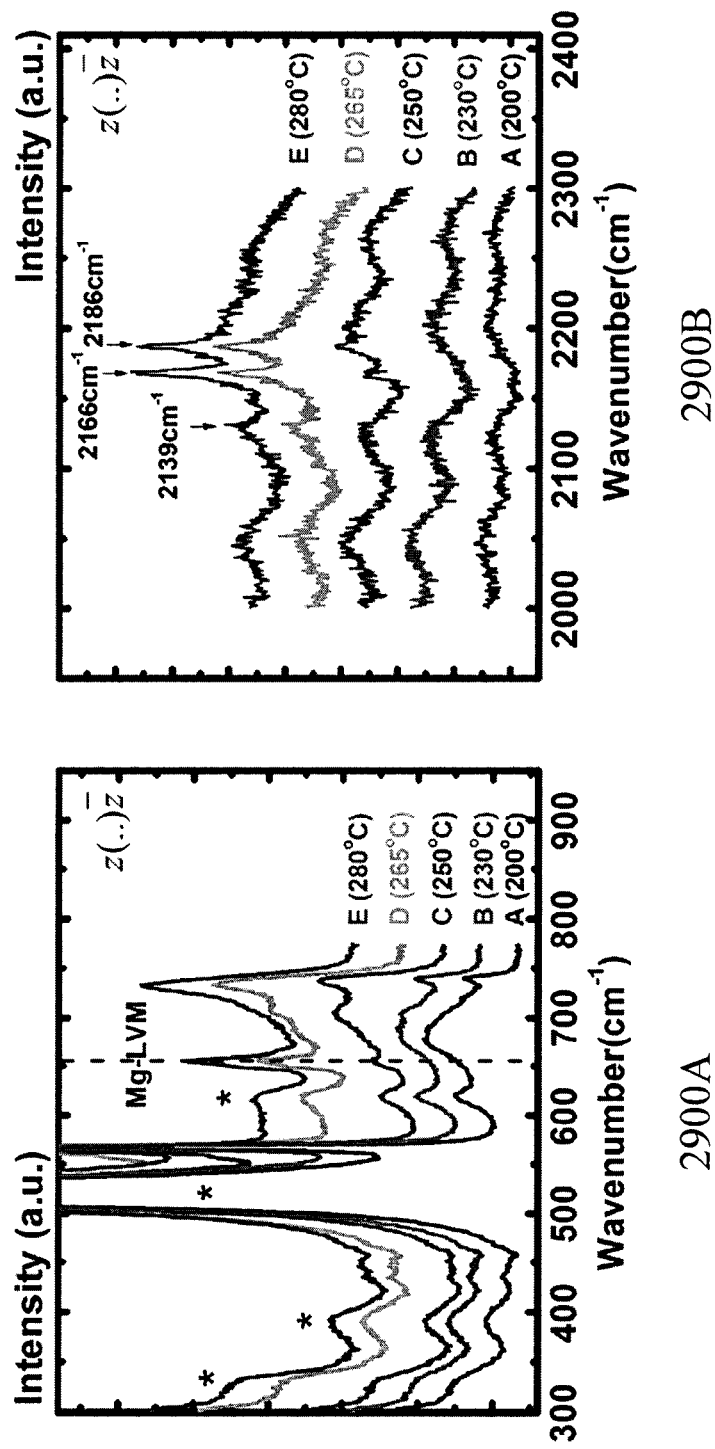
FIG. 29 depicts typical micro-Raman spectra for GaN nanowires according to embodiments of the invention grown at 200° C.≤$T_{Mg}$≤280° C. for 300-700 $cm^{-1}$ and 2000-2300 $cm^{-1}$.

No extended defects or dislocations can be observed in such single crystalline nanowires. The distance between the two adjacent atomic layers is estimated to be about 0.52 nm confirming that the nanowires are of wurtzite crystal structure, with the c axis (0001) aligned along the growth direction. Micro-Raman measurements were carried out at room temperature with an external 488 nm argon ion laser through a ×100 objective with a numerical aperture 0.9. The focused laser spot size was ~1 μm and the estimated power on the sample was ~40 mW. The Raman signal was detected by a CCD detector mounted on a confocal Raman spectrometer wherein the Raman spectra were taken in the backscattering geometry with the incident laser parallel to the hexagonal c-axis ([0001] direction) of the nanowires. The laser light was scattered without polarization analysis (z( . . . )z direction) and dispersed with a 1200 g·mm$^{-1}$ grating. The resolution of a given peak position under these conditions is on the order of 0.02 nm. Typical room-temperature Raman microprobe spectra of GaN nanowires with different Mg doping levels (samples A-E) are depicted in first image 2900A in FIG. 29 over the wavenumber range 300 cm$^{-1}$ (~33 μm) to 770 cm$^{-1}$ (~13 μm) and second image 2900B in FIG. 29 over the wavenumber range 2000 cm$^{-1}$ (~5 μm) to 2300 cm$^{-1}$ (~4.3 μm). For all samples the strong Si signal at 520 cm$^{-1}$ and the GaN $E_2$ mode are dominant (spectra presented in FIG. 29 are scaled out to show the weaker modes more clearly). In first and second images 2900A and 2900B in FIG. 29, distinct spectral evolution can be observed for nanowires with different Mg doping levels.

Firstly, with an increase in Mg doping level, a new mode at 655 cm$^{-1}$ begins to appear in sample C ($T_{Mg}$=250° C.) as shown in first image 2900A in FIG. 29. Its intensity becomes stronger with increasing Mg doping in samples D ($T_{Mg}$=265° C.) and E ($T_{Mg}$=280° C.). The appearance of this Raman mode is related to the LVM associated with Mg impurity, which replaces the heavier host-lattice (Ga) atom and induces a localized atomic oscillation. The frequency of this LVM can be estimated by using the valence force model of Keating and Kane and scaling-factor approximation. With an appropriate cluster scaling factor (~0.15), the frequency for one of the Mg—N vibrations is estimated to be ~660 cm$^{-1}$, which is very close to the presented LVM in second image 2900B in FIG. 29. The inventors believe this to be first reported observation of such Mg-induced LVM in GaN nanowire structures and it is in quantitative agreement with previous reports on Mg-doped GaN epilayers. Moreover, in the Raman spectra around ~2200 cm$^{-1}$ in second image 2900B in FIG. 29, three distinct modes at ~2139 cm$^{-1}$, ~2166 cm$^{-1}$, and ~2186 cm$^{-1}$ are detected for nanowire samples with $T_{Mg}$≥250° C. These spectroscopic features can be attributed to the LVM associated with Mg—H complexes or H-decorated nitrogen vacancies.

The presence of these Mg-induced foreign modes at 655 cm$^{-1}$ and ~2200 cm$^{-1}$ is directly linked to the acceptor level concentration and could be employed to evaluate the incorporation of Mg dopant atoms/hole concentration, as shown in previous studies on Mg-doped GaN epilayers. Therefore, the absence of LVMs in samples A and B can be attributed to the low Mg doping level in nanowires, due to relatively low Mg cell temperatures and the predominant surface desorption of Mg atoms during the epitaxial growth process, which will be discussed in detail later. Such a dopant surface desorption process could be gradually compensated with further increased $T_{Mg}$, $T_{Mg}$≥250° C., and thus acceptor incorporation can be significantly enhanced. This is confirmed by the presence of LVM in samples C, D and E.

Now the inventors consider the evolution of the Raman mode at 730-740 cm$^{-1}$ with increasing Mg doping level. In first graph 3000A in FIG. 3000, for nanowires with the lowest Mg doping level (sample A with $T_{Mg}$=200° C.), a broad band centered at about 680-700 cm$^{-1}$ and a mode at 740.2 cm$^{-1}$ are evident. The broad peak corresponds to the surface optical (SO) phonon mode, which is related to oscillations of atoms on the free surfaces of polar semiconductors and is sensitive to the morphology, size, and density of nanowires. More importantly, the mode around 740.2 cm$^{-1}$ is attributed to the coupling between the longitudinal optical phonon and the electron plasmon (LOPC mode), when the plasma frequency is in the range of the phonon frequency. Previously, a similar LOPC mode was also identified in undoped GaN nanowires where it was associated with the coupling between the LO phonon and the background electron plasmon. Generally speaking, the LOPC mode shifts further to a higher frequency with increasing electron concentration and its intensity becomes weaker.

In n-type GaN epilayers, the shift of LOPC mode can reach up to a few tens of cm$^{-1}$ wavenumber when the electron density increases from 10$^{17}$ cm$^{-3}$ to 10$^{19}$ cm$^{-3}$. In the case of Mg doped III-nitride nanowires grown by MBE, the desorption of Mg atoms mainly occurs near the surface region of nanowires, although the formation energy of Mg-doping at the surface of nanowires is significantly lower than that in the bulk region. This could lead to the formation of surface defects/states and thus make the nanowire surface weakly n-type. It should be noted that GaN nanowires are almost transparent to the 488 nm excitation laser. In this case, due to the inhomogeneous distribution of charge carriers in the lateral direction of nanowires, i.e. the presence of surface electron, the measured Raman spectra were expected to show both the LOPC mode associated with the bulk and surface region. In order to simplify the analysis and highlight the key physical evolution of the LO phonon-plasmon coupling process, the inventors within this portion of the specification mainly focus on the overall plasmon coupling effect. In sample A, plasmons induced by accumulated surface electrons and bulk background electron can readily interact with LO phonons, forming the presented obvious LOPC mode.

With the increase of $T_{Mg}$, the surface dopant desorption process can be effectively compensated by enhanced acceptor incorporation in the near surface region due to the lower formation energy. Accordingly, the accumulated surface electrons could be significantly reduced and thus eventually result in the appearance of a p-type nanowire surface. Background electrons in the bulk region of nanowires will also be effectively compensated. Such a Mg doping mechanism in GaN nanowires is supported by the evolution of the LOPC mode with different Mg doping levels presented in first graph 3000A in FIG. 30. It can be observed that with increasing Mg doping in samples B ($T_{Mg}$=230° C.), C ($T_{Mg}$=250° C.), and D ($T_{Mg}$=265° C.), the frequency of the LOPC mode gradually shifts to lower wavenumbers, i.e. 739.0 cm$^{-1}$, 737.2 cm$^{-1}$, and 732.9 cm$^{-1}$, respectively. Such a significant redshift of frequency is mainly due to the reduced coupling between the LO phonon and the weakened surface electron plasmon. Accordingly, the intensity of the LOPC mode also becomes stronger. However, any further shift of the LOPC mode is almost negligible in sample E compared with that of sample D. This indicates that the coupling between the LO phonon and the surface (also bulk background) electron plasmon is completely suppressed in these two more heavily Mg doped nanowire samples. Importantly, it indicates that the surfaces of samples D and E are completely transformed from weakly n-type to p-type with the increase of Mg doping, which is also well correlated with the strong Mg-LVM peak at 655 cm$^{-1}$ and 2200 cm$^{-1}$ in these two samples, as shown in first and second graphs 2900A and 2900B in FIG. 29.

It is also worth noting that in FIG. 29 increasing the Mg doping causes a significant change of the SO phonon mode. This is believed to be due to the modification of density, morphology and filling factor of nanowires with different Mg doping levels (see FIG. 28). The incorporation of Mg is known to enhance the lateral growth of GaN nanowires, leading to larger diameters and increased coalescence. However, within the prior art, the frequency of $A_1$(LO)/QLO mode has no obvious shift indicating that such modifications in GaN nanowire structures have a negligible effect on the LO mode. In turn, it further confirms that the observed significant change of the LO mode in Mg doped GaN nanowires is directly associated with the plasmon coupling effect. However, it also needs to mention that the reduced surface-to-volume ratio will decrease the number of surface electrons and this may facilitate the suppression of the LOPC mode intensity and yield the uncoupled $A_1$(LO) mode to some extent.

Figure 30:
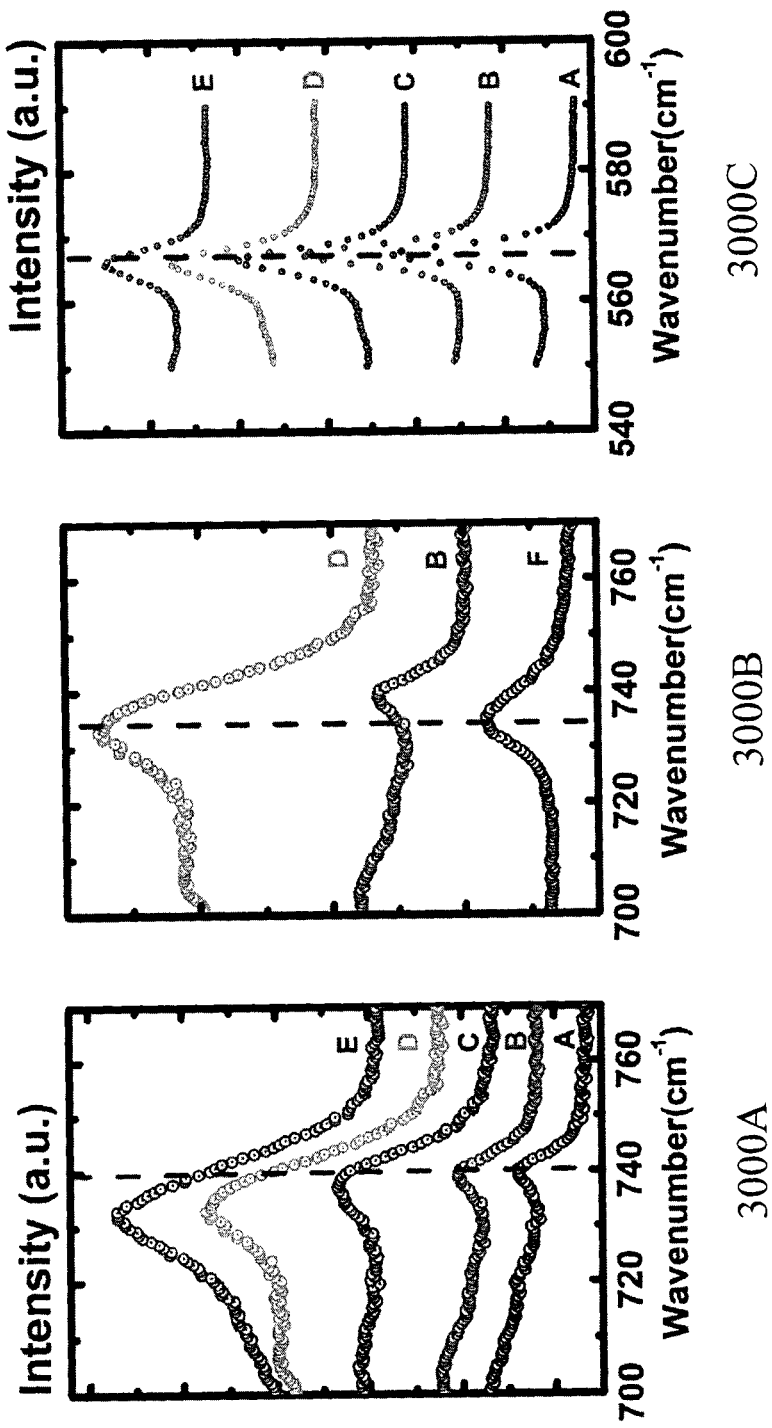
FIG. 30 depicts typical micro-Raman spectra for GaN nanowires according to embodiments of the invention for 200° C.≤$T_{Mg}$≤280° C. in LOPC mode, with and without GaN epilayer, and adapted focussing on the $E_2$ mode.

In order to add further support to the above explanation about the evolution of the LOPC mode, the Raman spectrum of a GaN epilayer (sample F) with the same Mg doping level as sample B ($T_{Mg}$=230° C.) was also recorded under the same conditions leading to the results depicted in second graph 3000B in FIG. 30. The inventors observe that only the $E_2$ mode and the uncoupled $A_1$(LO) mode were present for the Mg doped GaN epilayer. The absence of the broad SO phonon mode around 700 cm$^{-1}$ is due to the massively reduced surface-to-volume ratio compared with that of the nanowires (sample B). More importantly, the frequency of the uncoupled $A_1$(LO) mode in this epilayer sample is almost identical to the $A_1$(LO) mode in sample D ($T_{Mg}$=265° C.), thus confirming the absence of interaction between the LO phonon and the surface electron plasmon in heavily Mg-doped nanowires.

Moreover, it is likely that the shift of Raman mode can be induced by doping dependent changes in strain in nanowires. Manifestations of this show up by examining the shift in the peak position of the $E_2$ mode, which is sensitive to the biaxial strain in the c-plane. In third graph 3000C in FIG. 30, the shift of the $E_2$ mode between sample A and sample E is about 1 cm$^{-1}$ due to the increased tensile strain at higher Mg doping levels. Such strain induced shift is expected to be even smaller for the $A_1$(LO) mode, which is almost negligible compared with the measured shift of the $A_1$(LO) mode shown in first graph 3000A in FIG. 30. Therefore, it confirms that the shift of the $A_1$(LO) mode in nanowires with different Mg doping levels is mainly due to the decoupling of the LOPC mode rather than doping induced strain.

Moreover, sample A is associated with the highest $E_2$ mode frequency (567 cm$^{-1}$), close to that exhibited by free standing GaN, indicating effective strain relaxation in the lateral direction of nanowires. Accordingly, it shows a higher crystal quality confirmed by a narrower full-width-at-half maximum (FWHM) of the $E_2$ peak (5 cm$^{-1}$). The broader FWHM of the $E_2$ peak of sample E (>10 cm$^{-1}$) is probably related to structural degradation caused by increased Mg doping.

Figure 31:
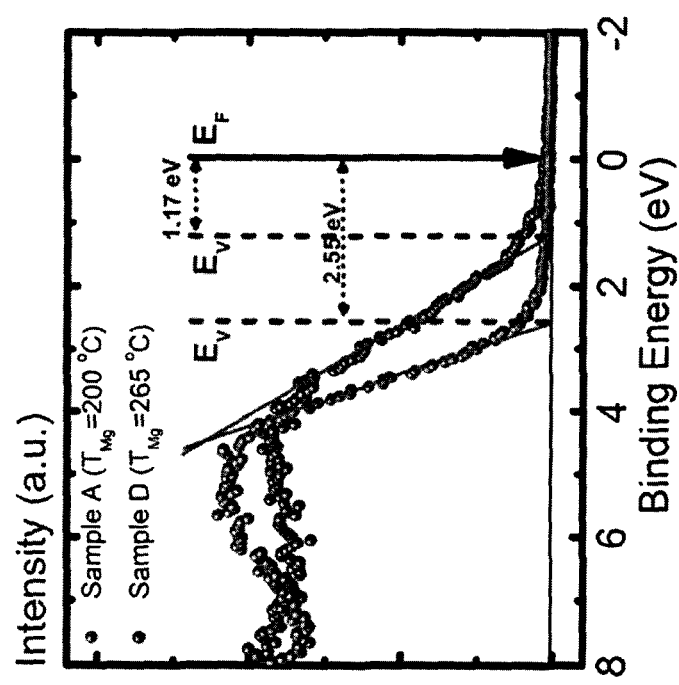
FIG. 31 depicts X-ray photoelectron spectroscopy of Mg:GaN nanowires according to embodiments of the invention with $T_{MS}$=200° C. and $T_{Mg}$=265° C. from which $E_F$-$E_V$ values can be derived.

The surface energy band structure of Mg-doped GaN nanowires was characterized by angle-resolved XPS. In order to obtain the majority signal from the sidewall of nanowires, an X-ray beam was impinged with a 60 degree angle with respect to the growth direction of nanowires (0001). During the measurement, the Au-4 f peak (84 eV) and the C-1s peak (285 eV) were used to calibrate the valence band spectra. For the undoped GaN nanowire sample, the energy separation between the near-surface Fermi-level and the valence band maximum ($E_F-E_V$) is measured to be 2.63 eV, similar to that of n-type GaN surfaces and non-doped GaN nanowires within the prior art. FIG. 31 depicts the typical XPS spectra of nanowires with two different doping levels, i.e. sample A ($T_{Mg}$=200° C.) and sample D ($T_{Mg}$=265° C.). It can be seen that, for sample A, ($E_F-E_V$)≈2.55 eV, suggesting that the surface of GaN nanowires grown with relatively low $T_{Mg}$ is weakly n-type. In contrast, for sample D, the ($E_F-E_V$)≈1.17 eV. Evidently, the surface of nanowires is transformed from weakly n-type to p-type with increasing Mg cell temperature. The reduction of $E_F-E_V$ in the near surface region can be directly correlated with the reduction in the downward surface band bending with increasing Mg-dopant incorporation.

Further, referring to Table 1, there are presented the summary data for values of $E_F-E_V$ derived from XPS, the frequency of the LOPC mode, and the presence of Mg induced-LVMs measured by Raman spectra for different $T_{Mg}$. It can be observed that the values of $E_F-E_V$ are approximately the same at relatively low $T_{Mg}$ (samples A and B), wherein the surface Mg desorption process dominates. It results in a weakly n-type surface of nanowires, which is well correlated with the commonly measured downward surface band bending for p-type GaN. This unique phenomenon also leads to the coupling between the LO phonon and the surface electron plasmon presented in the Raman spectra. Such accumulated surface electrons are gradually compensated by enhanced Mg incorporation with higher $T_{Mg}$. It leads to the decoupling of the LOPC mode and eventually the presence of a p-type nanowire surface, as shown in Table 1.

TABLE 1

$E_F$-$E_V$ LOPC mode frequency and the presence of LVMs versus $T_{Mg}$

| | $T_{Mg}$ | | | | |
|---|---|---|---|---|---|
| | 200° C. | 230° C. | 250° C. | 265° C. | 280° C. |
| $E_F$-$E_V$ (eV) | 2.55 | 2.45 | 1.90 | 1.17 | 0.67 |
| $\omega_{LOPC}$ (cm$^{-1}$) | 740.2 | 739.0 | 737.2 | 732.9 | 732.9 |
| LVMs | Absent | Absent | Weak | Strong | Strong |

As evident from the considerations in respect of p-doped InGaN, n-doped/p-doped GaN the inventors have established that through the provisioning of the appropriate doping profile the band bending present within the nanowire structures that acts as an increased energy barrier leading to accumulation/depletion of holes or electrons thereby suppressing the redox reaction within photochemical water splitting. Accordingly, whilst the embodiments of the invention have been described with respect to Mg (p-type) doping of InGaN and GaN the inventors expect that similar enhancements, up to a couple of orders of magnitude in water splitting performance, may be attained through the use of other compatible dopants for InGaN and GaN, for example, as well as with other suitable dopants and/or compound semiconductor materials. Further, the benefits of embodiments of the invention for photochemical water splitting, the inventors project, can in other instances be applied to photoelectrochemical water splitting materials.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A device for photochemical water splitting comprising:
a plurality of nanowires formed from a doped compound semiconductor that generate electron-hole pairs under illumination with optical energy within a predetermined wavelength range, wherein non-polar surfaces of the plurality of nanowires are doped with a predetermined dopant setting a Fermi level of the non-polar surfaces to a predetermined value thereby yielding a predetermined surface band bending.

2. The device according to claim 1, wherein
the predetermined surface band bending removes an energy barrier at the non-polar surfaces of the plurality of nanowires allowing oxidation and reduction reactions to occur concurrently on the plurality of nanowires.

3. The device according to claim 1, wherein
the compound semiconductor is an indium gallium nitride alloy, the predetermined dopant is magnesium, and the predetermined surface band bending is flat or slightly downward.

4. The device according to claim 1, wherein
the compound semiconductor is an indium gallium nitride alloy, the predetermined dopant is magnesium, and the predetermined surface band bending is established through controlling a temperature of an effusion cell for the magnesium within a predetermined range.

5. The device according to claim 1, wherein
the compound semiconductor nanowires are patterned with co-catalyst nanoparticles.

6. The device according to claim 5, wherein the co-catalyst nanoparticles are core-shell nanostructures.

* * * * *